(12) United States Patent
Hashimoto et al.

(10) Patent No.: US 12,232,248 B2
(45) Date of Patent: Feb. 18, 2025

(54) SAMPLE HOLDER AND SUPERCONDUCTING QUANTUM COMPUTER

(71) Applicant: NEC Corporation, Tokyo (JP)

(72) Inventors: Yoshihito Hashimoto, Tokyo (JP);
Tsuyoshi Yamamoto, Tokyo (JP);
Kohei Matsuura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 459 days.

(21) Appl. No.: 17/746,212

(22) Filed: May 17, 2022

(65) Prior Publication Data

US 2022/0377880 A1   Nov. 24, 2022

(30) Foreign Application Priority Data

May 21, 2021   (JP) .................. 2021-085816

(51) Int. Cl.
*H05K 1/02* (2006.01)
*H05K 1/11* (2006.01)
*H05K 1/18* (2006.01)

(52) U.S. Cl.
CPC ........... *H05K 1/0237* (2013.01); *H05K 1/115* (2013.01); *H05K 1/183* (2013.01)

(58) Field of Classification Search
CPC .... H05K 1/0237; H05K 1/021; H05K 1/0243; H05K 1/115; H05K 1/182–186; H05K 1/0204; H05K 1/0206; H05K 3/0061; H05K 2201/0367; H05K 2203/0415; H01L 23/66; H01L 2223/6677; H01L 2224/05554; H01L 2224/13013; G06N 10/40

See application file for complete search history.

(56) References Cited

U.S. PATENT DOCUMENTS 6,020,637 A * 2/2000 Karnezos ................ H01L 23/36
257/E23.101

FOREIGN PATENT DOCUMENTS

JP   2002-299503 A   10/2002

OTHER PUBLICATIONS

B.Lienhard, et al., "Microwave Packaging for Superconducting Qubits," arXiv: 1906.05425v1 [quant-ph] Jun. 12, 2019.

* cited by examiner

*Primary Examiner* — Roshn K Varghese
(74) *Attorney, Agent, or Firm* — Sughrue Mion, PLLC

(57) ABSTRACT

A sample holder includes a base comprising a support structure and a printed circuit board (PCB) in contact with the base. The PCB has a through hole. The PCB has a cavity in at least a part of the base below the through hole. The support structure that supports a surface of a chip and is electrically connected to the base. The support structure is disposed in the cavity. At least a part of the section supporting the chip in the support structure is not parallel to the back surface of the chip.

18 Claims, 71 Drawing Sheets

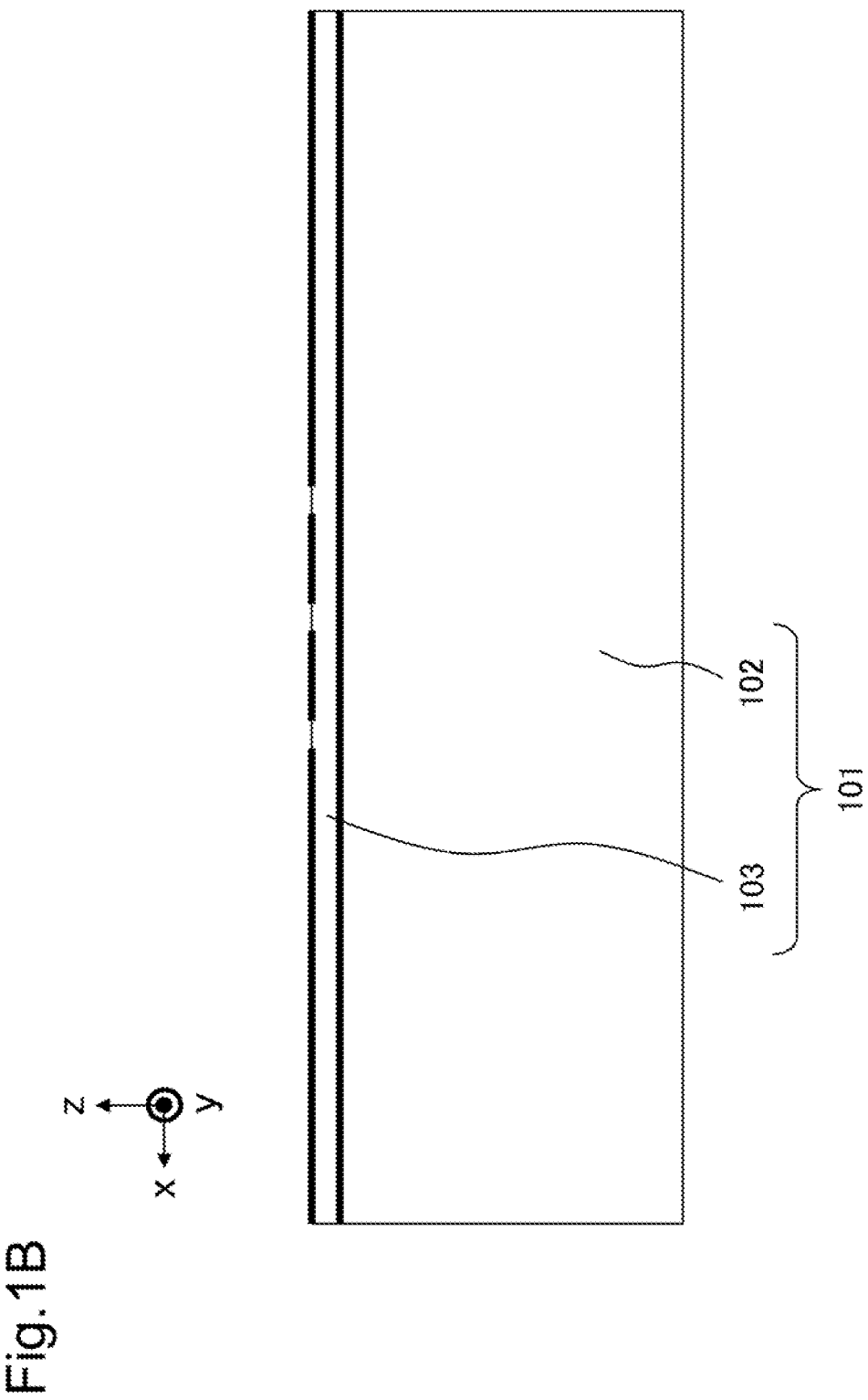

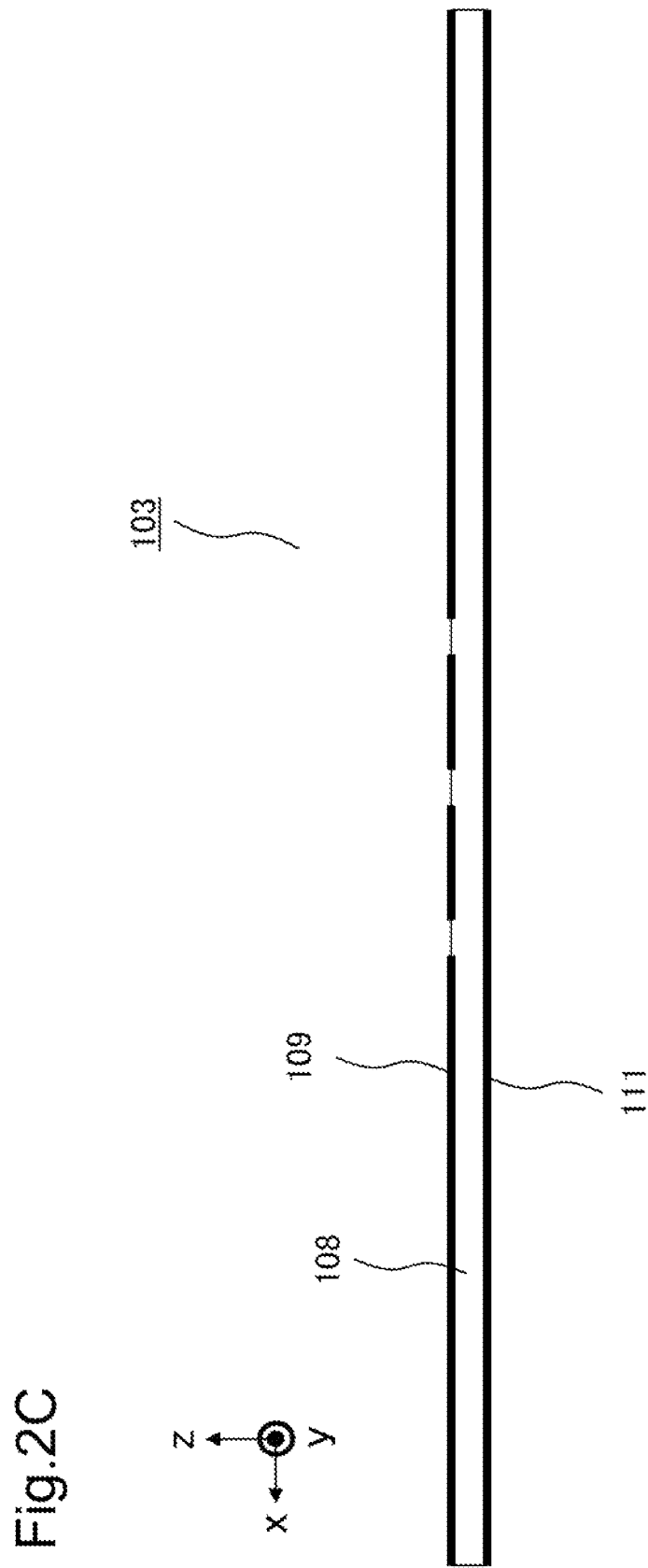

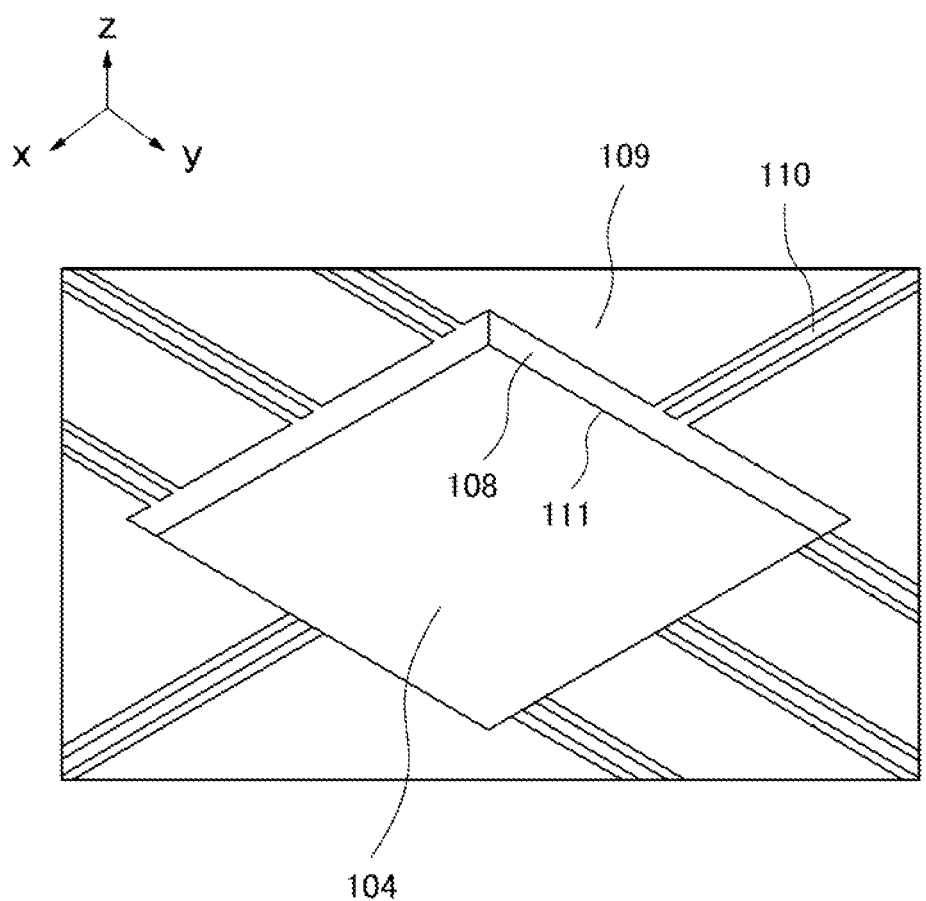

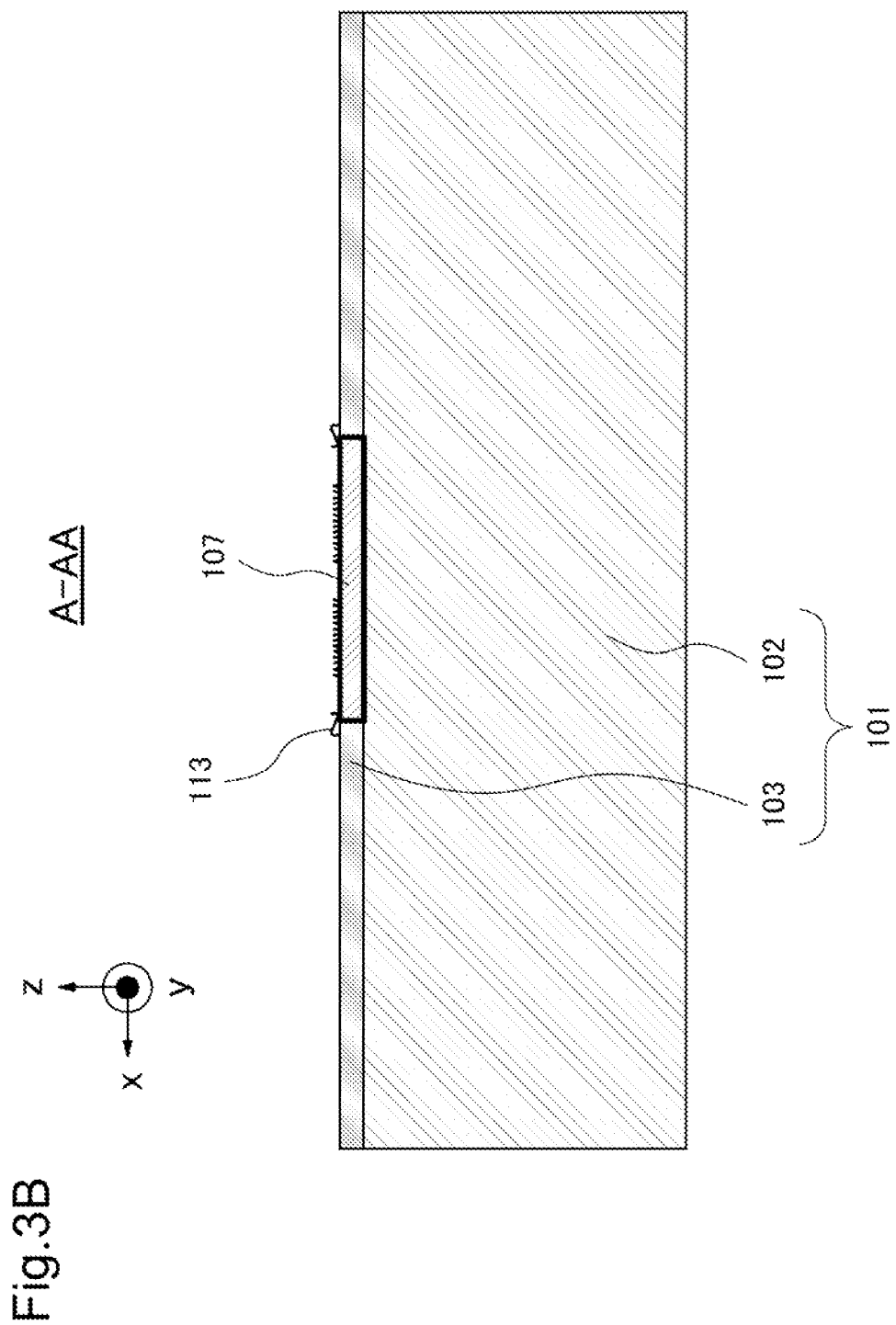

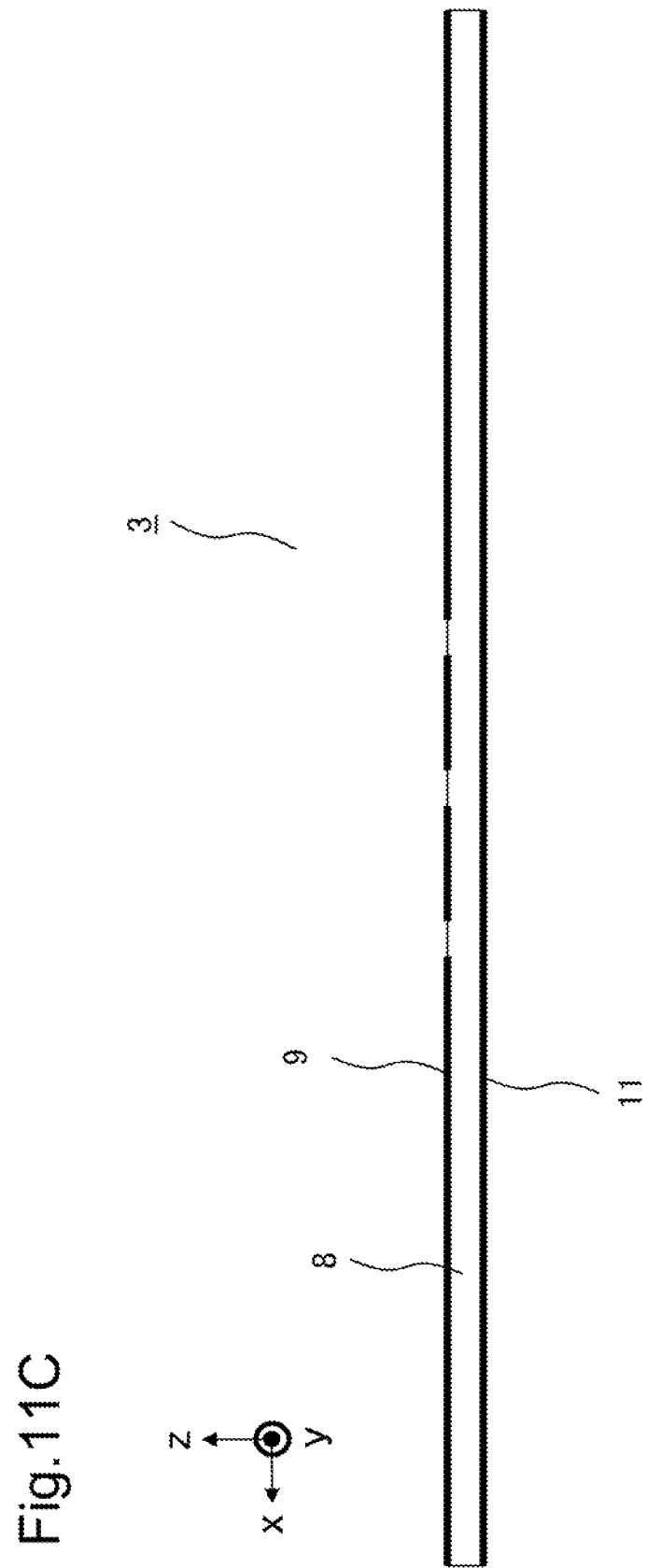

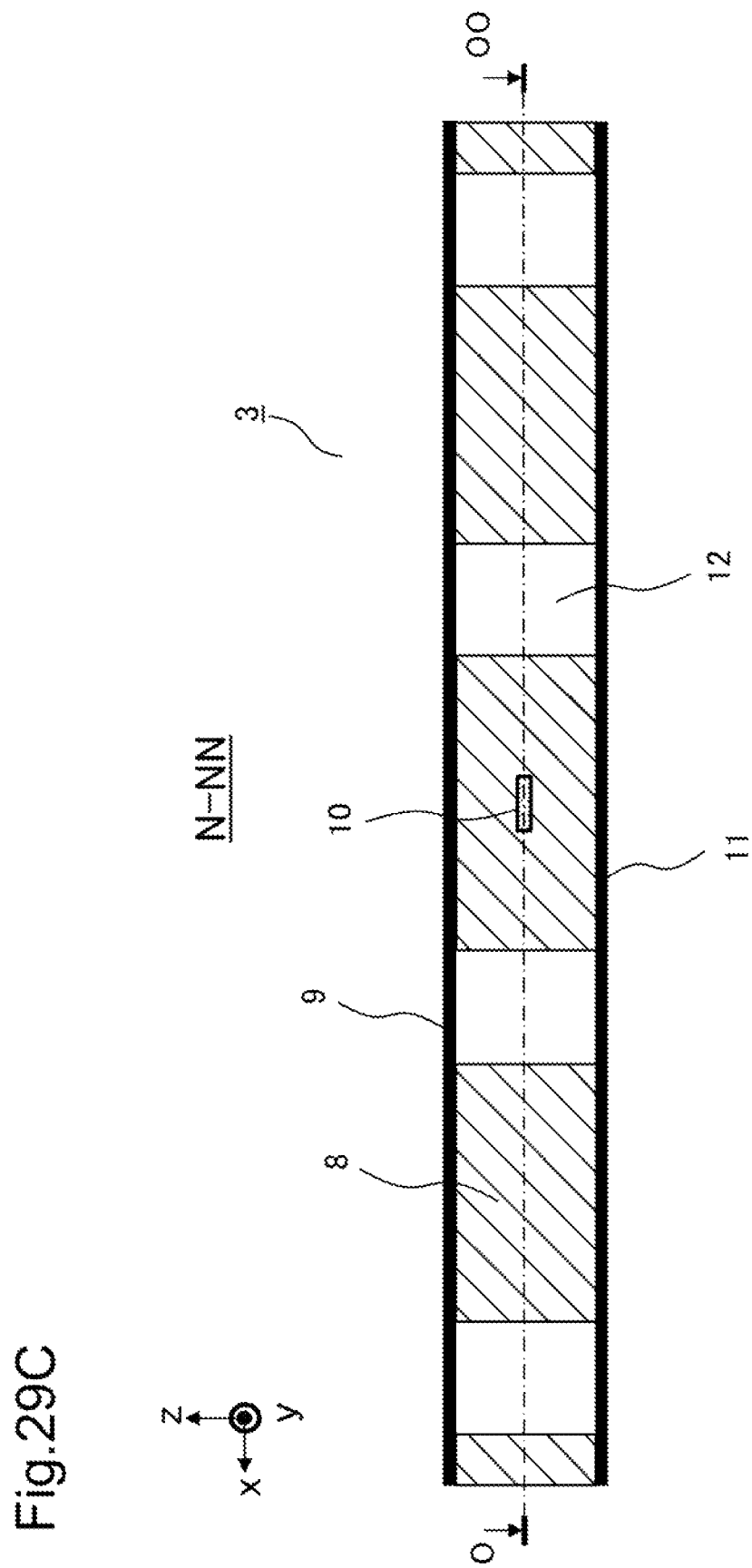

SAMPLE HOLDER AND SUPERCONDUCTING QUANTUM COMPUTER

This application is based upon and claims the benefit of priority from Japanese Patent Application No. 2021-085816, filed on May 21, 2021, the disclosure of which is incorporated herein in its entirety by reference.

TECHNICAL FIELD

The present disclosure relates to a sample holder and the like.

BACKGROUND ART

The superconducting quantum circuit is formed on a substrate such as a silicon substrate using a superconducting material such as niobium (Nb) or aluminum (Al). Here, a thing in which a superconducting quantum circuit is formed on a substrate is referred to as a chip. The superconducting quantum circuit is mounted on a sample holder and operated. There are various structures of the sample holder. Chip mounting methods include a method of mounting a chip on a printed circuit board with the surface of the circuit of the chip flipped as described in B. Lienhard, et al., "Microwave Packaging for Superconducting Qubits," arXiv: 1906.05425v1 [quant-ph] 12 Jun. 2019, and a method of mounting a chip on a printed circuit board with the surface of the circuit of the chip flipped (flip chip mounting) as described in JP 2002-299503 A.

In the following description, description will be given on the premise of the former mounting method.

For example, there is a structure in which a printed circuit board (PCB) is placed on a metal base. A through hole is provided near the center of the PCB, a chip is disposed in the through hole, and bonding wires such as Al electrically connects between a pad of the chip and a pad of the PCB and between a ground of the chip and a ground of the PCB. In such a case, the back surface of the chip is in contact with the metal base.

In a case where a chip is mounted on the sample holder as described above, resonance occurs when a signal of a specific frequency is input to the chip. Here, this resonance is referred to as chip mode resonance. When the resonance of the chip mode is combined with the superconducting quantum circuit on the chip, decoherence of the superconducting quantum circuit is caused. In order to reduce the influence of the decoherence, the resonance frequency of the chip mode is increased as much as possible. For example, B. Lienhard, et al., "Microwave Packaging for Superconducting Qubits," arXiv: 1906.05425v1 [quant-ph] 12 Jun. 2019 describes that in order to suppress the influence of the chip mode, a cavity is formed immediately below the chip by hollowing out a part of the metal base immediately below the chip in the above-described structure.

SUMMARY

An example of the object of the present disclosure is to provide a sample holder or the like that increases a resonance frequency of resonance that occurs when a signal of a specific frequency is input to a chip in a case where the chip is mounted on the sample holder.

A sample holder according to one aspect of the present disclosure includes a base including a support structure, and a PCB in contact with the base. In the sample holder, the PCB includes a through hole. At least a part of the base below the through hole has a cavity. The support structure supports a surface of a chip and is electrically connected to the base. The support structure is disposed in the cavity. At least a part of a section of the support structure that supports the chip is not parallel to the surface of the chip.

A superconducting quantum computer according to one aspect of the present disclosure includes: a sample holder, and a chip on which a superconducting quantum circuit is formed. The chip is disposed in the sample holder. The sample holder includes a base including a support structure, and a PCB in contact with the base. The PCB has a through hole. At least a part of the base below the through hole has a cavity. The support structure supports a surface of a chip and is electrically connected to the base. The support structure is disposed in the cavity. At least a part of a section of the support structure that supports the chip is not parallel to the surface of the chip.

BRIEF DESCRIPTION OF THE DRAWINGS

Exemplary features and advantages of the present disclosure will become apparent from the following detailed description when taken with the accompanying drawings in which:

FIG. 1B is a side view of the sample holder shown in FIG. 1A;

FIG. 2C is a side view of the PCB;

FIG. 2E is an enlarged view of the PCB near a through hole;

FIG. 3B is an end view in which the configuration in a case where a chip of a superconducting quantum circuit is mounted on the sample holder shown in FIGS. 1A and 1B is cut with a plane parallel to an xz plane including a cutting line A-AA (z axis direction) shown in FIG. 3A;

FIG. 11C is a side view of the PCB used in the sample holder of the first example embodiment;

FIG. 29C is an enlarged view of a cross section, near the core wire, of the PCB according to the another example embodiment that is cut with a plane parallel to the xz plane including a cutting line N-NN shown in FIG. 29A;

EXAMPLE EMBODIMENT

Figure 1A:
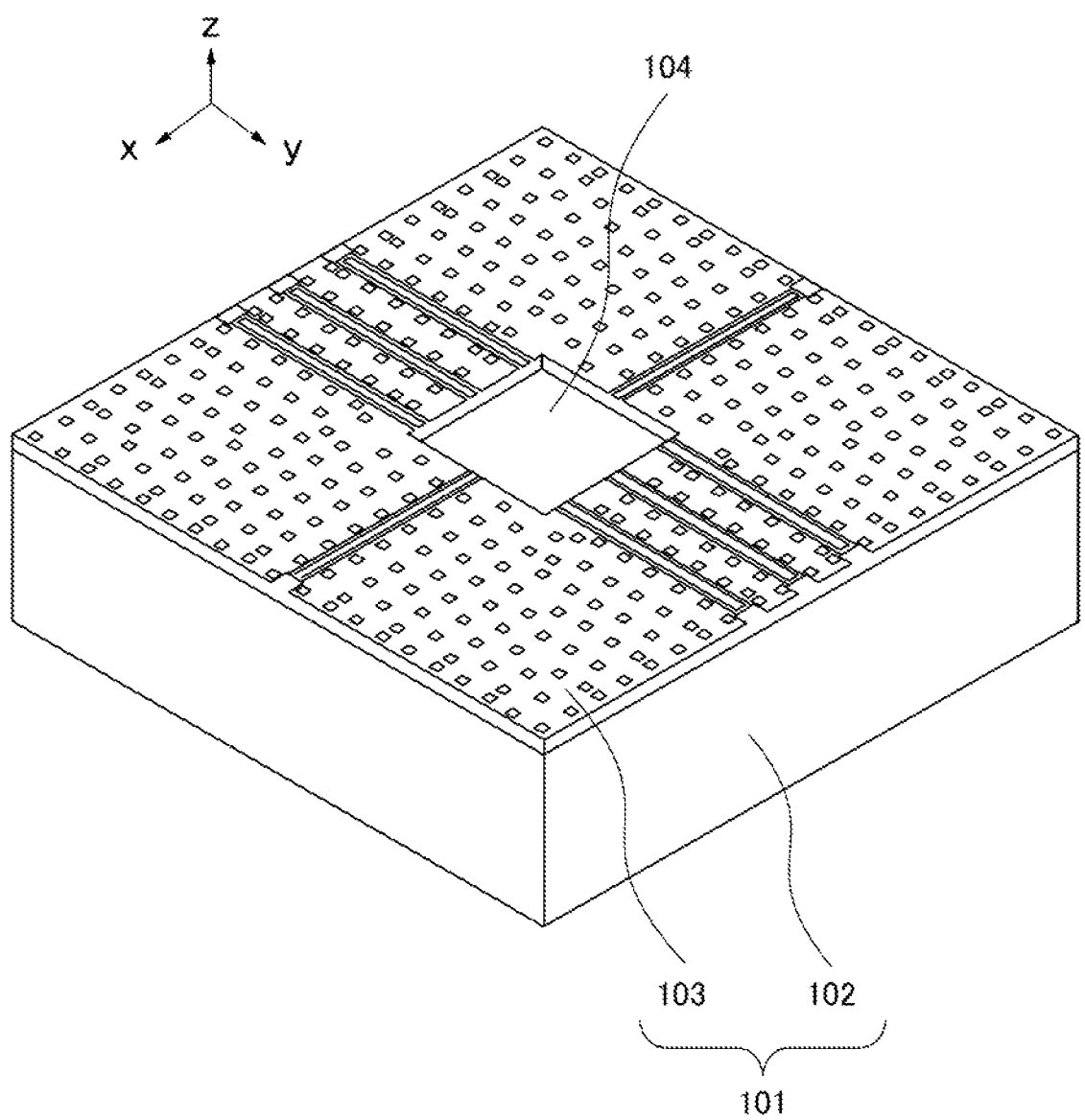
FIG. 1A is an explanatory diagram showing an example of a sample holder that holds a chip on which a superconducting quantum circuit is formed.

Example embodiments of the sample holder and the superconducting quantum computer according to the present disclosure will be described below in detail with reference to the drawings. However, the drawings schematically show the configuration in the example embodiments of the present disclosure. The example embodiments of the present disclosure described below are examples, and can be appropriately changed within the scope of the same essence. In the following description of the drawings, the same or similar parts are denoted by the same or similar reference numerals. In the following drawings, elements and the like that are not used for description are appropriately omitted. In the following description, the ground may be referred to as GND. For example, the front-surface ground is referred to as front-surface GND. For example, the back-surface ground is referred to as back-surface GND.

In order to make the effect of the sample holder according to each example embodiment clearer, a result of modeling and simulating of the sample holder in which a cavity is formed in the base immediately below the chip is compared with a result of modeling and simulating of the sample holder according to each example embodiment. Therefore, before the detailed description of the example embodiments, first, the problem of chip mode in the superconducting quantum circuit will be described in more detail. Then, the result of modeling and simulating of the sample holder to be compared with the sample holder according to each example embodiment will be described. In the sample holder to be compared, a PCB is placed on a metal base. This sample holder is provided with a through hole near the center of the PCB. In this sample holder, a part of a metal base immediately below the chip is hollowed out to form a cavity immediately below the chip.

In the drawings, in order to make the orientation clear, description will be made using an x axis, a y axis, and a z axis as a three-dimensional coordinate system.

FIG. 1A is an explanatory diagram showing an example of a sample holder that holds a chip on which a superconducting quantum circuit is formed. FIG. 1B is a side view of a sample holder 101 shown in FIG. 1A. As shown in FIG. 1A, the sample holder 101 has the configuration in which a PCB 103 is placed on a metal base 102. In FIG. 1A, the shape of the base 102 is a rectangular parallelepiped or a cube. A through hole 104 penetrating the PCB 103 is provided near the center of the PCB 103.

Figure 2A:
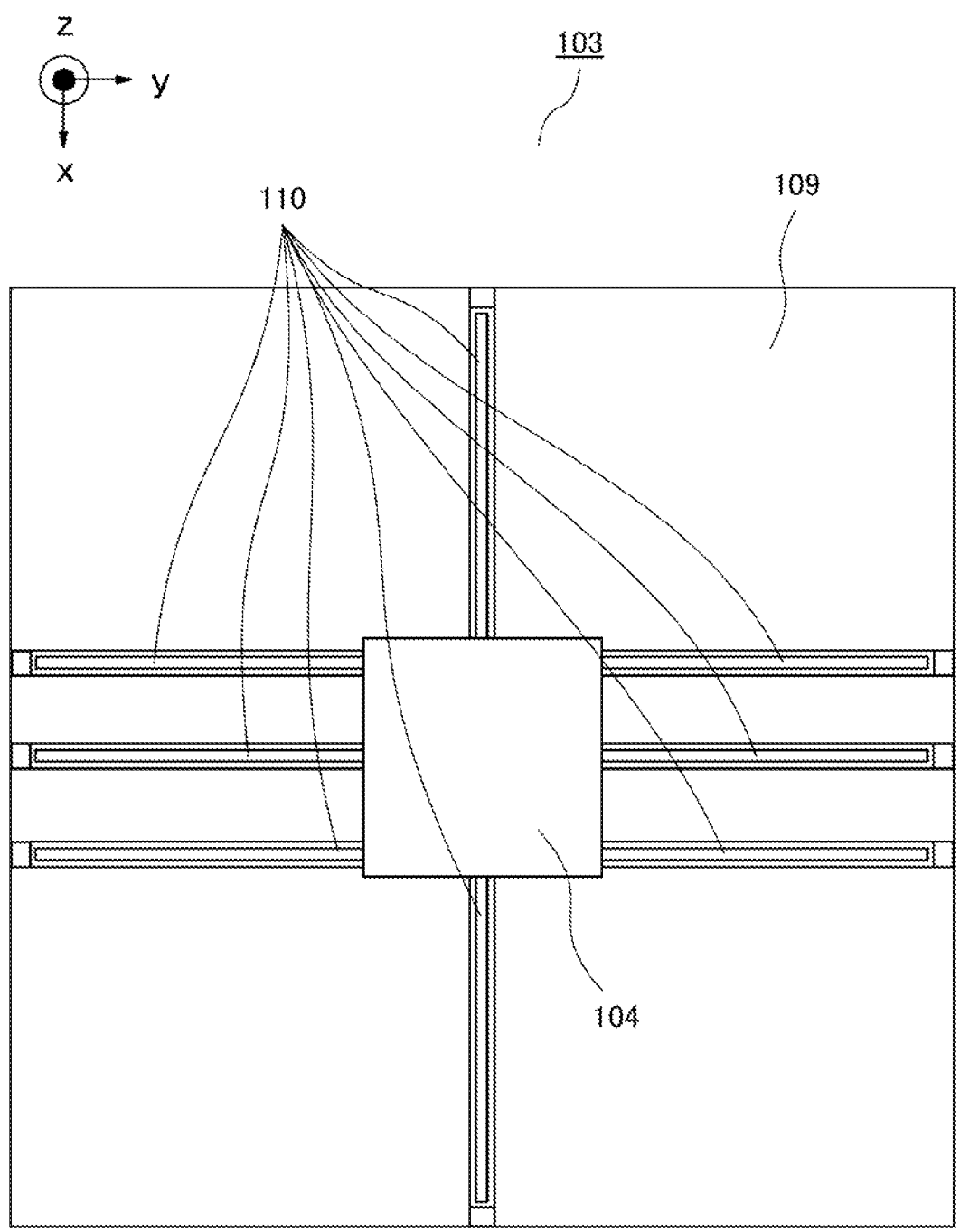
FIG. 2A is a top view of a PCB.
Figure 2B:
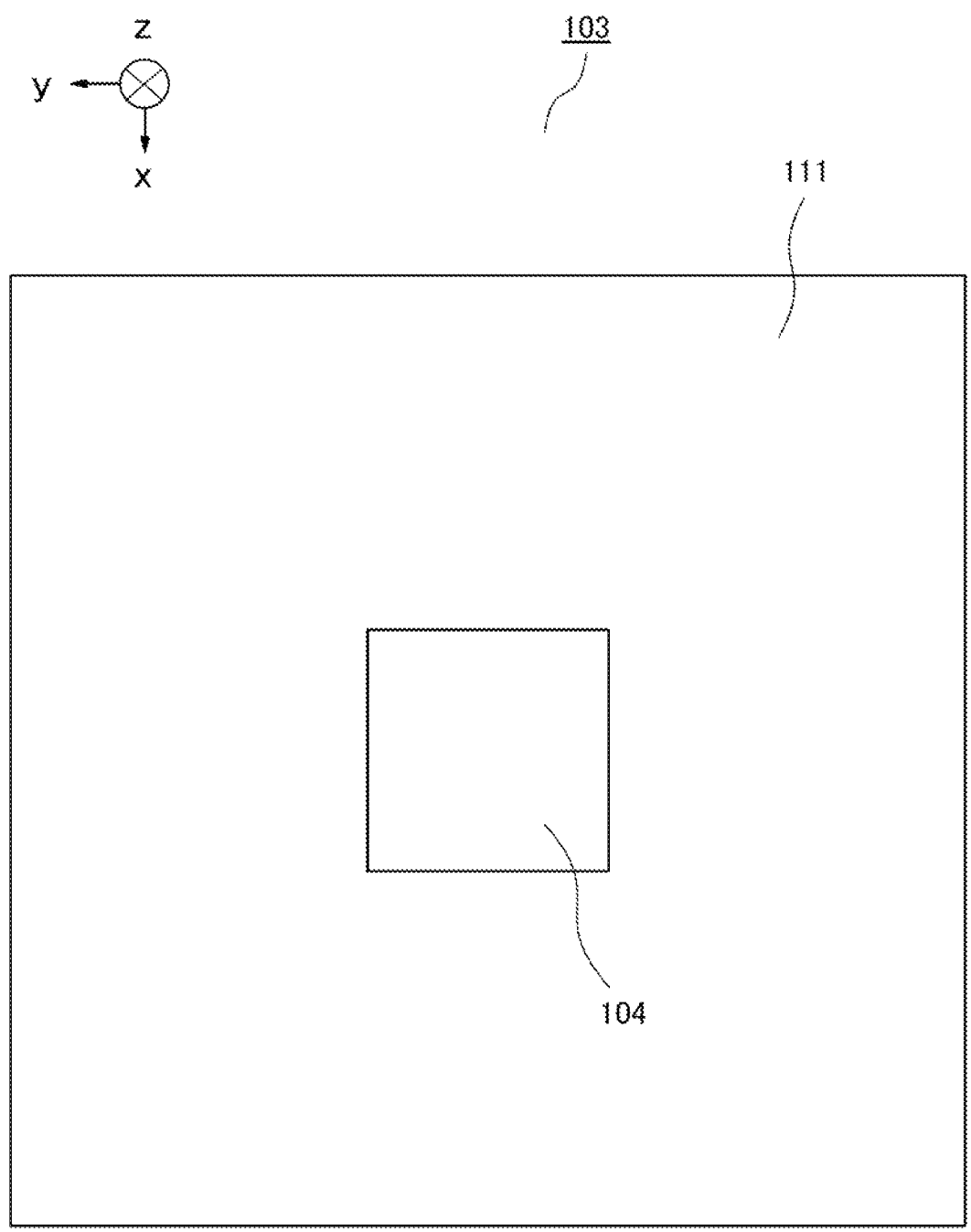
FIG. 2B is a bottom view of the PCB.
Figure 2D:
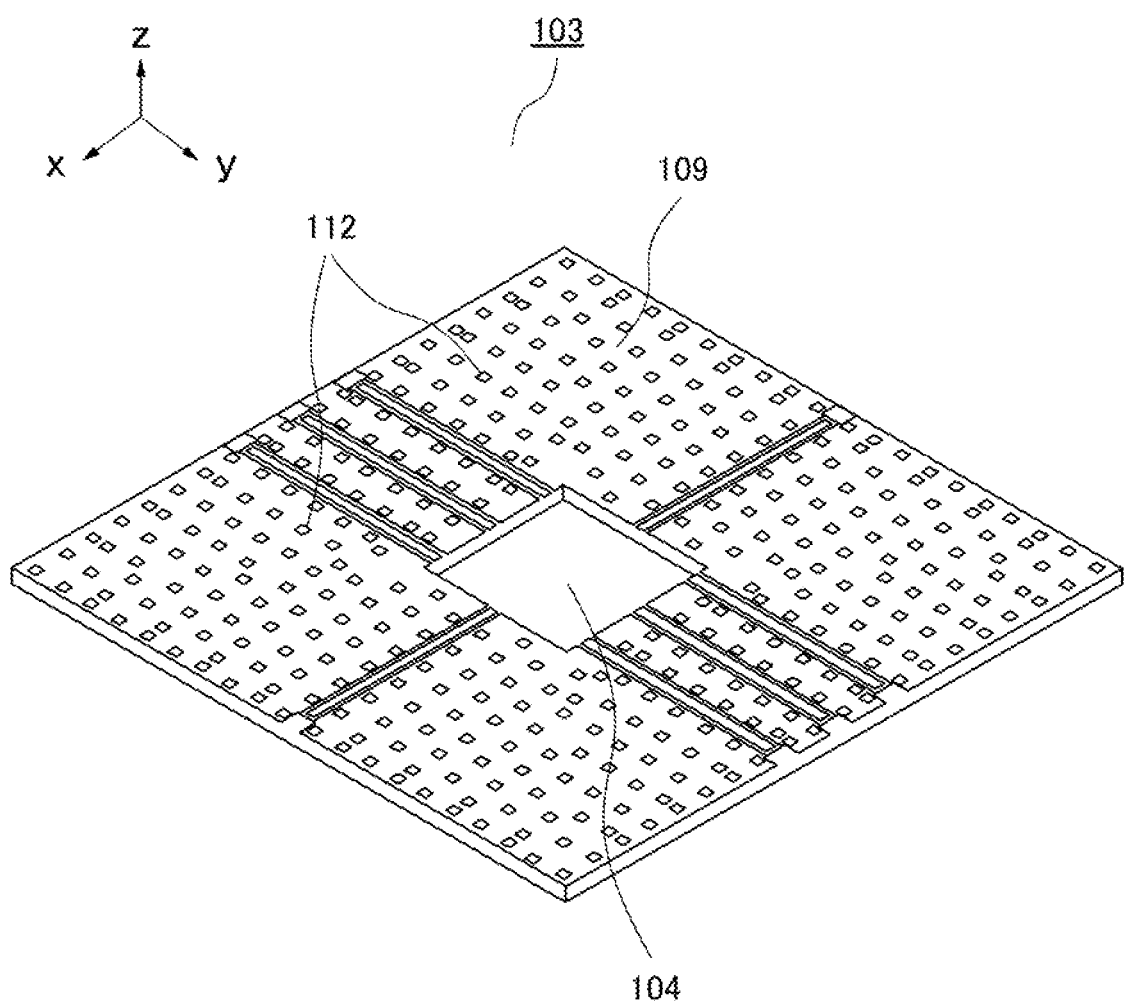
FIG. 2D is a perspective view of the PCB.

An example of the PCB 103 is shown in FIGS. 2A to 2E. FIG. 2A is a top view of the PCB 103. FIG. 2B is a bottom view of the PCB 103. FIG. 2C is a side view of the PCB 103. FIG. 2D is a perspective view of the PCB 103. FIG. 2E is an enlarged view of the PCB 103 near the through hole 104.

As shown in FIGS. 2A to 2E, the PCB 103 has a structure in which, for example, a front-surface GND 109 and a core wire 110 of a coplanar waveguide are formed on one surface of a plate-like dielectric 108 extending in parallel to the xy plane, and a back-surface GND 111 is formed on the other surface of the dielectric 108. The core wire 110, the front-surface GND 109, and the back-surface GND 111 are conductors, for example, metals. Here, the coplanar waveguide is a waveguide that includes a central conductor and two GND planes arranged on both side surfaces of the central conductor with a gap interposed between the central conductor and the two GND planes on the xy plane, and has a structure where the central conductor and the two GND planes are arranged on substantially the same plane. The two GND planes of the coplanar waveguide shown in FIGS. 2A and 2E are formed by the front-surface GND 109. In the PCB 103 shown in FIGS. 2A to 2E, the core wire 110 corresponds to the central conductor. In the PCB 103 shown in FIGS. 2A to 2E, the coplanar waveguide is formed by forming the front-surface GND 109 on both side surfaces of the core wire 110 with a gap on the xy plane. In the example shown in FIGS. 2A to 2E, eight coplanar waveguides are formed on the PCB 103. As shown in FIG. 2D, the PCB 103 is provided with a plurality of through holes 112. These through holes 112 penetrate the dielectric 108 and electrically connect the front-surface GND 109 and the back-surface GND 111. For example, the through hole 112 is produced by forming a hole that penetrates the dielectric 108, the front-surface GND 109, and the back-surface GND 111 and then plating the inside of the hole with metal. In FIGS. 1A and 1B, the back-surface GND 111 of the PCB 103 is in contact with the base 102. Therefore, the metal base 102, the back-surface GND 111 of the PCB 103, the through hole 112 of the PCB 103, and the front-surface GND 109 of the PCB 103 are electrically connected. The through hole 104 provided near the center of the PCB 103 has, for example, the same shape as the that of the chip of the superconducting quantum circuit mounted on the sample holder 101, that is, a rectangular or square shape. In order to allow the chip to enter the inside of the through hole 104, the area of the through hole 104 is larger than the area of the chip.

Figure 3A:
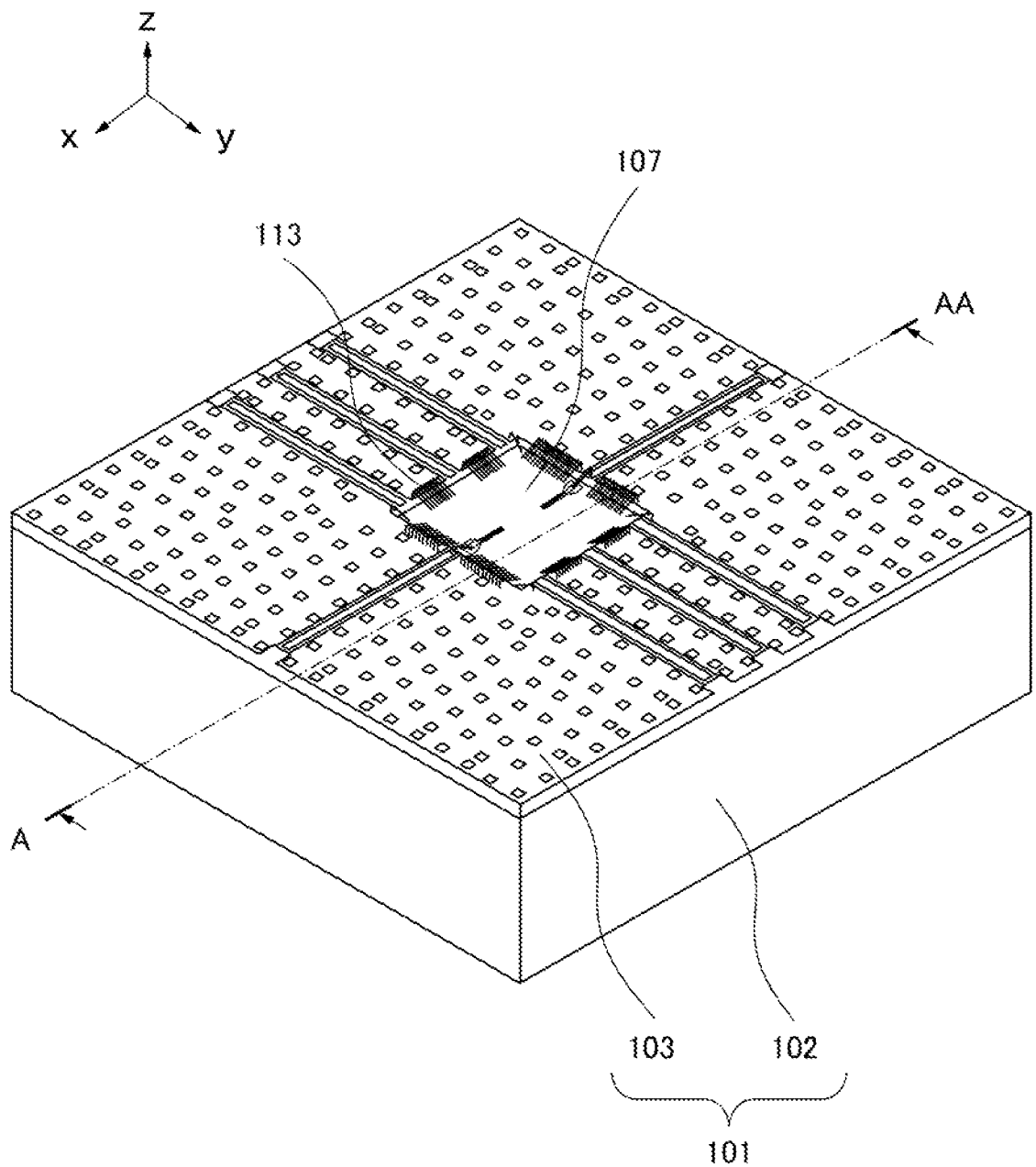
FIG. 3A is a perspective view showing a configuration in a case where a chip of a superconducting quantum circuit is mounted on the sample holder shown in FIGS. 1A and 1B.

Next, FIGS. 3A and 3B show the configuration in a case where a chip 107 of the superconducting quantum circuit is mounted on the sample holder 101 shown in FIGS. 1A and 1B. FIG. 3A is a perspective view showing the configuration in a case where the chip 107 of a superconducting quantum circuit is mounted on the sample holder 101 shown in FIGS. 1A and 1B. FIG. 3B is an end view in which the configuration in a case where the chip 107 of a superconducting quantum circuit is mounted on the sample holder 101 shown in FIGS. 1A and 1B is cut with a plane parallel to the xz plane including the cutting line A-AA shown in FIG. 3A. In FIGS. 3A and 3B, the PCB 103 shown in FIGS. 2A to 2E is used. As shown in FIGS. 3A and 3B, the chip 107 is placed inside the through hole 104 of the PCB 103, the chip 107 is placed on the base 102, the pad of the chip 107 and the core wire 110 of the PCB 103 are electrically connected by a bonding wire 113 such as aluminum (Al), and the GND plane of the chip 107 and the front-surface GND 109 of the PCB are electrically connected by the bonding wire 113 such as Al. Here, the pad of the chip 107 is a signal input/output terminal formed on the chip 107. In the example shown in FIGS. 3A and 3B, the back surface of the chip 107 is in contact with the metal base 102. In FIG. 3B, the back surface of the chip 107 is lower surface of the chip 107.

In a case where the chip 107 is mounted on the sample holder 101 shown in FIGS. 1A and 1B, resonance occurs when a signal of a specific frequency is input to the chip 107. In order to identify the cause of the resonance in the chip mode, simulation is performed using electromagnetic field analysis software. Here, simulation is performed using ANSYS® HFSS developed by Ansys Japan Inc. Simulation is performed using the same tool in the simulation hereinafter.

Figure 4A:
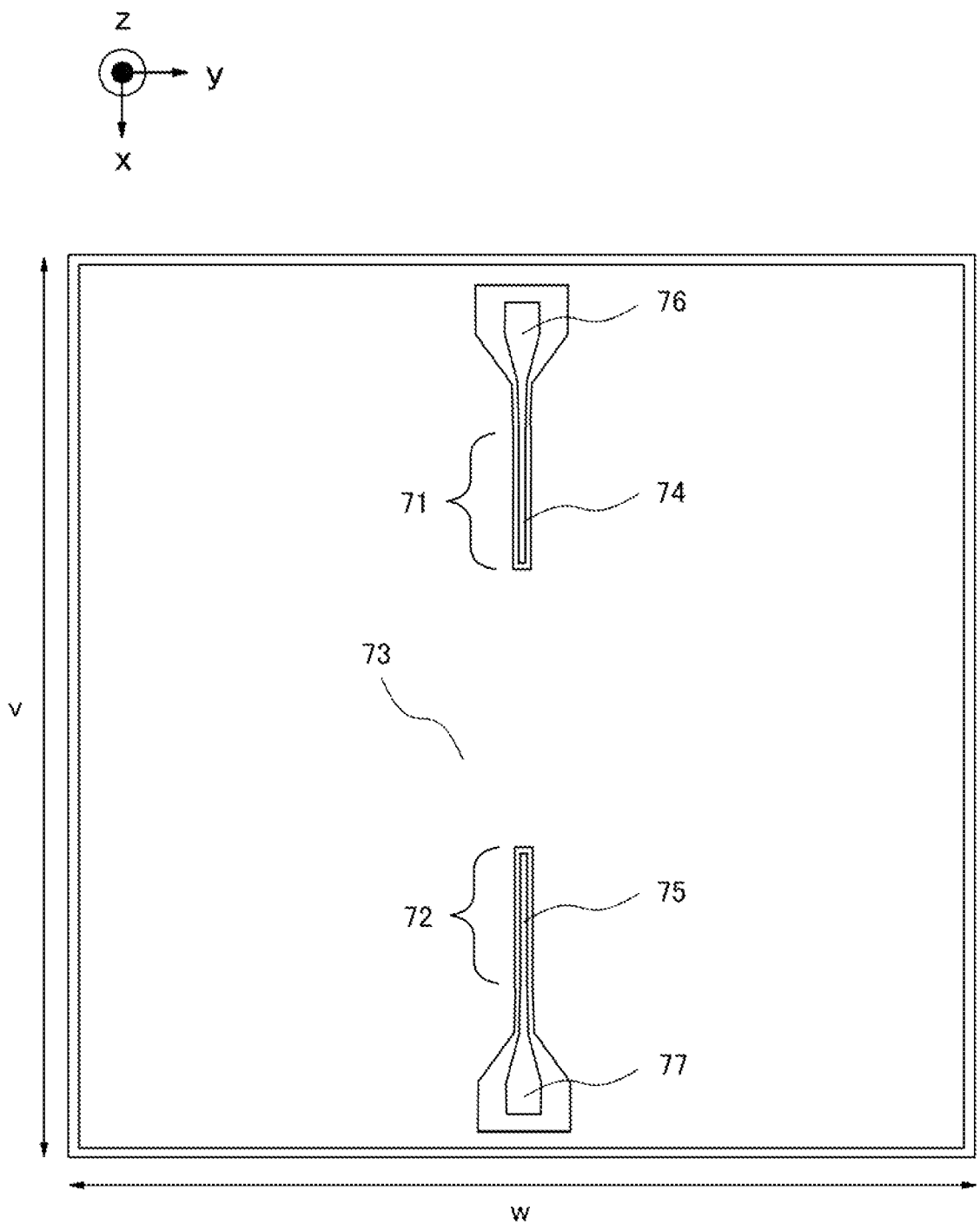
FIG. 4A is a top view of a chip used in simulation.
Figure 4B:
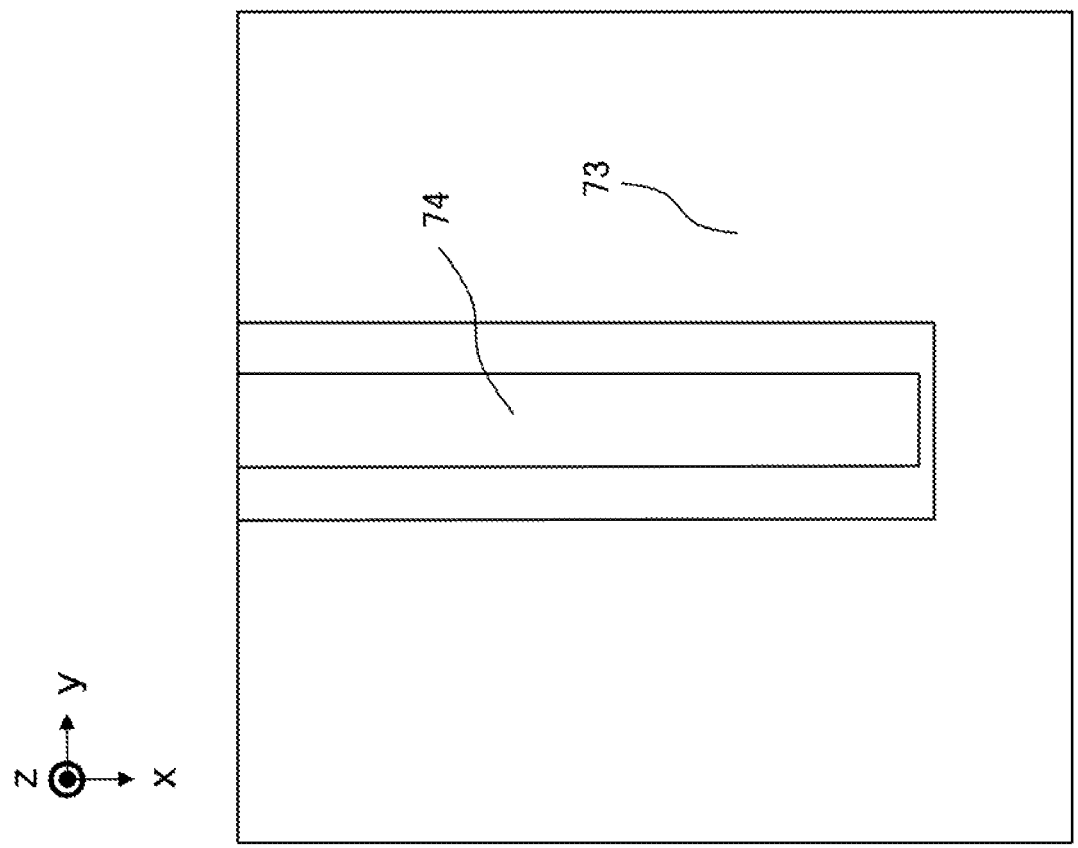
FIG. 4B is an enlarged view of a first coplanar waveguide near a tip end.

The chip is shown in FIGS. 4A and 4B. FIG. 4A is a top view of the chip 107 used in simulation. FIG. 4B is an enlarged view of a first coplanar waveguide 71 near the tip end. As shown in FIG. 4A, the chip 107 has a rectangular or square shape, and the lengths of the sides of the chip 107 are v and w. In the following description, the simulation assumes that the shape of the chip 107 is square, and the length of each side of the chip 107 is v=w=5 [mm] (millimeters). In the chip 107 used in the simulation, a metal film having a thickness of 200 [nm] (nanometers) is laminated on a silicon substrate having a thickness of 380 [µm] (micrometers), and a predetermined part of the metal film is removed, whereby a circuit pattern is formed. In the chip 107 shown in FIGS. 4A and 4B, the first coplanar waveguide 71 and a second coplanar waveguide 72 are formed. The first coplanar waveguide 71 and the second coplanar waveguide 72 have the same shape. The characteristic impedance of the first coplanar waveguide 71 and the second coplanar waveguide 72 is designed to 50[Ω] (ohms) and the length is 1 [mm]. FIG. 4B shows the enlarged view of the first coplanar waveguide 71 near the tip end. As shown in FIG. 4B, the tip end of the first coplanar waveguide 71 is not in contact with a GND plane 73. As shown in FIG. 4A, the first coplanar waveguide 71 and the second coplanar waveguide 72 are not connected. Similarly, the tip end of the second coplanar waveguide 72 is also not in contact with the GND plane 73. One end of a first core wire 74 is connected to a first pad 76, and one end of a second core wire 75 is connected to a second pad 77.

Figure 5A:
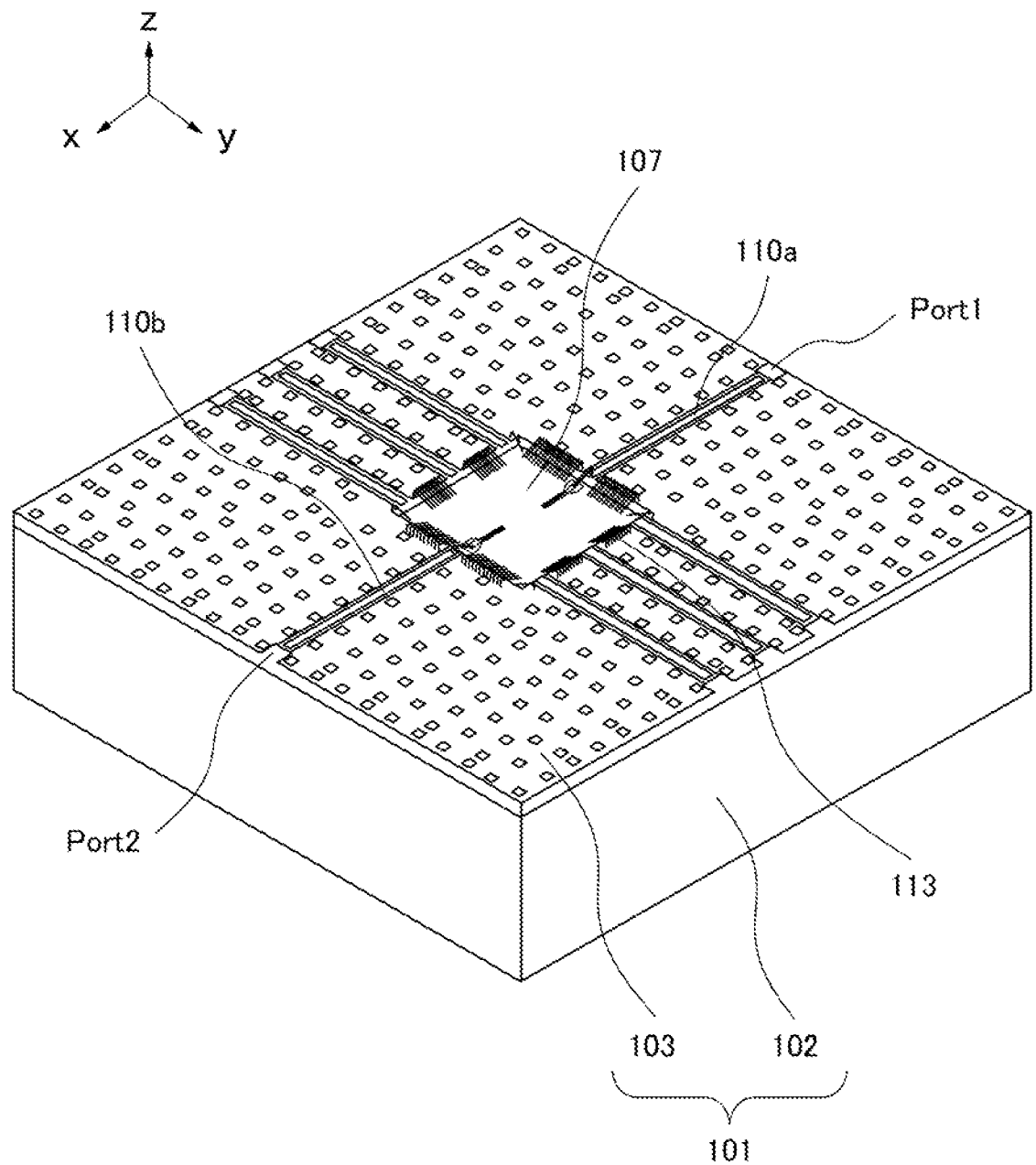
FIG. 5A is a perspective view showing an example in which the chip shown in FIGS. 4A and 4B is mounted on the sample holder shown in FIGS. 1A and 1B.
Figure 5B:
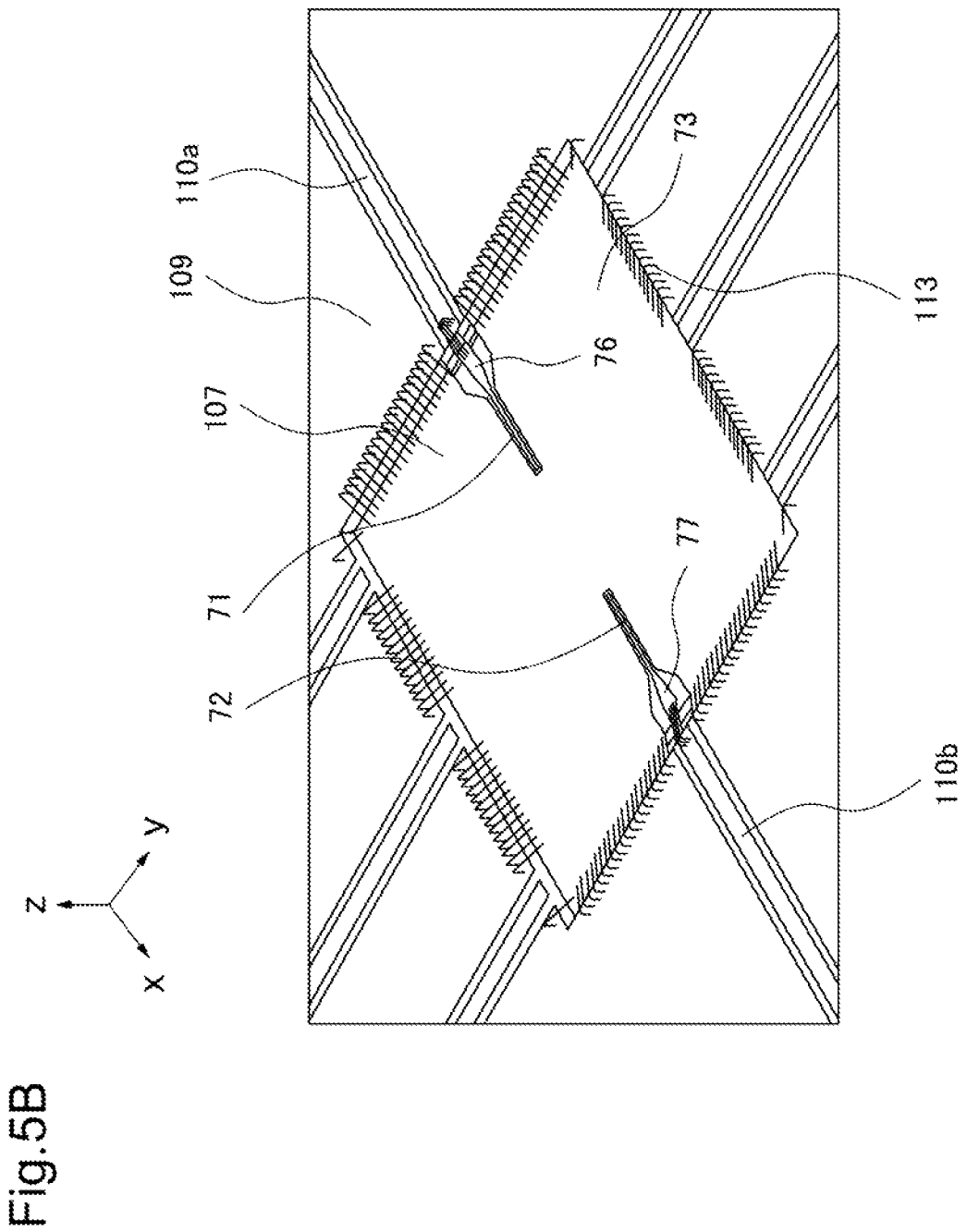
FIG. 5B is an enlarged view near the chip.

FIGS. 5A and 5B show an example in which the chip 107 shown in FIGS. 4A and 4B is mounted on the sample holder 101 shown in FIGS. 1A and 1B. FIG. 5A is a perspective view showing an example in which the chip 107 shown in FIGS. 4A and 4B is mounted on the sample holder 101 shown in FIGS. 1A and 1B. FIG. 5B is an enlarged view near the chip 107. As shown in FIGS. 5A and 5B, the first pad 76 of the chip 107 is electrically connected to a first core wire 110a of the PCB 103 by the bonding wire 113 of Al. The second pad 77 of the chip 107 is electrically connected to a second core wire 110b of the PCB 103 by the bonding wire 113 of Al, and the GND plane 73 of the chip 107 is electrically connected to the front-surface GND 109 of the PCB 103 by the bonding wire 113 of Al. As shown in FIG. 5A, the other end of the first core wire 110a of the PCB 103 than the end connected to the first pad 76 of the chip 107 is defined as Port 1. On the other hand, the other end of the second core wire 110b of the PCB 103 than the end connected to the second pad 77 of the chip 107 is defined as Port 2. In the simulation, reflection to Port 1 and transmission to Port 2 when a high-frequency signal is input from Port 1, for example, are calculated. Here, reflection to Port 1 is denoted by S11, and transmission to Port 2 is denoted by S21.

Figure 6A:
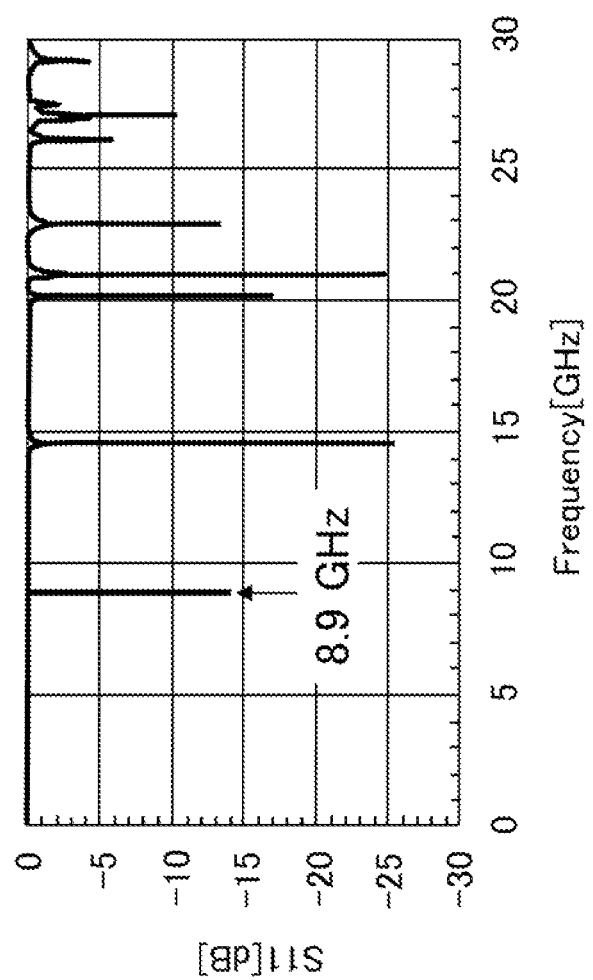
FIG. 6A is an explanatory diagram showing reflection (S11) to Port 1 when a high-frequency signal is input from Port 1 shown in FIG. 5A.
Figure 6B:
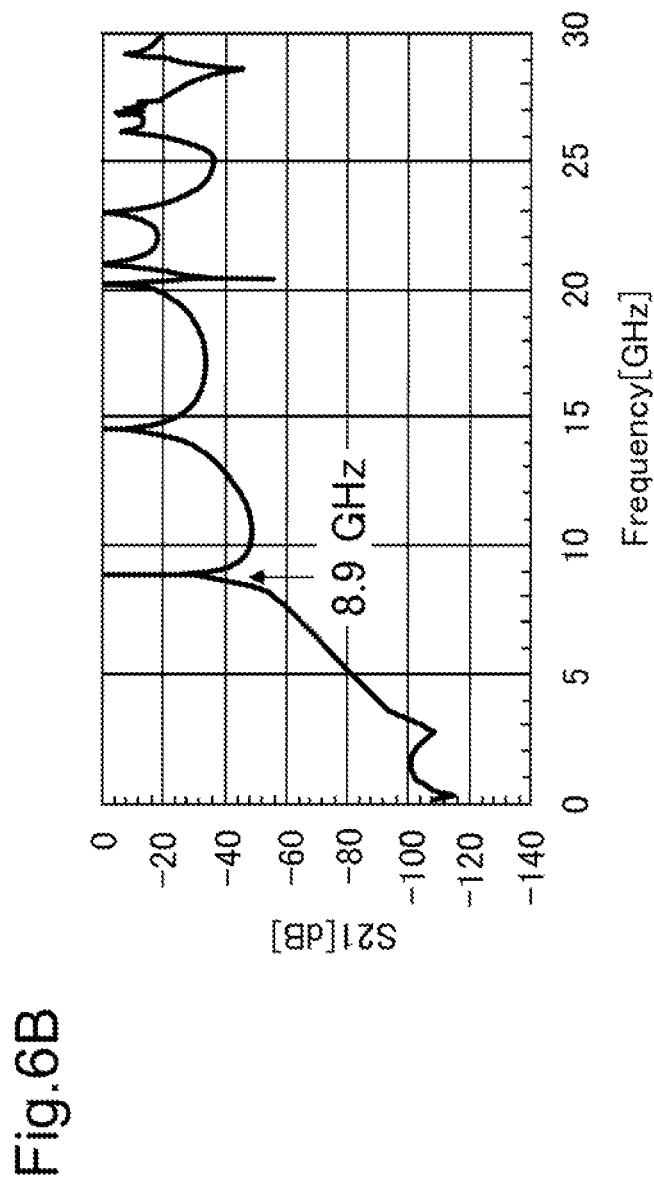
FIG. 6B is an explanatory diagram showing transmission (S21) to Port 1 when a high-frequency signal is input from Port 1 shown in FIG. 5A.

FIGS. 6A and 6B show simulation results when a high-frequency signal is input from Port 1 shown in FIG. 5A. FIG. 6A is an explanatory diagram showing reflection (S11) to Port 1 when a high-frequency signal is input from Port 1 shown in FIG. 5A. FIG. 6B is an explanatory diagram showing transmission (S21) to Port 1 when a high-frequency signal is input from Port 1 shown in FIG. 5A. In FIGS. 6A and 6B, the horizontal axis represents the frequency (unit: [GHz] (gigahertz)). S11 and S21 on the vertical axis are indicated in decibels ([dB]). That is, S11 and S21 on the vertical axis are indicated in logarithm. In the following description of the simulation results, the horizontal axis represents the frequency (unit: [GHz]), and S11 or S21 on the vertical axis are indicated in decibels ([dB]).

As shown in FIG. 6A and FIG. 6B, when signals of several specific frequencies are input, S21 becomes very large, and S11 becomes very small. As shown in FIGS. 4A and 4B, the first coplanar waveguide 71 and the second coplanar waveguide 72 of the chip 107 are not connected. Therefore, even if a signal is input to Port 1, it is expected that the signal will not be transmitted to Port 2. However, as shown by the simulation result of FIG. 6B, when signals of several specific frequencies are input from Port 1, S21 becomes very large. For example, according to the simulation result of FIG. 6B, S21 is about −1.9 [dB] when a signal of 8.9 [GHz] is input from Port 1. That is, the amount of about 65% of the energy of the signal input from Port 1 is transmitted to Port 2. The simulation result shown in FIG. 6A indicates that S11 becomes very small at such specific frequency at which S21 becomes very large.

From the above, the simulation results shown in FIGS. 6A and 6B indicate the following. That is, in the system in which the chip 107 of the superconducting quantum circuit is mounted on the sample holder 101 as shown in FIGS. 5A and 5B, the space sandwiched between the GND plane 73 on the front surface of the chip 107 and the metal base 102, that is, the silicon substrate forms a cavity resonator. The first coplanar waveguide 71 and the second coplanar waveguide 72 of the chip 107 are coupled with this cavity resonator. Therefore, when a signal having a frequency equal to the resonance frequency of this cavity resonator is input to the chip from Port 1, for example, resonance of the cavity resonator is excited. Then, a standing wave rises in the silicon substrate, and energy of the electromagnetic field is accumulated. Since the second coplanar waveguide 72 of the chip 107 is also coupled with this cavity resonator, a part of the energy of the electromagnetic field accumulated in the silicon substrate is transmitted to Port 2 through the second coplanar waveguide 72 of the chip 107.

Such a phenomenon can occur in the system shown in FIGS. 3A and 3B regardless of the type of the circuit formed in the chip 107. Such a phenomenon can occur not only in a case where the coplanar waveguides 71 and 72 as shown in FIGS. 4A and 4B are formed in the chip 107, but also in a case where an arbitrary superconducting quantum circuit is formed in the chip 107. In the mounting system as shown in FIG. 3, the resonance caused by the space sandwiched between the GND plane 73 and the metal base 102 on the surface of the chip 107, that is, the silicon substrate that forms the cavity resonator is referred to as resonance of the chip mode in the present description.

In the simulation results of FIG. 6A and FIG. 6B, several specific frequencies at which S21 becomes very large and S11 becomes very small are hereinafter referred to as resonance frequencies of the chip mode. When a signal having a frequency equal to or close to the resonance frequency of the chip mode is input to the chip 107, resonance of the chip mode occurs. According to the simulation results of FIGS. 6A and 6B, the lowest resonance frequency of the chip mode is 8.9 [GHz] in the system shown in FIGS. 5A and 5B. In the system shown in FIGS. 3A and 3B, where the chip 107 having the superconducting quantum circuit is mounted on the sample holder 101 shown in FIGS. 1A and 1B, when the chip mode is coupled with the superconducting quantum circuit formed on the chip 107, it causes decoherence of the superconducting quantum circuit. It is known that the resonance frequency of the chip mode needs to be as high as possible in order to reduce the influence of decoherence.

For this reason, a technology for increasing the resonance frequency of the chip mode is required. For example, in the sample holder 101 to be compared, the influence of the chip mode can be reduced by hollowing out a part of a section of the base 102 immediately below the chip 107 to form a cavity immediately below the chip 107.

Figure 7A:
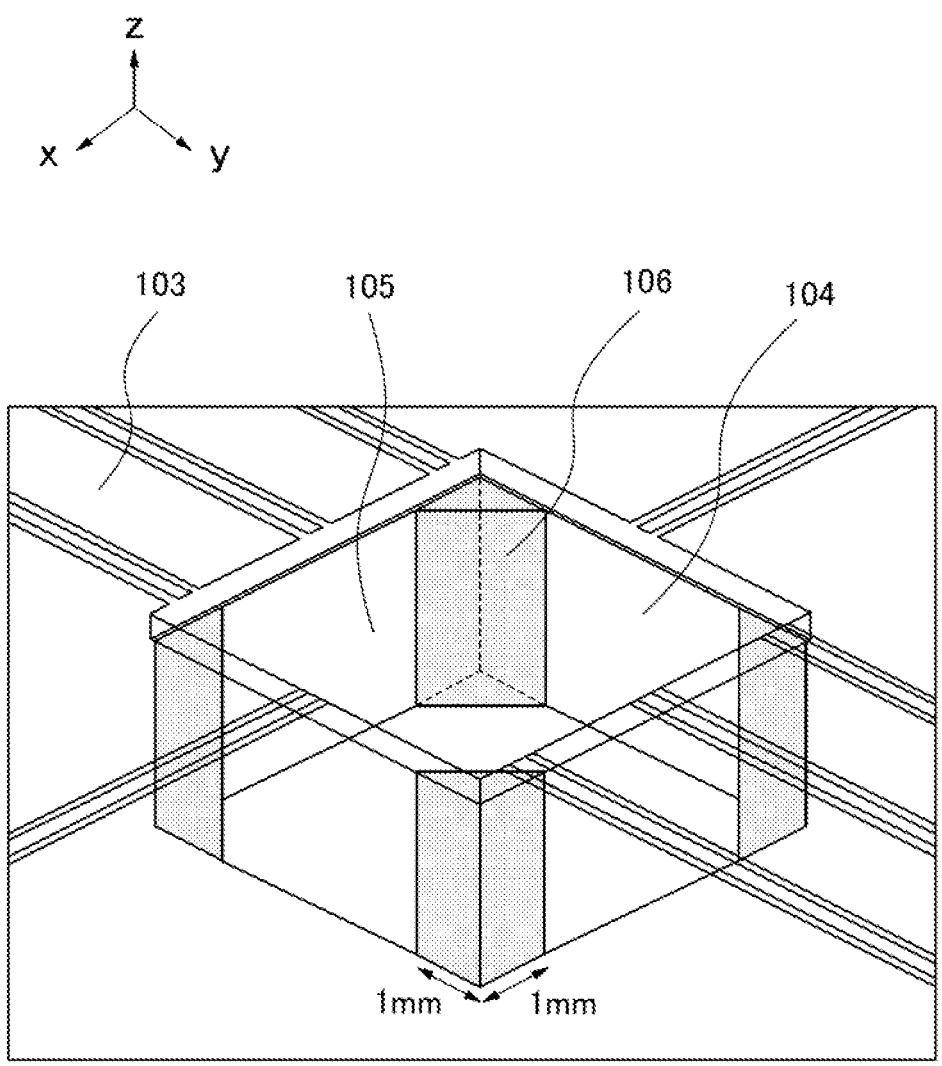
FIG. 7A is a perspective view of the sample holder in which a cavity is formed in a base.
Figure 7B:
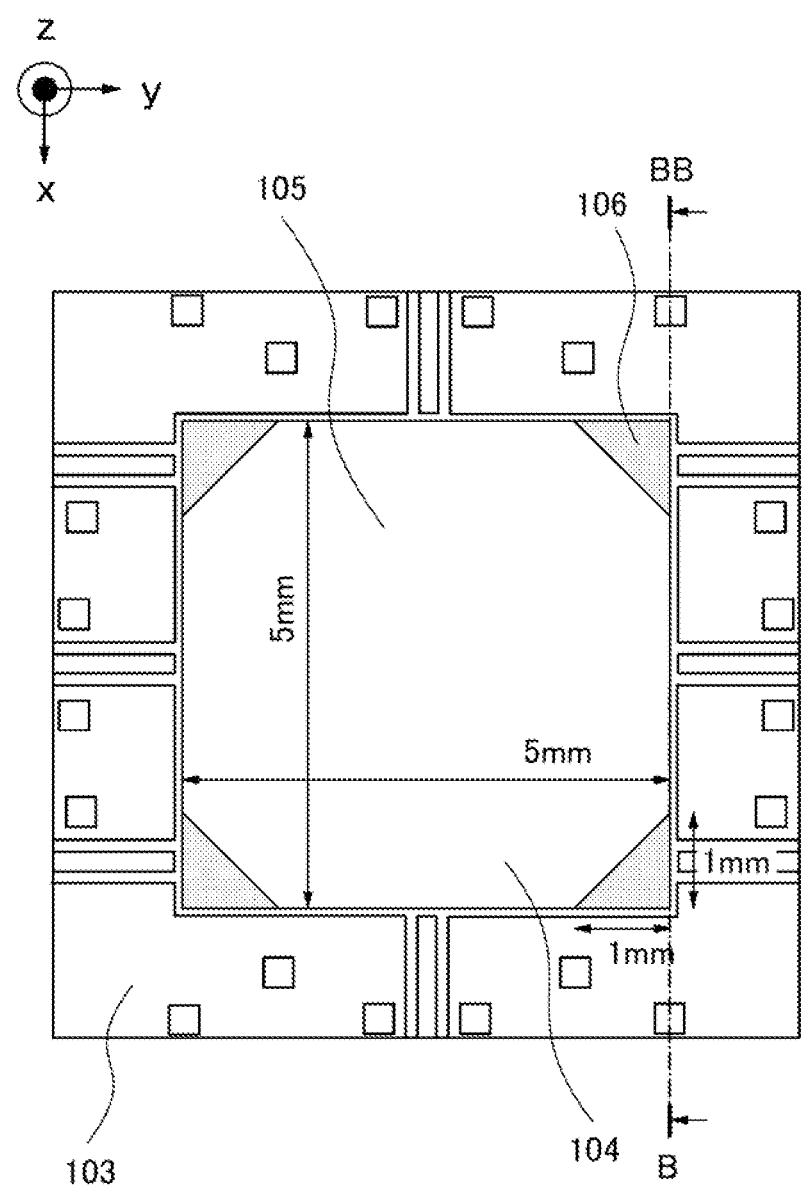
FIG. 7B is a top view of the sample holder in which the cavity is formed in the base.
Figure 7C:
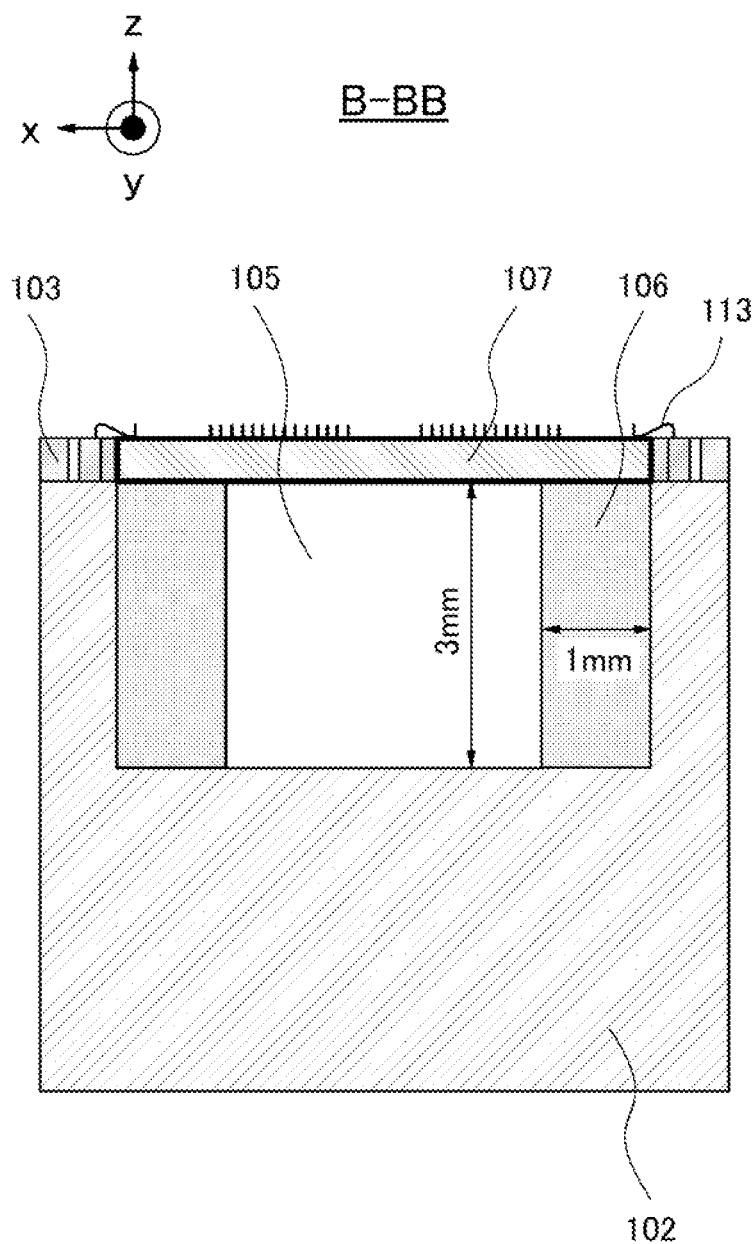
FIG. 7C is an end view in which the sample holder in which the cavity is formed on the base is cut with a plane parallel to the xz plane including a cutting line B-BB shown in FIG. 7B.

FIGS. 7A to 7C show enlarged views of the sample holder 101 having a cavity formed in the base 102, near the through hole 104 of the PCB 103. FIG. 7A is a perspective view of the sample holder 101 in which the cavity is formed in the base. FIG. 7B is a top view of the sample holder 101 in which the cavity is formed in the base; FIG. 7C is an end view in which the sample holder 101 in which the cavity is formed in the base is cut with a plane parallel to the xz plane including the cutting line B-BB shown in FIG. 7B. As shown in FIGS. 7A to 7C, a cavity 105 is formed in a section of the base 102 immediately below the through hole 104 of the PCB 103. In other words, as shown in FIGS. 7A to 7C, in the base 102, the cavity 105 is formed in a section immediately below the chip 107 when the chip 107 is mounted on the sample holder 101. In FIGS. 7A to 7C, the cavity 105 has a quadrangular prism shape having a bottom surface having the same area as the area of the chip 107. The base 102 has a structure in which columns 106 are left at four corners of the cavity 105. The column 106 is made of metal, for example. In FIG. 7C, the chip 107 is mounted on the sample holder 101 with the bonding wire 113.

In FIGS. 7A, 7B, and 7C, in order to clearly show the columns 106, the columns 106 are indicated in a pattern different from that of the base 102. The metal columns 106 at the four corners are integrated with the base 102 and constitute a part of the base 102. Of the two bottom surfaces of the metal columns 106 at the four corners shown in FIGS. 7A to 7C, the upper bottom surface is in contact with the back surface of the chip 107. In FIGS. 7A and 7B, the bottom surface of the metal column 106 is an isosceles right triangle. As shown in FIG. 7C, simulation is performed for a case where the chip 107 of FIGS. 4A and 4B is mounted on the sample holder 101 of FIG. 7 with the lengths of the two equal sides of the bottom surface of the column 106 being 1 [mm] and the height of the cavity 105 being 3 [mm].

Figure 8:
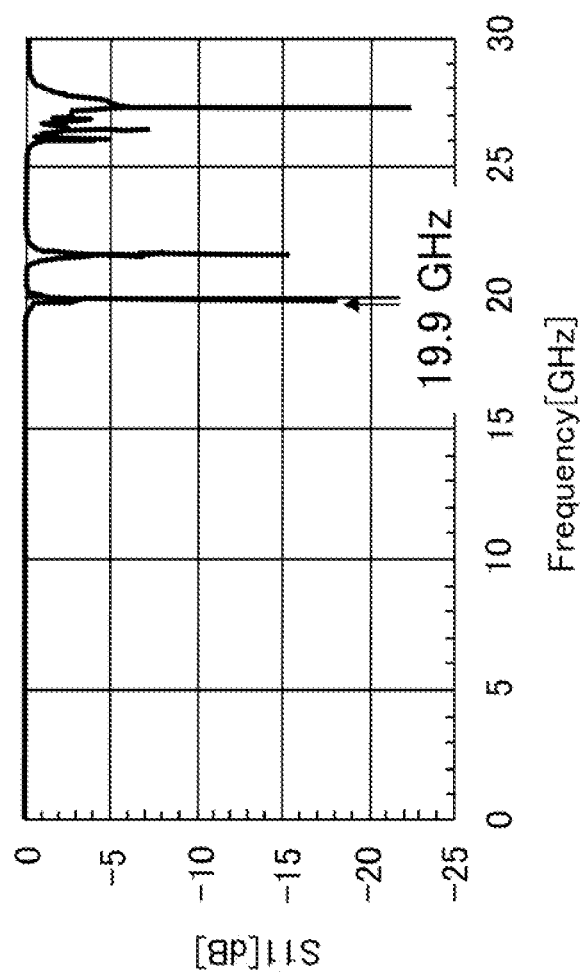
FIG. 8 is an explanatory diagram showing a simulation result of reflection (S11) to Port 1 when a high-frequency signal is input from Port 1 shown in FIG. 5A in a case where the chip shown in FIGS. 4A and 4B is mounted with a bonding wire on the sample holder shown in FIGS. 7A, 7B, and 7C.

FIG. 8 is an explanatory diagram showing a simulation result of reflection (S11) to Port 1 when a high-frequency signal is input from Port 1 shown in FIG. 5A in a case where the chip 107 shown in FIGS. 4A and 4B is mounted with the bonding wire 113 on the sample holder 101 shown in FIGS. 7A, 7B, and 7C. The simulation result of FIG. 8 indicates that when the chip 107 shown in FIGS. 4A and 4B is mounted with the bonding wire 113 on the sample holder 101 in which the cavity 105 of FIG. 7 is formed on the base 102, the lowest resonance frequency of the chip mode can be increased to 19.9 [GHz]. In the simulation results shown in FIGS. 6A and 6B in a case where the cavity 105 is not formed in the base 102, the lowest resonance frequency of the chip mode is 8.9 [GHz]. This indicates that the resonance frequency of the chip mode can be significantly increased by using the sample holder 101 in which the cavity 105 of FIGS. 7A, 7B, and 7C is formed in the base 102.

The reason why the resonance frequency of the chip mode can be increased by forming the cavity 105 in the base 102 is inferred that, when the cavity 105 is formed immediately below the chip 107, the inside of the cavity resonator formed by the space sandwiched between the GND plane 73 on the front surface of the chip 107 and the base 102 is silicon and vacuum. In this case, the base 102 is the bottom of the cavity 105. A thickness of the silicon is 380 [μm] in the simulation. A thickness of vacuum is 3 [mm] in the simulation. Due to this, it is inferred to be because the effective permittivity inside the cavity resonator decreases as compared with the case where the cavity 105 is not formed in the base 102. The case where the cavity 105 is not formed in the base 102 is, in other words, the case where the inside of the cavity resonator is substantially only silicon. While the relative permittivity of vacuum is 1, the relative permittivity of silicon is 11.9, which is very high. The resonance frequency of the cavity resonator generally has a property that the lower the permittivity of the medium filling the inside of the cavity resonator is, the higher the resonance frequency becomes.

Thus, the resonance frequency of the chip mode can be increased by using the sample holder 101 in which the cavity 105 is formed in the base 102. However, in order to reduce the influence of the chip mode on the superconducting quantum circuit, it is required to make the resonance frequency of the chip mode as high as possible. It is predicted that the chip 107 having an area larger than 5 [mm]×5 [mm] will be required when the number of bits of quantum bits integrated on the chip 107 increases toward practical use of a quantum computer. The more the area of the chip 107 increases, the more the resonance frequency of the chip mode decreases. This is because the more the area of the chip 107 increases, the more the dimensions of the bottom surface of the cavity resonator formed by the space sandwiched between the GND plane 73 on the front surface of the chip 107 and the base 102 increases. Therefore, even if the sample holder 101 in which the cavity 105 is formed in the base 102 as shown in FIGS. 7A to 7C is used, it is predicted that the more the area of the chip 107 increases, the more the resonance frequency of the chip mode decreases and the more the influence on the quantum circuit increases. From the above, it is required to develop a technology capable of further making the resonance frequency of the chip mode as high as possible as compared with the case of using the sample holder 101 in which the cavity 105 is formed on the base 102.

The example embodiments capable of further increasing the resonance frequency of the chip mode will be described.

First Example Embodiment

In the first example embodiment, the sample holder includes a base and a PCB in contact with the base. In the first example embodiment, an example in which a PCB includes a dielectric, a front-surface GND that is formed on a front surface of the dielectric, a back-surface GND that is formed on a back surface of the dielectric, and a through hole that penetrates from the front-surface GND to the back-surface GND, the through hole in which a chip is disposed will be described. In the first example embodiment, at least a part of the base below the through hole has a cavity, and the cavity has a support structure that supports a surface of the chip and is conducted to the base. Here, the first example embodiment is characterized in that at least a part of the section that supports the chip in the support structure is not parallel to the back surface of the chip. In particular, in the first example embodiment, an example in which a column is used as the support structure will be described.

Figure 9:
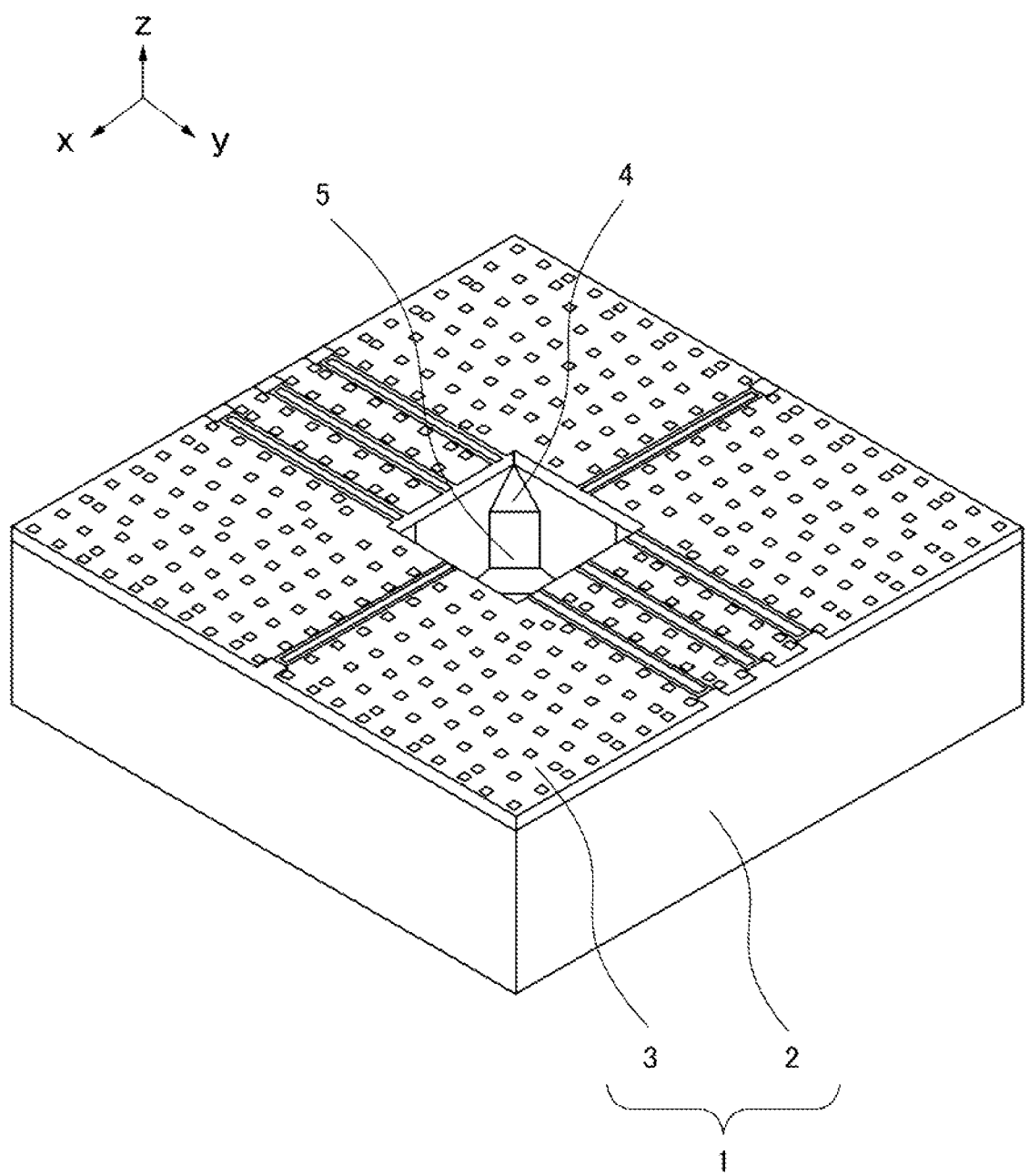
FIG. 9 is an explanatory diagram showing a sample holder according to a first example embodiment.

FIG. 9 is an explanatory diagram showing the sample holder according to the first example embodiment. A sample holder 1 of the first example embodiment has a configuration in which a PCB 3 is placed on a metal base 2 as shown in FIG. 9. A through hole 4 penetrating the PCB 3 is provided near the center of the PCB 3. The shape of the base 2 is not particularly limited. Examples of the shape of the base 2 include a rectangular parallelepiped and a cube. The sample holder 1 has a cavity 5 in a section of the base 2 immediately below the through hole 4 of the PCB 3.

By aligning the height of the circuit surface of the chip and the height of the surface of the PCB 3 as much as possible, it is possible to facilitate wire bonding, and it is possible to shorten the bonding wire. The shorter the bonding wire is, the better the electrical characteristics become. By forming the through hole 4 in the PCB 3, it is possible to increase the resonance frequency of the chip mode. If a dielectric or a conductor exists on the back surface of the chip, the resonance frequency of the chip mode decreases. The back surface of the chip is the surface opposite to the circuit surface. Therefore, in order to increase the resonance frequency of the chip mode, the back surface of the chip is brought into contact with vacuum as much as possible. If the chip is disposed on the PCB 3 without forming the through hole 4 in the PCB 3, the dielectric or the conductor of the PCB 3 comes into contact with the back surface of the chip, and therefore the resonance frequency of the chip mode cannot be increased. Therefore, the first example embodiment has a structure in which the largest possible area of the back surface of the chip is in contact with the vacuum by forming the through hole 4 in the PCB 3, disposing the chip in the through hole 4, and forming the cavity 5 in the base 2 immediately below the chip.

Figure 10A:
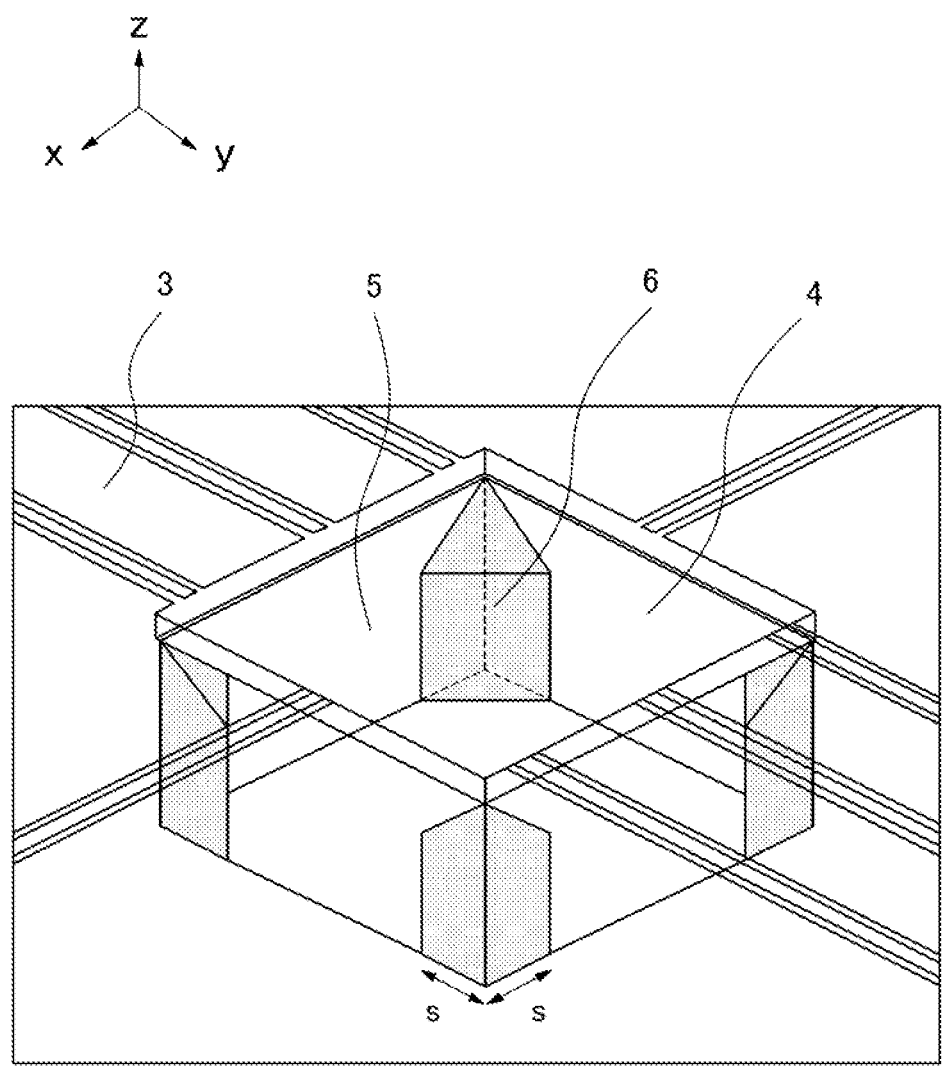
FIG. 10A is a perspective view showing the sample holder of the first example embodiment.
Figure 10B:
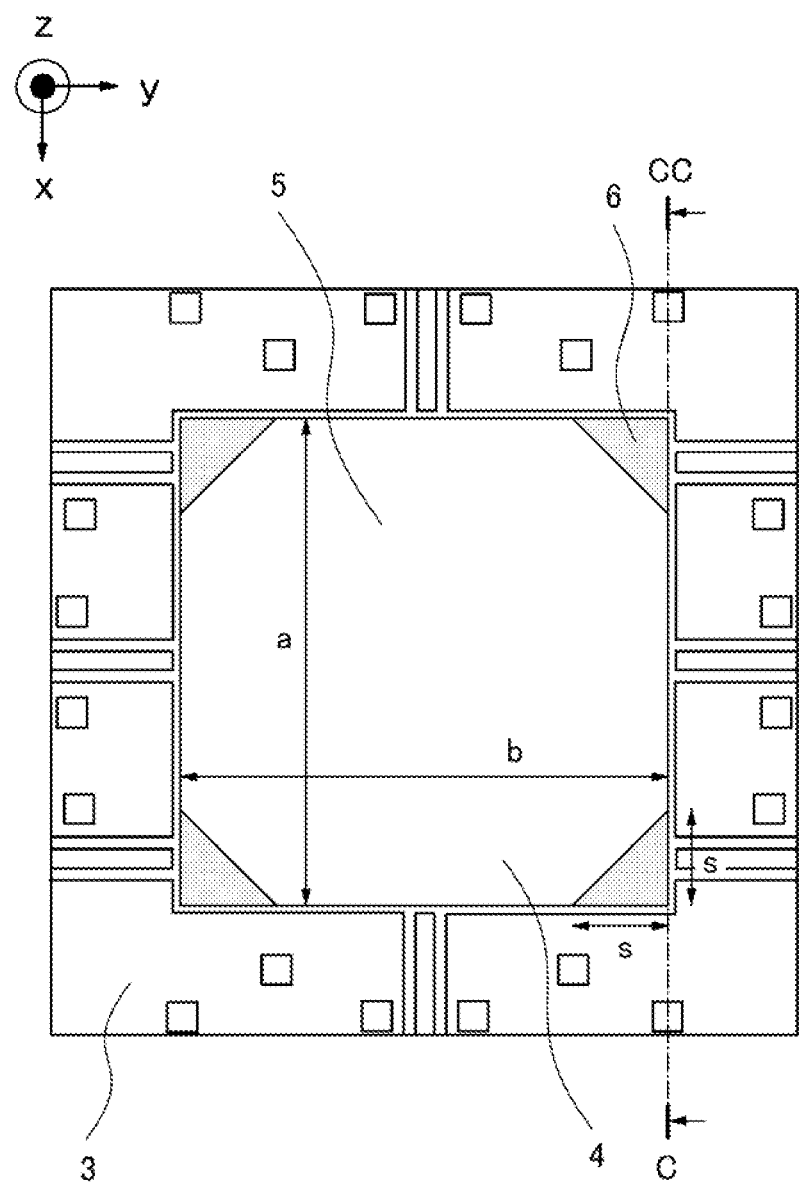
FIG. 10B is a top view of the sample holder of the first example embodiment.
Figure 10C:
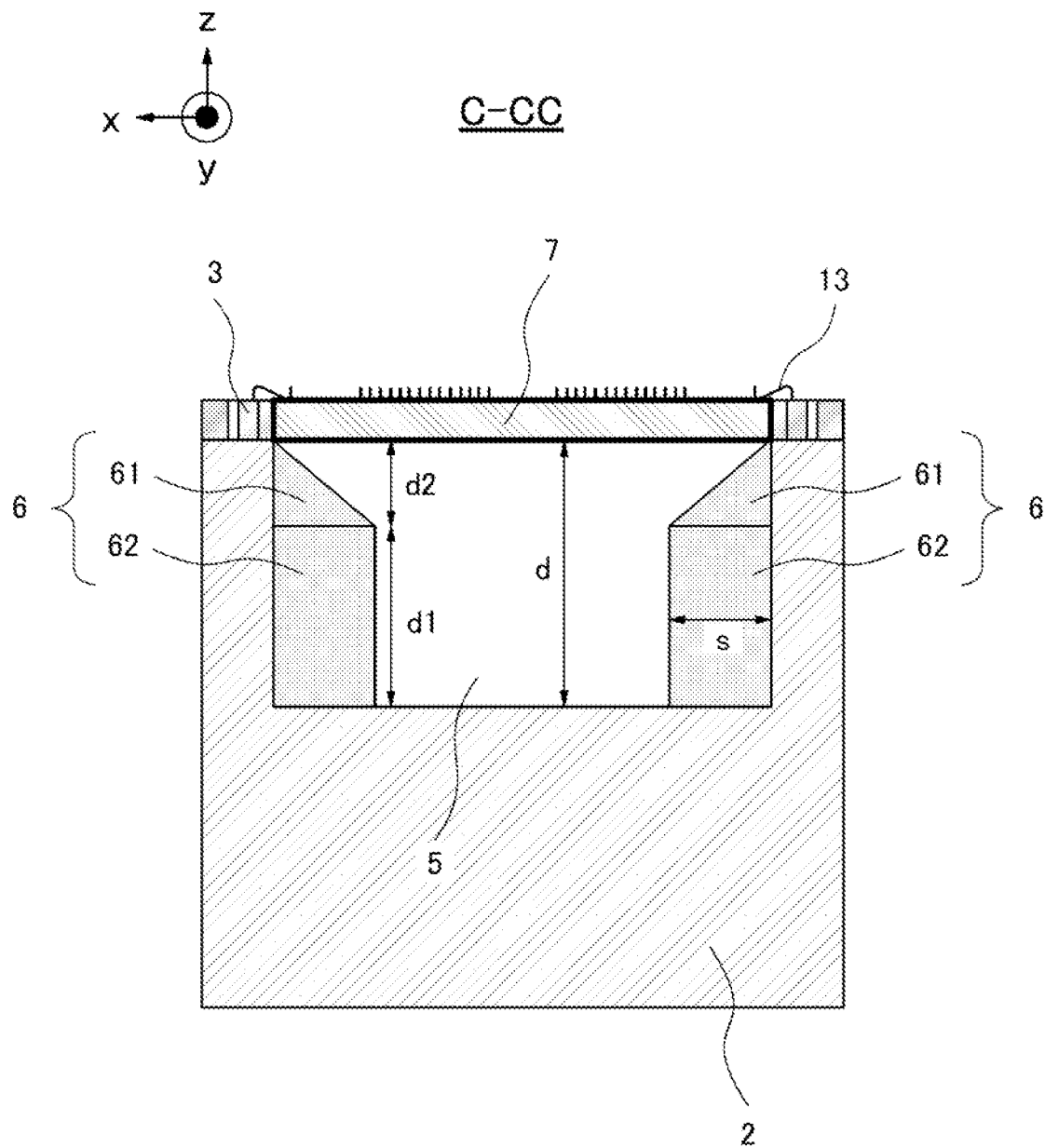
FIG. 10C is an end view in which the sample holder of the first example embodiment is cut with a plane parallel to the xz plane including a cutting line C-CC shown in FIG. 10B.

FIGS. 10A to 10C show enlarged views of the sample holder 1 of the first example embodiment near the through hole 4 of the PCB 3. FIG. 10A is a perspective view showing the sample holder 1 of the first example embodiment. FIG. 10B is a top view of the sample holder 1 of the first example embodiment. FIG. 10C is an end view in which the sample holder 1 of the first example embodiment is cut with a plane parallel to the xz plane including the cutting line C-CC shown in FIG. 10B. In FIG. 10C, a chip 7 is mounted with a bonding wire 13 on the sample holder 1 of the first example embodiment.

The sample holder 1 has the cavity 5 in at least a part of the base 2 below the through hole 4. In FIGS. 10A to 10C, the sample holder 1 has the cavity 5 in a section of the base 2 immediately below the through hole 4 of the PCB 3. In other words, in FIGS. 10A to 10C, the sample holder 1 has the cavity 5 in a section of the base 2 immediately below the chip 7 when the chip 7 is mounted on the sample holder 1 with the bonding wire 13. The shape of the cavity 5 is not particularly limited. For example, the bottom surface of the cavity 5 may be a flat surface or may be a surface other than a flat surface. The side surface of the cavity 5 may be a flat surface or may be a surface other than a flat surface. For example, there may be a recess or the like on the side surface of the cavity 5 or the bottom surface of the cavity 5. In FIGS. 10A to 10C, the cavity 5 has the shape of a quadrangular prism. More specifically, in FIGS. 10A to 10C, the cavity 5 has a quadrangular bottom surface where the lengths of the sides are a and b, and the cavity 5 has a quadrangular prism shape where the height is d. The cavity 5 has a support structure that supports the surface of the chip 7 and is conducted to the base. The material of the support structure is, for example, metal. Specifically, the material of the support structure may be, for example, a mixture containing metal such as a resin mixed with metal particles or a filler.

The shape of the support structure is not particularly limited. For example, in FIGS. 10A to 10C, the support structure may be a column 6. Although not illustrated, the support structure may be, for example, a protrusion extending from the side surface of the cavity 5. Alternatively, although not illustrated, the support structure may be three support points that are not linear, for example. Alternatively, although not illustrated, the support structure may be a structure extending from the bottom surface of the cavity 5 like a spiky frog.

Here, the column 6 shown in FIGS. 10A to 10C will be described as an example of the support structure. The number of the columns 6 and the shape of the columns 6 are not particularly limited. The same is true for the following example embodiments. In FIGS. 10A to 10C, a plurality of the columns 6 are provided in the cavity 5. More specifically, the columns 6 that are conductors are arranged at the four corners of the cavity 5.

In FIGS. 10A to 10C, in order to clearly show the columns 6, the columns 6 are indicated in a pattern different from that of the base 2. The cavity 5 in FIGS. 10A to 10C has the same structure as that of the cavity 105 in FIGS. 7A to 7C. That is, the lower bottom surfaces of the columns 6 at the four corners have a shape of an isosceles right triangle. The length of equal two sides (equal sides) of the lower bottom surface of the column 6 is s. The height of the column 6 is d. The columns 6 of the conductors at the four corners are in electrical contact with the base 2. The four conductor columns 6 shown in FIGS. 10A to 10C may be separate from the base 2. Alternatively, the columns 6 shown in FIGS. 10A to 10C may be made of the same material as that of the base 2. That is, the base 2 and the columns 6 may be integrated.

Here, effects of use of the column 6 will be described. If there is no column 6, there is a concern that the chip 7 falls in the cavity 5. The chip 7 and the PCB 3 are connected by the bonding wire. Therefore, there is a possibility that the chip 7 does not fall in the cavity 5 even without the column 6, but there is a concern that the chip 7 falls in the cavity 5 due to vibration or the like, or the chip 7 falls in the cavity 5 due to detachment of some of the bonding wires. Therefore, by providing the metal column 6, it is possible to prevent the chip 7 from falling in the cavity 5 and prevent the bonding wire from being detached. The metal column 6 can strengthen the thermal path between the chip 7 and the base 2. The chip 7 of the superconducting quantum circuit is cooled to about 10 [mK] (milli-Kelvin) by a cryocooler and operated. In general, the base 2 is in thermal contact with a cold stage of the cryocooler. The cold stage of the cryocooler is the coldest place of the cryocooler. That is, the base 2 has a very low temperature. The stronger the thermal path between the base 2 and the chip 7 is, in other words, the smaller the thermal resistance between the base 2 and the chip 7 is, the more the chip 7 is cooled. If the chip 7 is not cooled well, good performance of the quantum circuit formed in the chip 7 cannot be obtained, and thus it is desirable to cool the chip 7 to a temperature as low as possible. Therefore, the thermal resistance between the base 2 and the chip 7 is preferably as small as possible. The metal column 6 can reduce the thermal resistance between the base 2 and the chip 7.

The difference from the structure of the cavity 105 shown in FIGS. 7A to 7C is that, in the present example embodiment, at least a part of the upper surfaces of the columns 6 at the four corners, that is, the surface opposing the back surface of the chip 7 when the chip 7 is mounted on the sample holder 1, is not parallel to the back surface of the chip 7. In other words, in the present example embodiment, at least a part of the upper surfaces of the columns 6 at the four corners is not parallel to the upper surface of the base 2.

In FIG. 10C, the column 6 used in the sample holder 1 of the present example embodiment has a structure in which an upper section 61 and a lower section 62 are connected. The lower section 62 has a column shape. The lower section 62 has a prismatic shape. In FIGS. 10A to 10C, the lower section 62 has a triangular prism shape, and the bottom surface of the lower section 62 has a shape of an isosceles right triangle. The length of the equal two sides of this bottom surface is s, and the height of the lower section 62 is d1. The upper section 61 has a frustum shape. The bottom surface of the frustum having the smaller area is the through hole 4 side. In FIGS. 10A to 10C, the upper section 61 has a triangular pyramid shape, the bottom surface of the upper section 61 has a shape of an isosceles right triangle, and the height of the upper section 61 is d2. Here, d1+d2=d. For example, the bottom surface of the upper section 61 and the bottom surface of the lower section 62 have the same shapes and dimensions. In this structure, when the chip 7 is mounted on the sample holder 1, at least a part of the columns 6 at the four corners comes into contact with the back surface of the chip 7. This structure makes it possible to reduce the contact area between the back surface of the chip 7 and the column 6 of the conductor as compared with the sample holder 101 shown in FIGS. 7A to 7C.

Figure 11A:
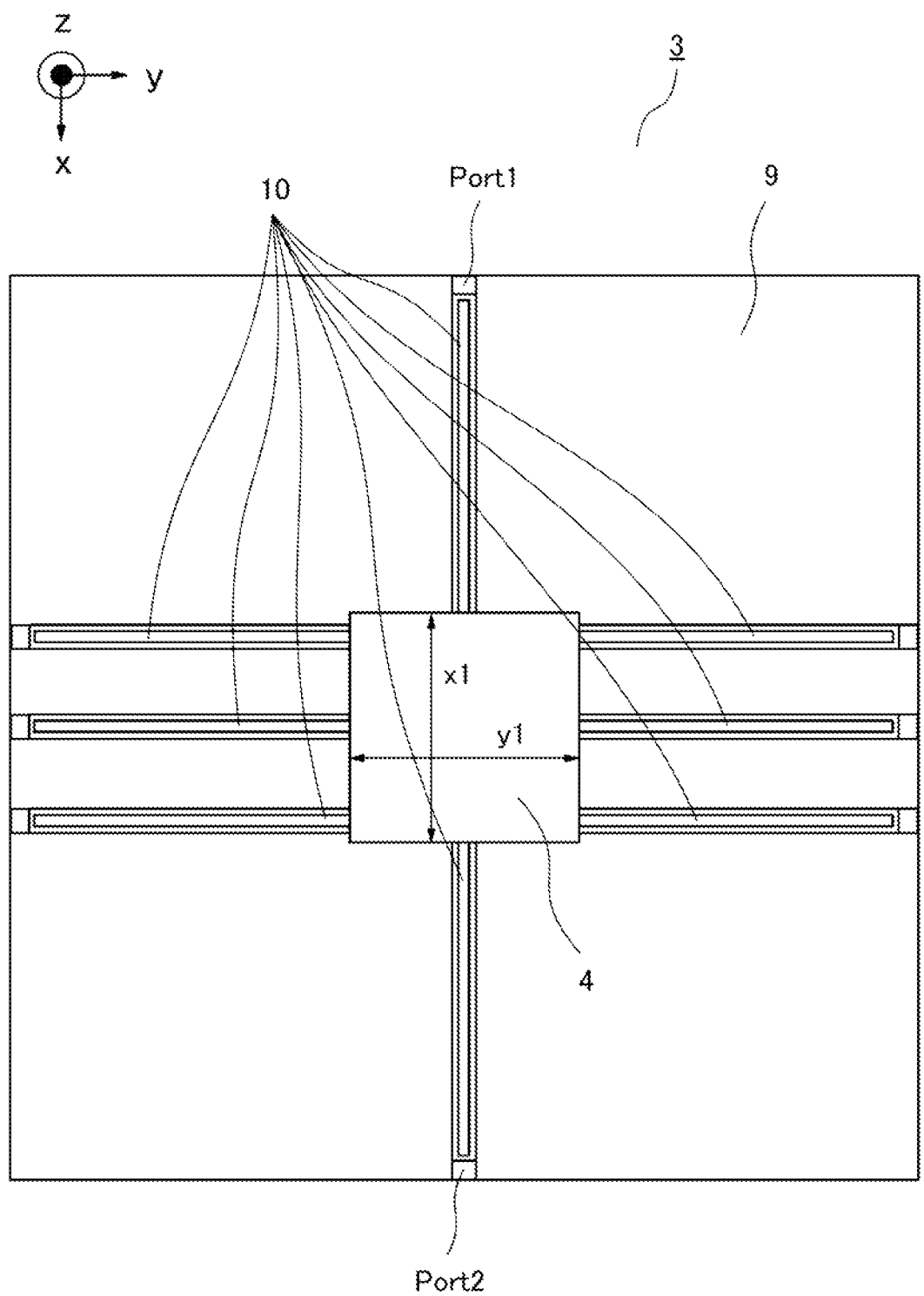
FIG. 11A is a top view of a PCB used in the sample holder of the first example embodiment.
Figure 11B:
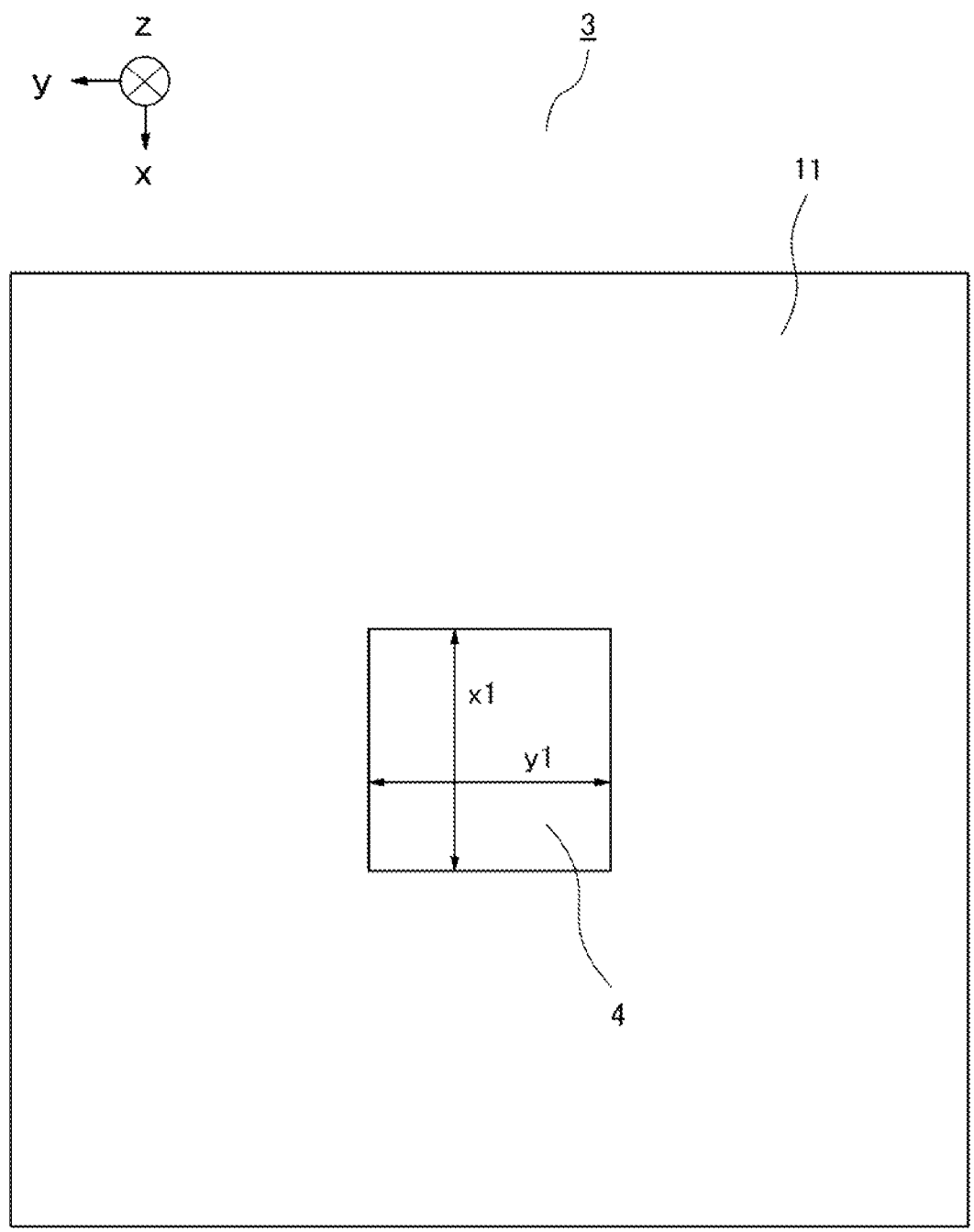
FIG. 11B is a bottom view of the PCB used in the sample holder of the first example embodiment.
Figure 11D:
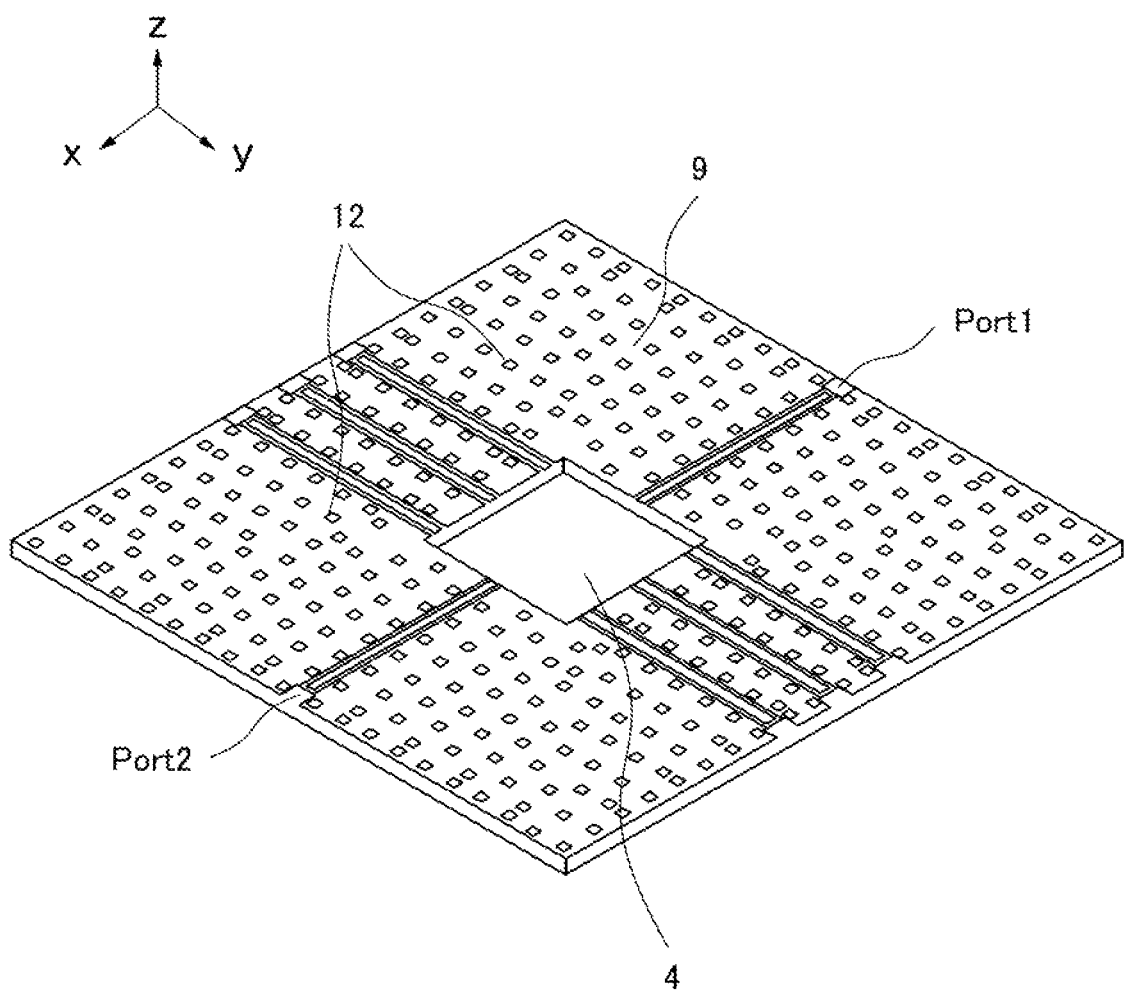
FIG. 11D is a perspective view of the PCB used in the sample holder of the first example embodiment.
Figure 11E:
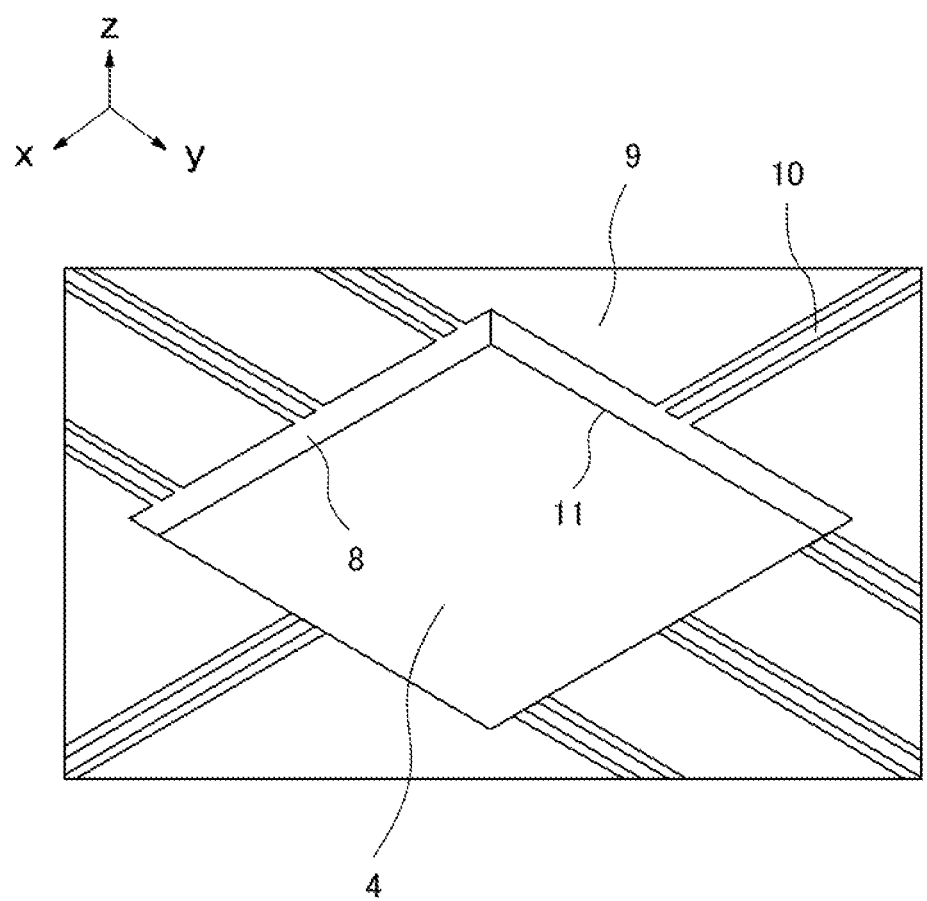
FIG. 11E is an enlarged view of the PCB used in the sample holder of the first example embodiment near the through hole.

FIG. 11A is a top view of the PCB 3 used in the sample holder 1 of the first example embodiment. FIG. 11B is a bottom view of the PCB 3 used in the sample holder 1 of the first example embodiment. FIG. 11C is a side view of the PCB 3 used in the sample holder 1 of the first example embodiment. FIG. 11D is a perspective view of the PCB 3 used in the sample holder 1 of the first example embodiment. FIG. 11E is an enlarged view of the PCB 3 used in the sample holder 1 of the first example embodiment near the through hole 4.

As shown in FIGS. 11A and 11E, the PCB 3 has a plate-shaped dielectric 8 extending parallel to the xy plane, for example. The PCB 3 has a structure in which a front-surface GND 9 and a core wire 10 of the coplanar waveguide are formed on one surface (front surface) of the dielectric 8. The PCB 3 has a structure in which a back-surface GND 11 is formed on the other surface (back surface) of the dielectric 8. The core wire 10, the front-surface GND 9, and the back-surface GND 11 are conductors that is, for example, metals. Examples of the metal include copper (Cu) and Cu plated with gold plating (Au plating). In FIG. 11A, eight coplanar waveguides are formed on the PCB 3. The coplanar waveguide is as described in FIG. 2A. However, the number of the coplanar waveguides formed on the PCB 3 is not particularly limited, and may be any number. As shown in FIG. 11D, the PCB 3 is provided with a plurality of through holes 12. These through holes 12 penetrate the dielectric 8 and electrically connect the front-surface GND 9 and the back-surface GND 11. The through hole 12 is produced, for example, by forming a hole that penetrates the dielectric 8, the front-surface GND 9, and the back-surface GND 11 and then plating the inside of the hole with metal.

In FIG. 9, the back-surface GND 11 of the PCB 3 is in contact with the base 2. Therefore, the metal base 2, the back-surface GND 11 of the PCB 3, the through hole 12 of the PCB 3, and the front-surface GND 9 of the PCB 3 are electrically connected. The through hole 4 is provided near the center of the PCB 3. This through hole 4 may have, for example, the same shape as that of the chip 7 of the superconducting quantum circuit mounted on the sample holder 1, that is, a rectangular shape or a square shape. In order to allow the chip 7 to enter the inside of the through hole 4, the area of the through hole 4 is larger than the area of the chip 7.

Figure 12:
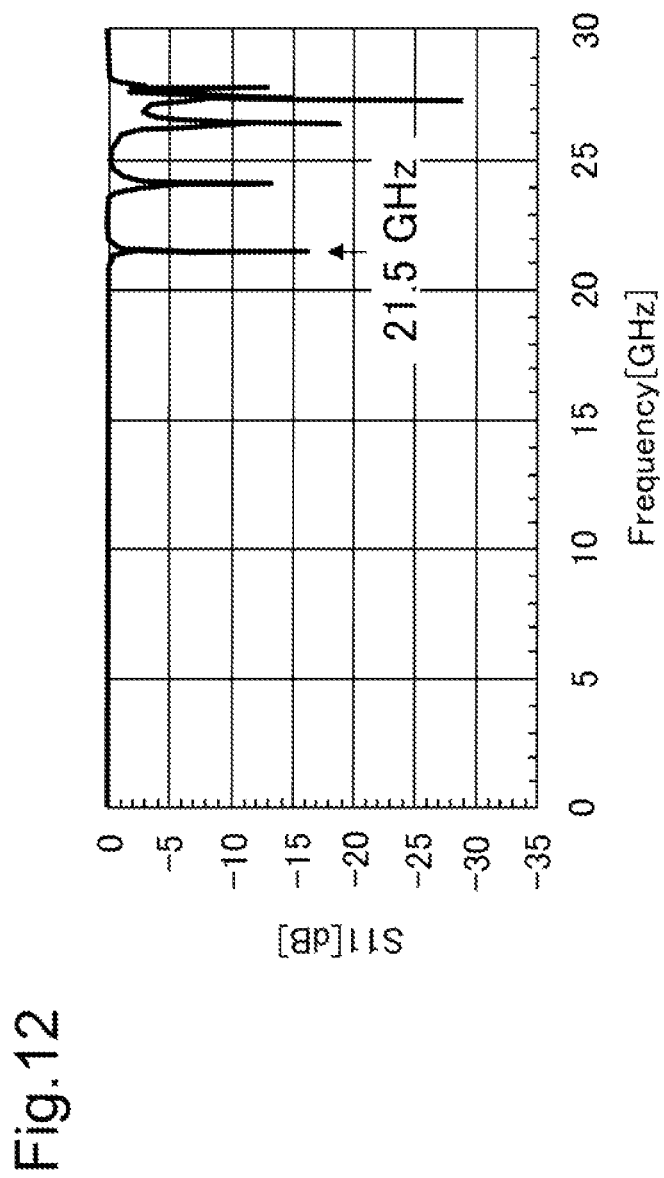
FIG. 12 is an explanatory diagram showing a simulation result of S11 in a case where the chip is mounted with the bonding wire on the sample holder according to the first example embodiment.

FIG. 12 shows a simulation result of S11 of the system in which the chip 7 is mounted with the bonding wire 13 on the sample holder 1 of the first example embodiment shown in FIG. 9. Here, as described above, S11 is reflection to Port 1 in a case where a high-frequency signal is input from Port 1 shown in FIG. 11A. FIG. 12 is an explanatory diagram showing a simulation result of S11 in a case where the chip 7 is mounted with the bonding wire 13 on the sample holder 1 according to the first example embodiment. In the simulation in FIG. 12, a=5 [mm], b=5 [mm], d=3 [mm], d1=2 [mm], d2=1 [mm], and s=1 [mm].

As shown in FIG. 12, the lowest resonance frequency of the chip mode is 21.5 [GHz]. Therefore, as in FIG. 12, the lowest resonance frequency of the chip mode can be made higher than that in the simulation result shown in FIG. 8 where the simulation is performed using the sample holder 101 shown in FIGS. 7A to 7C.

Figure 13A:
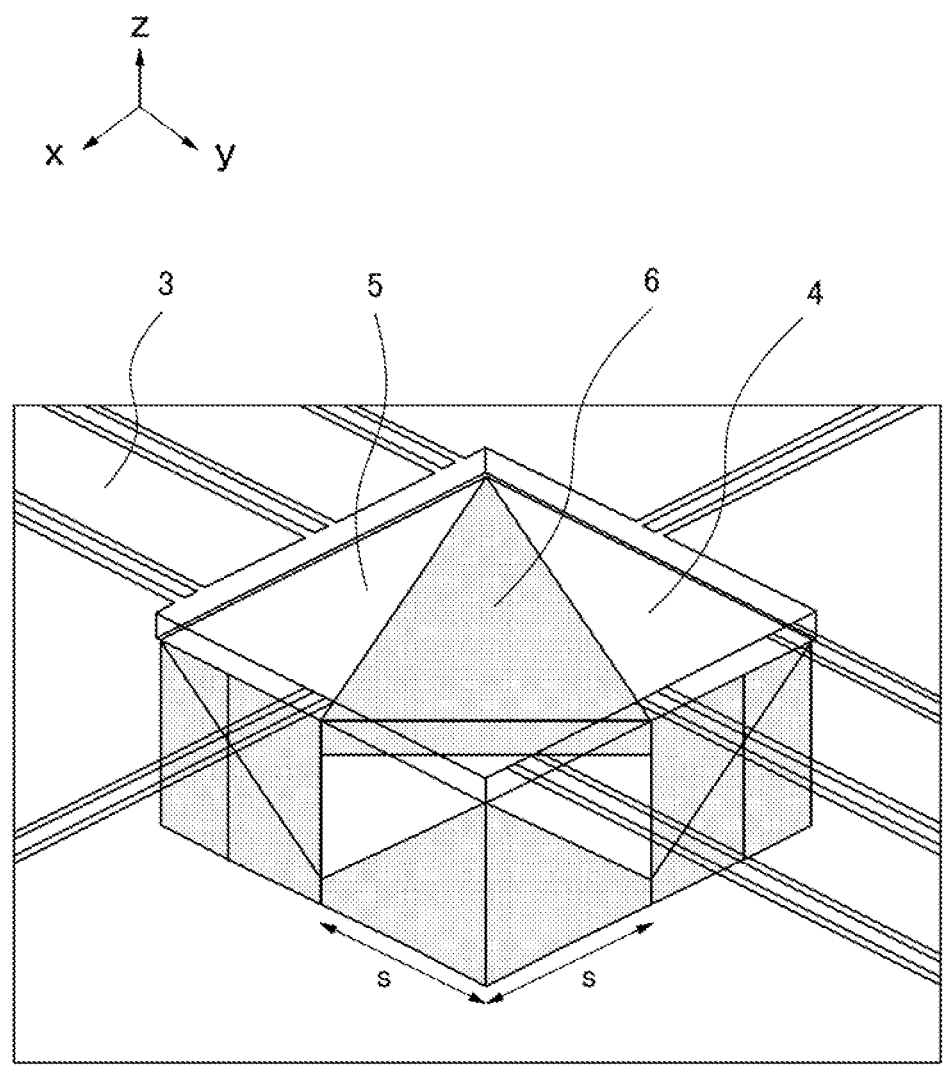
FIG. 13A is a perspective view of a sample holder according to another example of the first example embodiment.
Figure 13B:
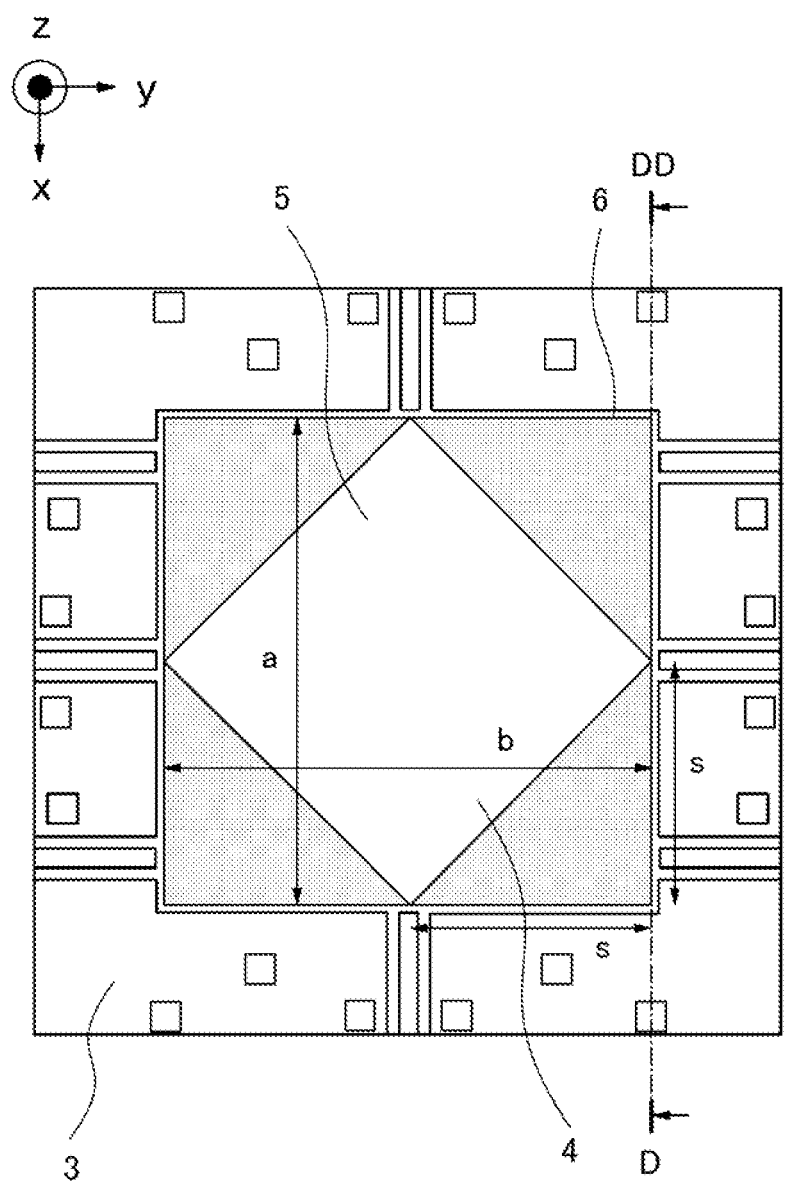
FIG. 13B is a top view of a sample holder according to the another example of the first example embodiment.
Figure 13C:
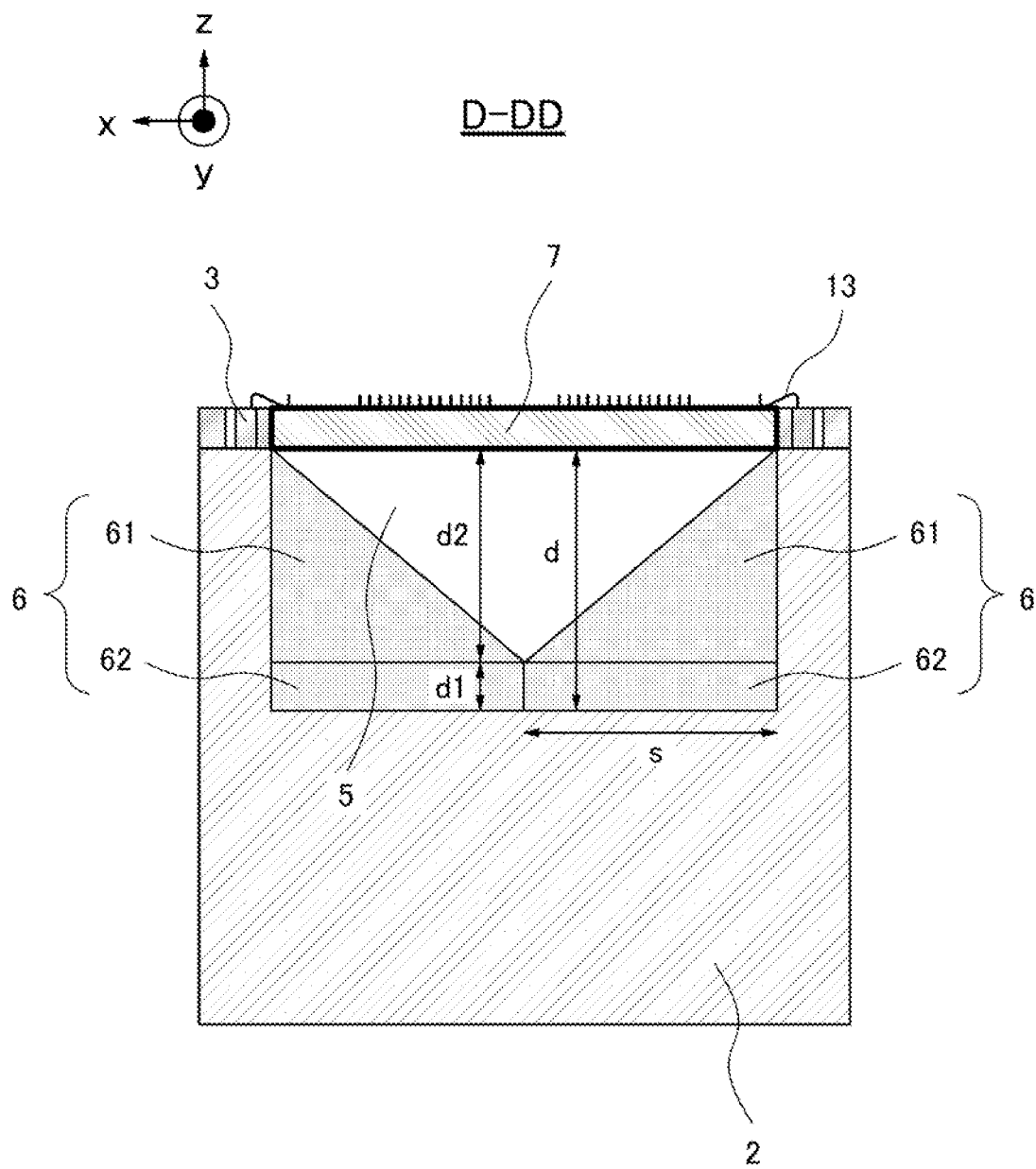
FIG. 13C is an end view in which the sample holder according to the another example of the first example embodiment is cut with a plane parallel to the xz plane including a cutting line D-DD shown in FIG. 13B.

The reason why the resonance frequency of the chip mode can be further increased by using the sample holder 1 of the first example embodiment is considered to be as follows. In the example of the sample holder 101 shown in FIGS. 7A to 7C, the electric field of the standing wave generated when resonance of the chip mode occurs spreads mainly in the silicon substrate and in the cavity 105 (vacuum) provided in the base 102. In the part immediately above the columns 106 at the four corners, the space sandwiched between the GND plane 73 on the front surface of the chip 107 and the columns 106 is only silicon, and the electric field cannot spread in vacuum. Therefore, the effective permittivity is high in the section immediately above the columns 106 at the four corners. On the other hand, in the case of the sample holder 1 of the first example embodiment, at least a part of the upper surfaces of the columns 6 at the four corners is not parallel to the back surface of the chip 7. Due to this, in the section immediately above the columns 6 at the four corners, the space sandwiched between the GND plane 73 on the front surface of the chip 7 and the columns 6 becomes silicon and vacuum, and therefore the electric field can also spread in vacuum in this section. Therefore, it is considered that the effective permittivity in the section immediately above the columns 6 at the four corners becomes lower than that of the sample holder 101 shown in FIGS. 7A to 7C. As another example of the first example embodiment, FIGS. 13A to 13C show a case where the thickness s of the columns 6 at the four corners is made larger than that in FIGS. 10A to 10C. FIG. 13A is a perspective view of a sample holder 1 according to another example of the first example embodiment. FIG. 13B is a top view of the sample holder 1 according to the another example of the first example embodiment. FIG. 13C is an end view in which the sample holder 1 according to the another example of the first example embodiment is cut with a plane parallel to the xz plane including the cutting line D-DD shown in FIG. 13B. In FIG. 13C, the chip 7 is mounted on the sample holder 1 according to another example of the first example embodiment.

Figure 14:
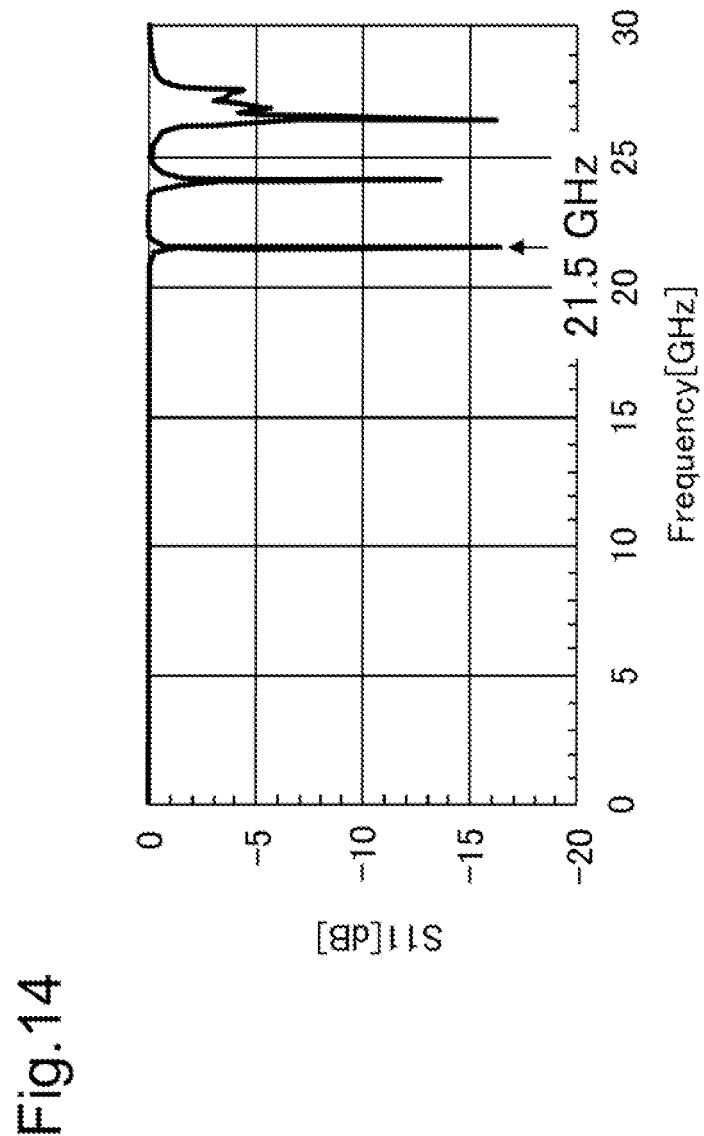
FIG. 14 is an explanatory diagram showing a simulation result of S11 according to the another example of the first example embodiment.

FIG. 14 shows a simulation result of S11 where the chip 7 is mounted with the bonding wire 13 on the sample holder 1 using the base 2 in which the cavity 5 of FIGS. 13A to 13C is formed.

FIG. 14 is an explanatory diagram showing a simulation result of S11 according to the another example of the first example embodiment. In the simulation, a=5 [mm], b=5 [mm], d=3 [mm], d1=0.5 [mm], d2=2.5 [mm], and s=2.5 [mm]. As shown in FIG. 14, the lowest resonance frequency of the chip mode is 21.5 [GHz]. Therefore, as in FIG. 14, the lowest resonance frequency of the chip mode can be made higher than that in the simulation result shown in FIG. 8 where the simulation is performed using the sample holder 101 shown in FIGS. 7A to 7C.

Modification of First Example Embodiment

In the modification of the first example embodiment, the upper surfaces of the upper section 61 of the columns 6 at the four corners of the cavity 5, that is, a part of the front surface opposing the back surface of the chip 7 when the chip 7 is mounted with the bonding wire 13 on the sample holder 1, is not parallel to the back surface of the chip 7, but a part is parallel to the back surface of the chip 7.

Figure 15A:
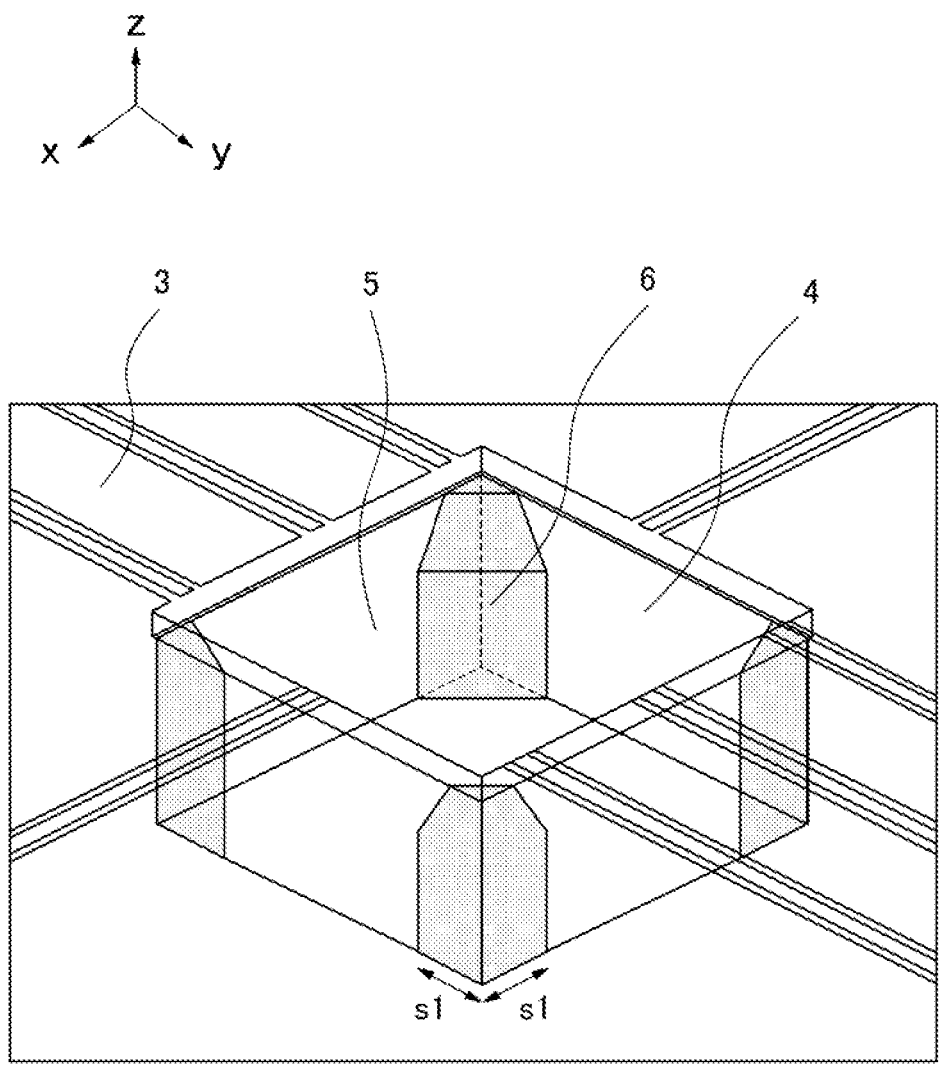
FIG. 15A is a perspective view of the sample holder according to a modification of the first example embodiment.
Figure 15B:
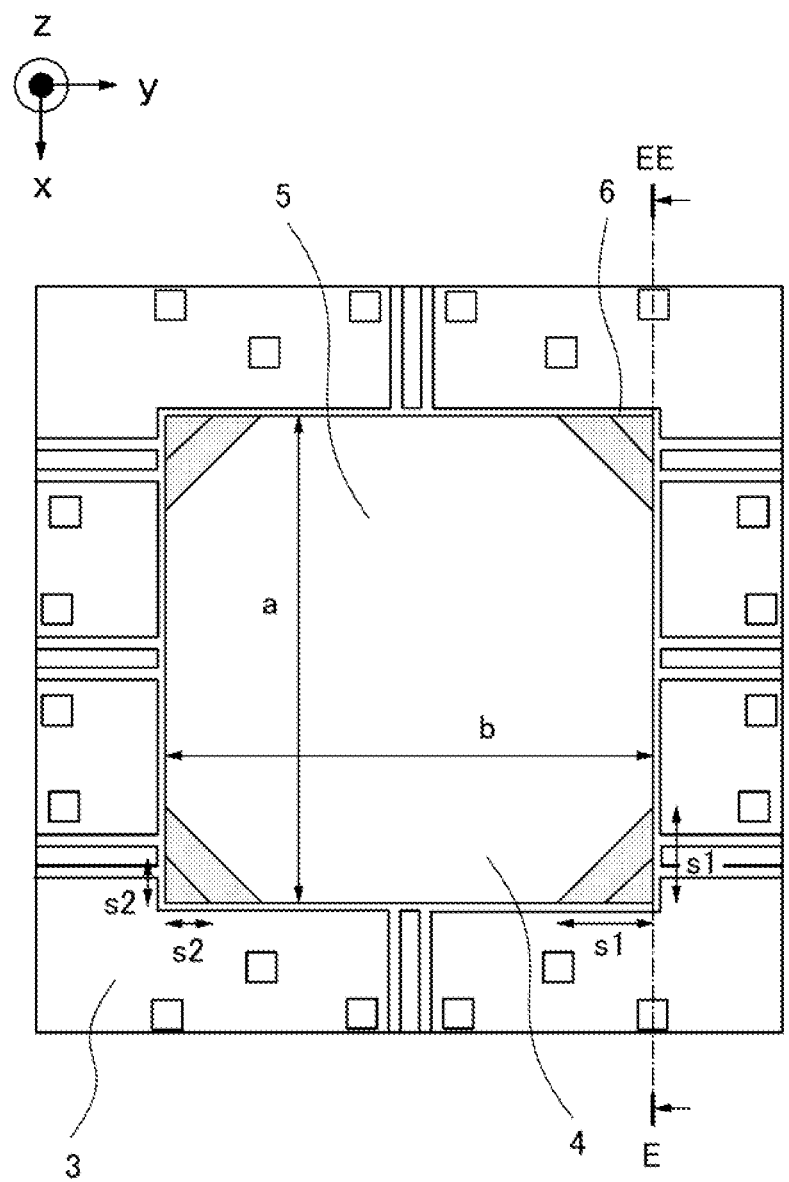
FIG. 15B is a top view of the sample holder according to the modification of the first example embodiment.
Figure 15C:
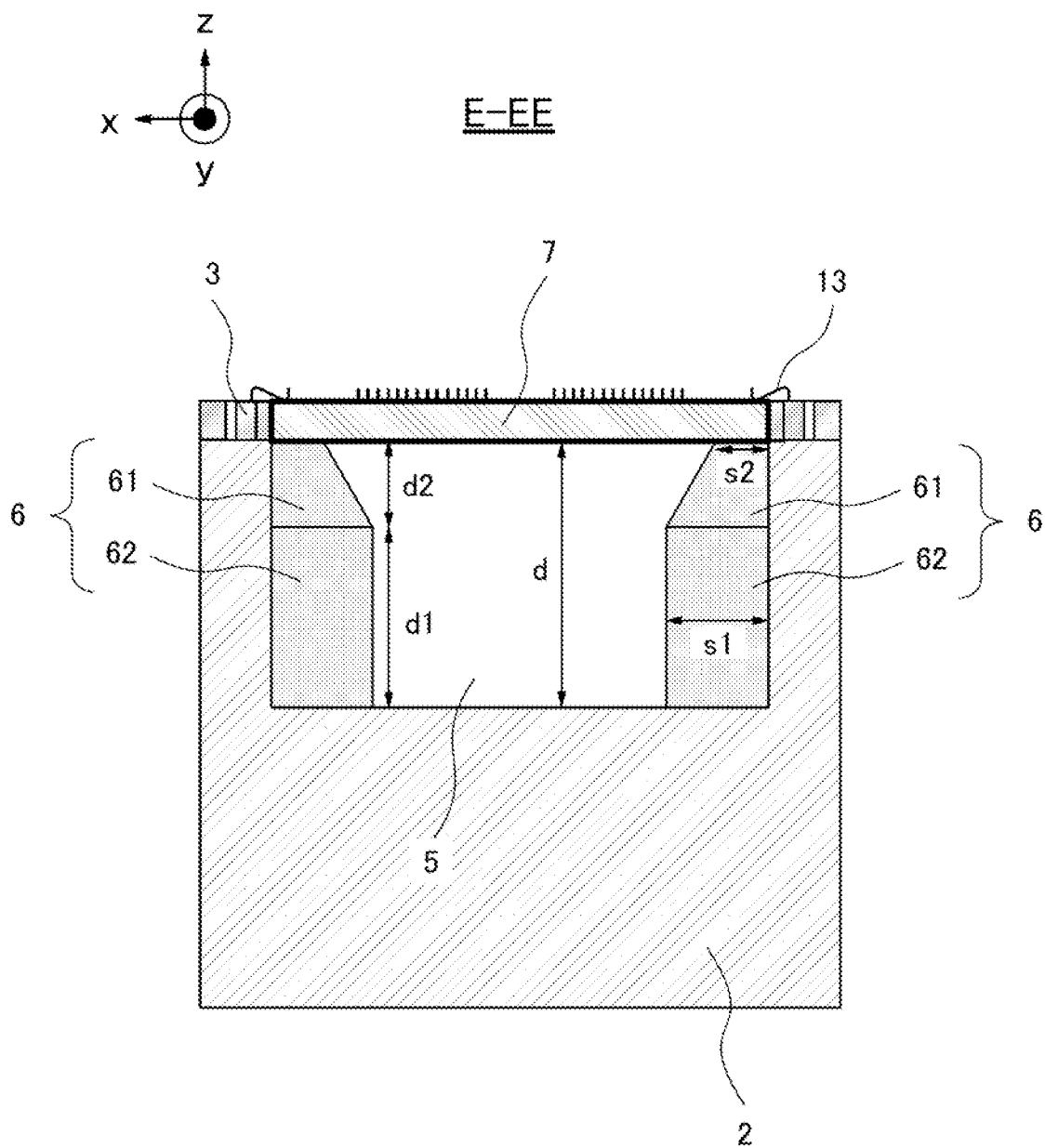
FIG. 15C is an end view in which the sample holder according to the modification of the first example embodiment is cut with a plane parallel to the xz plane including a cutting line E-EE shown in FIG. 15B.

FIG. 15A is a perspective view of the sample holder 1 according to a modification of the first example embodiment. FIG. 15B is a top view of the sample holder 1 according to the modification of the first example embodiment. FIG. 15C is an end view in which the sample holder 1 according to the modification of the first example embodiment is cut with a plane parallel to the xz plane including the cutting line E-EE shown in FIG. 15B. In FIGS. 15A to 15C, the upper surface of the upper section 61 of the columns 6 at the four corners of the cavity 5, that is, a part of the front surface opposing the back surface of the chip 7 of the surface of the base 2 forming the cavity 5 when the chip 7 is mounted with the bonding wire 13 on the sample holder 1, is not parallel to the back surface of the chip 7, but a part is parallel to the back surface of the chip 7. In other words, at least a part of the upper surface of the upper section 61 of the columns 6 at the four corners is not parallel to the upper surface of the base 2, but a part is parallel to the upper surface of the base 2. Similarly to the case of 10A to 10C and 13A to 13C, the lower section 62 of the column 6 has a triangular prism shape, the bottom surface of the lower section 62 is an isosceles right triangle, and the length of the equal two sides is s1.

On the other hand, the upper section 61 of the column 6 has a triangular frustum shape, the lower bottom surface of the upper section 61 is an isosceles right triangle, and the length of the equal two sides is s1, but the upper bottom surface of the upper section 61 is an isosceles right triangle, and the length of the equal two sides is s2. Here, s1>s2. The height of the lower section 62 of the column 6 is d1, and the height of the upper section 61 is d2. In this structure, when the chip 7 is mounted on the sample holder 1, at least a part of the columns 6 at the four corners comes into contact with the back surface of the chip 7. This structure makes it possible to reduce the contact area between the back surface of the chip 7 and the column 6 of the conductor as compared with the sample holder 101 shown in FIGS. 7A to 7C. However, in the sample holder 1 shown in FIGS. 15A to 15C, the contact area between the back surface of the chip 7 and the column 6 of the conductor becomes larger than that in the case of FIGS. 10A to 10C and FIGS. 13A to 13C.

Figure 16:
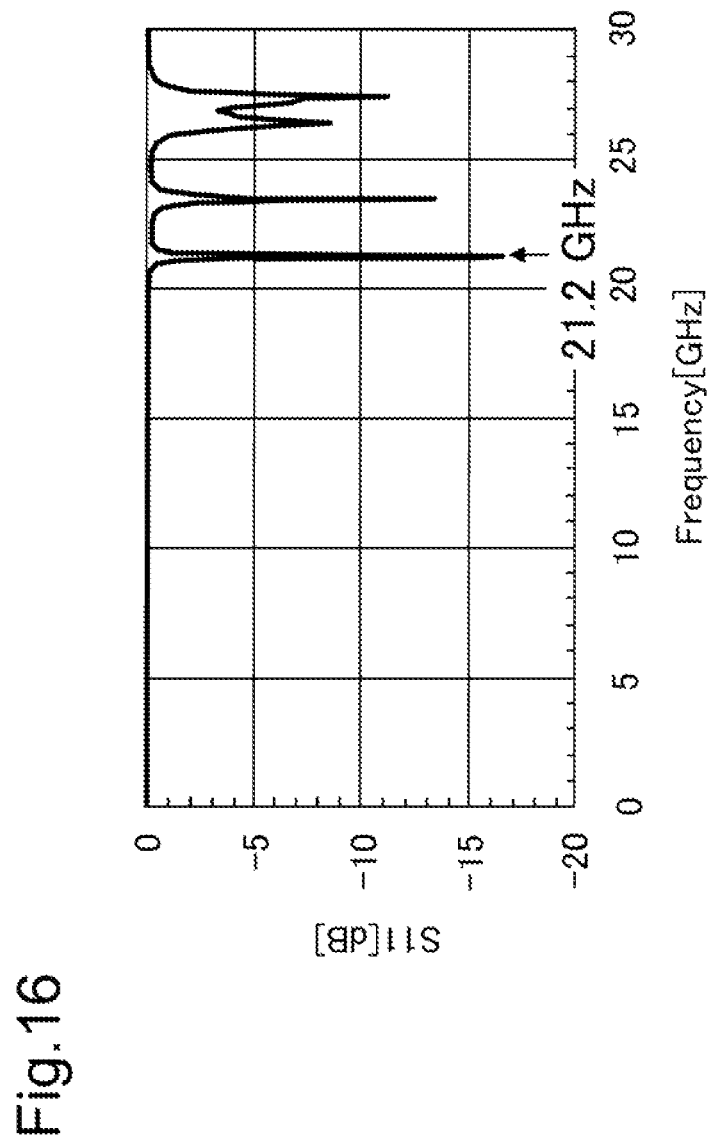
FIG. 16 is an explanatory diagram showing a simulation result of S11 in a case where the chip is mounted on the sample holder using the base in which the cavity is formed, of FIGS. 15A to 15C.

FIG. 16 is an explanatory diagram showing a simulation result of S11 in a case where the chip 7 is mounted on the sample holder 1 using the base 2 in which the cavity 5 is formed, of FIGS. 15A to 15C. In the simulation, a=5 [mm], b=5 [mm], d=3 [mm], d1=2 [mm], d2=1 [mm], s1=1 [mm], and s2=0.5 [mm]. As shown in FIG. 16, the lowest resonance frequency of the chip mode is 21.2 [GHz]. As shown in FIG. 16, according to the modification of the first example embodiment, the lowest resonance frequency of the chip mode can be made higher than that in the simulation result shown in FIG. 8 where the simulation is performed using the sample holder 101 shown in FIGS. 7A to 7C. Thus, the first example embodiment achieves the effect that the simulation result can be made higher than the simulation result shown in FIG. 8 where simulation is performed using the sample holder 101 shown in FIGS. 7A to 7C even if a part of the upper surface of the upper section 61 of the columns 6 at the four corners is made parallel to the back surface of the chip 7.

In the first example embodiment and the modification of the first example embodiment, for example, the chip 7 mounted on the sample holder 1 has a rectangular shape, and the length of the short side of the chip 7 is v, and the length of the long side of the chip 7 is w. In such a case, in the cavity 5 shown in FIGS. 10A to 10C, the cavity 5 shown in FIGS. 13A to 13C, and the cavity 5 shown in FIGS. 15A to 15C, it is preferable that a<b, a is v or more, and b is w or more. In a case otherwise, there is a concern that the contact area between the back surface of the chip 7 and the base 2 increases, and the resonance frequency of the chip mode decreases. In this case, the through hole 4 of the PCB 3 used in the first example embodiment and the modification of the first example embodiment is preferably rectangular, and when the length of the short side of the through hole 4 of the PCB 3 is x1 and the length of the long side of the through hole 4 is y1, it is necessary that v<x1 and w<y1 because the chip 7 needs to enter the inside of the through hole 4. Since the shorter x1 and y1 are, the higher the resonance frequency of the chip mode can be made, x1 is preferably 1.2 v or less, and more preferably 1.1 v or less. For the same reason, b is preferably 1.2 w or less, and more preferably 1.1 w or less.

On the other hand, when the chip 7 mounted on the sample holder 1 has a square shape and the length of one side of the chip 7 is v, a=b is preferable in the cavity 5 of FIGS. 10A to 10C, FIGS. 13A to 13C, and FIGS. 15A to 15C, and a is preferably v or more. In this case, the through hole 4 of the PCB 3 used in the first example embodiment and the modification of the first example embodiment is preferably square. In a case where the length of one side of the through hole 4 of the PCB 3 is x1, the chip 7 needs to enter the inside of the through hole 4, and therefore v<x1 is required. Since the shorter x1 is, the higher the resonance frequency of the chip mode can be made, x1 is preferably 1.2 v or less, and more preferably 1.1 v or less.

According to the simulation, the larger the height d of the cavity 5 is made, the higher the resonance frequency of the chip mode becomes, but when d is increased to some extent, the resonance frequency of the chip mode hardly changes even if d is further increased. Therefore, in the first example embodiment, in a case where the thickness of the chip 7 mounted on the sample holder 1 is t, the height d of the cavity 5 shown in FIGS. 10A to 10C is preferably 2 t or more, more preferably 3 t or more, and still more preferably 5 t or more. In the first example embodiment and the modification of the first example embodiment, there is an effect of increasing the resonance frequency of the chip mode when d2 is larger than 0. Therefore, d2 is preferably larger than 0 and less than or equal to d. When d2=d, d1=0, and in this case, the column 6 includes only the upper section 61. In the first example embodiment, in a case where the chip 7 mounted on the sample holder 1 is a rectangle and the length of the short side of the chip 7 is v, s is preferably 0.1 v or more and 0.5 v or less. When the chip 7 mounted on the sample holder 1 is a square and the length of one side of the chip 7 is v, s is preferably 0.1 v or more and 0.5 v or less. Similarly, in the modification of the first example embodiment, in a case where the chip 7 mounted on the sample holder 1 is a rectangle and the length of the short side of the chip 7 is v, s1 is preferably 0.1 v or more and 0.5 v or less. When the chip 7 mounted on the sample holder 1 is a square and the length of one side of the chip 7 is v, s1 is preferably 0.1 v or more and 0.5 v or less. In the modification of the first exemplary example embodiment, s2 is only required to satisfy s2<s1. In the first example embodiment and the modification of the first example embodiment, there is an effect of increasing the resonance frequency of the chip mode when d2 is larger than 0. Therefore, d2 is preferably larger than 0 and less than or equal to d. When d2=d, d1=0, and in this case, the column 6 includes only the upper section 61.

In the first example embodiment and the modification of the first example embodiment, the shape of the lower section 62 of the column 6 is a triangular prism having a bottom surface of an isosceles right triangle, and the shape of the upper section 61 is a triangular pyramid, but the shapes of the lower section 62 and the upper section 61 of the column 6 are not particularly limited. Unless at least a part of the upper surface of the upper section 61, that is, the surface of the upper section 61 opposing the back surface of the chip 7, is parallel to the back surface of the chip 7 or the upper surface of the base 2, the effects described in the first example embodiment and the modification of the first example embodiment are obtained.

Second Example Embodiment

The second example embodiment will be described in detail with reference to the drawings. Hereinafter, description of the content overlapping with the above description will be omitted to the extent that the description of the second example embodiment does not become unclear.

The sample holder 1 of the second example embodiment has a configuration in which the PCB 3 is placed on the metal base 2 as shown in FIG. 9. In the second example embodiment, similarly to the first example embodiment, the PCB 3 shown in FIGS. 11A to 11E is used. In the second example embodiment, the sample holder 1 has the cavity 5 in a section of the base 2 immediately below the through hole 4 of the PCB 3. In other words, the sample holder 1 has the cavity 5 in a section of the base 2 immediately below the chip 7 when the chip 7 is mounted on the sample holder 1. In the second example embodiment, the cavity 5 has a shape in which the column and the frustum are combined, and the bottom surface having the narrower area of the frustum and the upper bottom surface of the column have the same shape. For example, the bottom surface of the frustum having the larger area is the through hole 4 side. As an example of the frustum of the cavity 5, a prismoid will be described as an example. As an example of the column of the cavity 5, a prism will be described as an example.

Figure 17A:
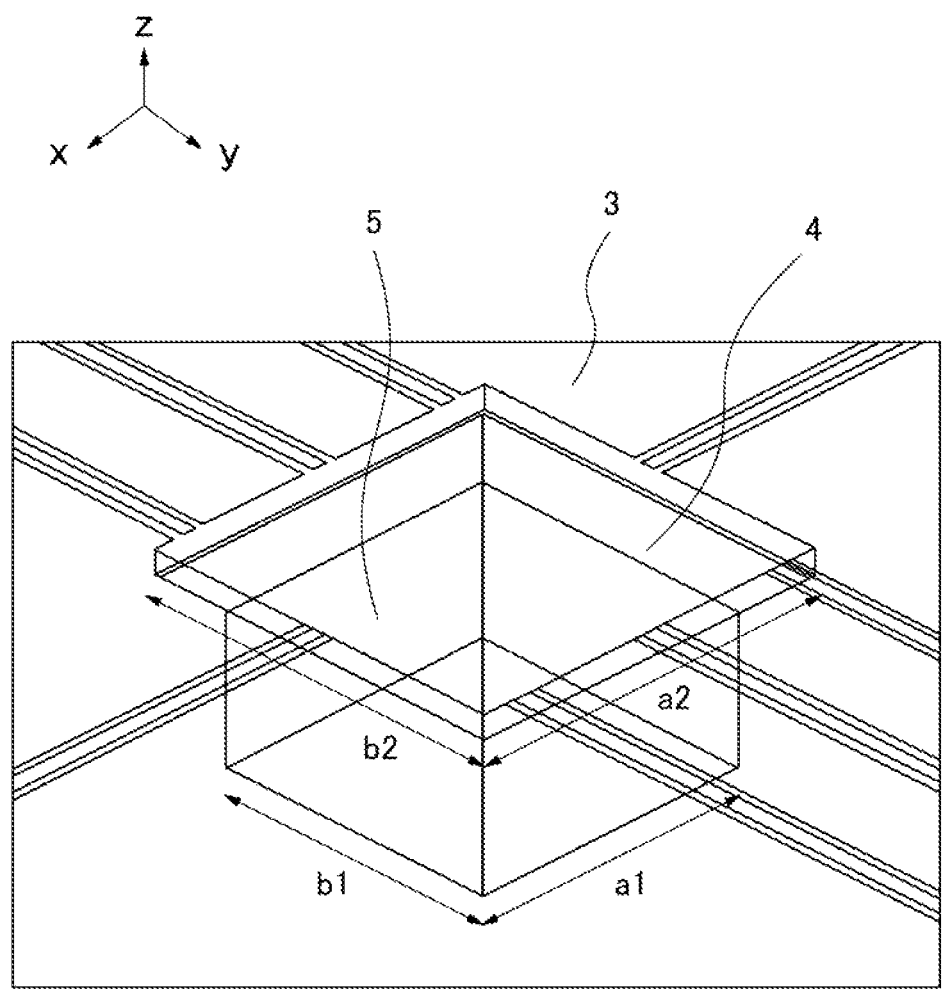
FIG. 17A is a perspective view of the sample holder according to a second example embodiment.
Figure 17B:
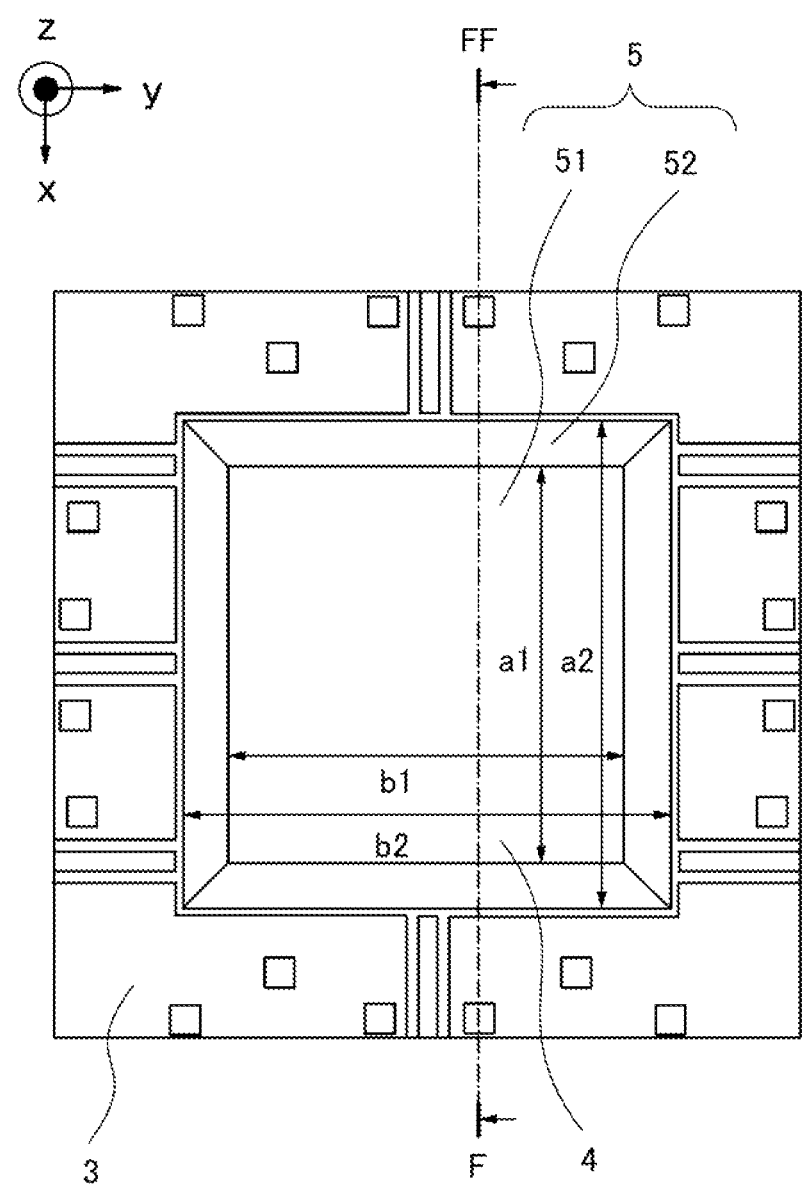
FIG. 17B is a top view of the sample holder according to the second example embodiment.
Figure 17C:
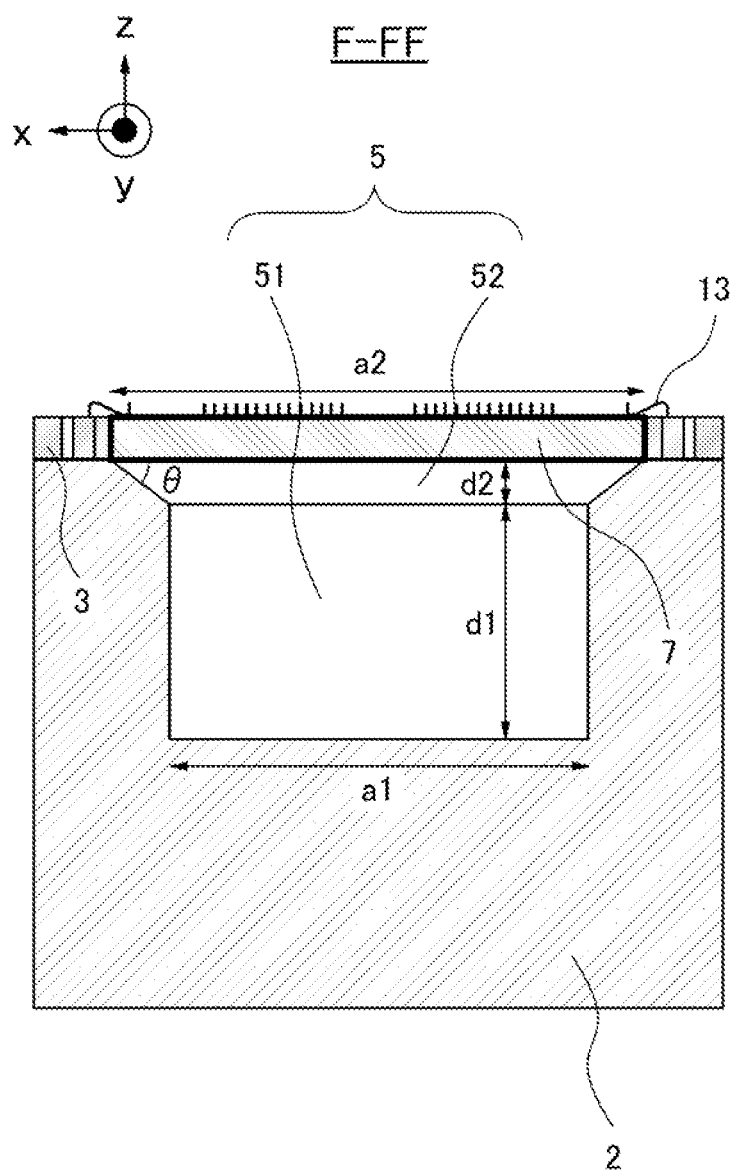
FIG. 17C is an end view in which the sample holder according to the second example embodiment is cut with a plane parallel to the xz plane including a cutting line F-FF shown in FIG. 17B.

The sample holder 1 according to the second example embodiment is shown in FIGS. 17A to 17C. FIG. 17A is a perspective view of the sample holder 1 according to the second example embodiment. FIG. 17B is a top view of the sample holder 1 according to the second example embodiment. FIG. 17C is an end view in which the sample holder 1 according to the second example embodiment is cut with a plane parallel to the xz plane including the cutting line F-FF shown in FIG. 17B. In FIG. 17C, the chip 7 is mounted with the bonding wire 13 on the sample holder 1 according to the second example embodiment.

As shown in FIGS. 17B and 17C, the cavity 5 formed in the base 2 in the second example embodiment has a structure in which a prismatic section 51, which is a prism, and a prismoid section 52, which is a prismoid, are connected. In FIGS. 17B and 17C, the bottom surface of the prismatic section 51 and the bottom surface of the prismoid section 52 having the smaller area are connected. Therefore, the bottom surface of the prismatic section 51 and the bottom surface of the prismoid section 52 having the smaller area have the same shape and the same area. The bottom surface of the prismoid section 52 having the larger area is the through hole 4 side.

In FIGS. 17A to 17C, the prismatic section 51 has a quadrangular bottom surface whose sides have the lengths a1 and b1 and a quadrangular prism shape having the height d1. In FIGS. 17A to 17C, the prismoid section 52 is a quadrangular prismoid.

Here, for example, lengths of sides of the chip 7 and the prismatic section 51 in a case where the chip 7 mounted on the sample holder 1 has a rectangular shape will be described. In a case where the length of the short side of the chip 7 is v and the length of the long side of the chip 7 is w, it is preferable that a1<b1 in the prismatic section 51, and a1 is smaller than v and b1 is smaller than w.

On the other hand, when the chip 7 mounted on the sample holder 1 has a square shape and the length of one side of the chip 7 is v, a1=b1 is preferable in the prismatic section 51, and a1 is preferably smaller than v.

In FIGS. 17A to 17C, in the prismoid section 52, the bottom surface of the two bottom surfaces that has the smaller area has a quadrangular shape in which the lengths of the sides are a1 and b1. In FIGS. 17A to 17C, the bottom surface having the larger area of the prismoid section 52 has a quadrangular shape in which the lengths of the sides are a2 and b2.

Here, assume that the chip 7 mounted on the sample holder 1, for example, has a rectangular shape, and the length of the short side of the chip 7 is v and the length of the long side of the chip 7 is w. In such a case, it is preferable that a2<b2 in the prismoid section 52, a2 is v or more and 1.5 v or less, and b2 is w or more and 1.5 w or less.

On the other hand, when the chip 7 mounted on the sample holder 1 has a square shape and the length of one side of the chip 7 is v, a2=b2 is preferable in the prismoid section 52, and a2 is preferably v or more and 1.5 v or less. The height of the prismoid section 52 is d2. The cavity 5 formed in the base 2 of the sample holder 1 of the present example embodiment has a structure in which the prismoid section 52 is connected above the prismatic section 51, and the upper bottom surface of the prismatic section 51 and the lower bottom surface of the prismoid section 52 are the same plane. Here, the lower bottom surface of the prismoid section 52 is a bottom surface having the smaller area of the two bottom surfaces of the prismoid section 52.

A feature of the sample holder 1 of the second example embodiment is that the prismoid section 52 is provided on the upper side of the cavity 5, so that at least a part of the surface of the base 2 opposing the back surface of the chip 7 when the chip 7 is mounted on the sample holder 1 is not parallel to the back surface of the chip 7. In FIGS. 17A to 17C, this part refers to the side surface of the prismoid section 52. As shown in FIG. 17C, the angle formed by a part not parallel to the back surface of the chip 7 in the side surface of the prismoid section 52, that is, the surface opposing the back surface of the chip 7 when the chip 7 is mounted on the sample holder 1 and the back surface of the chip 7 is θ. In other words, the angle formed by the side surface of the prismoid section 52 and the upper surface of the base 2 is defined as θ. For example, θ is a range in which a part not parallel to the back surface of the chip 7 is formed on the side surface of the prismoid section 52. For example, θ is less than 90 degrees. In the structure of the sample holder 1 of the second example embodiment, when the chip 7 is mounted on the sample holder 1, at least a part of the base 2 comes into contact with the back surface of the chip 7. This structure makes it possible to reduce the contact area between the back surface of the chip 7 and the base 2 as compared with the sample holder 101 shown in FIGS. 7A to 7C.

Figure 18:
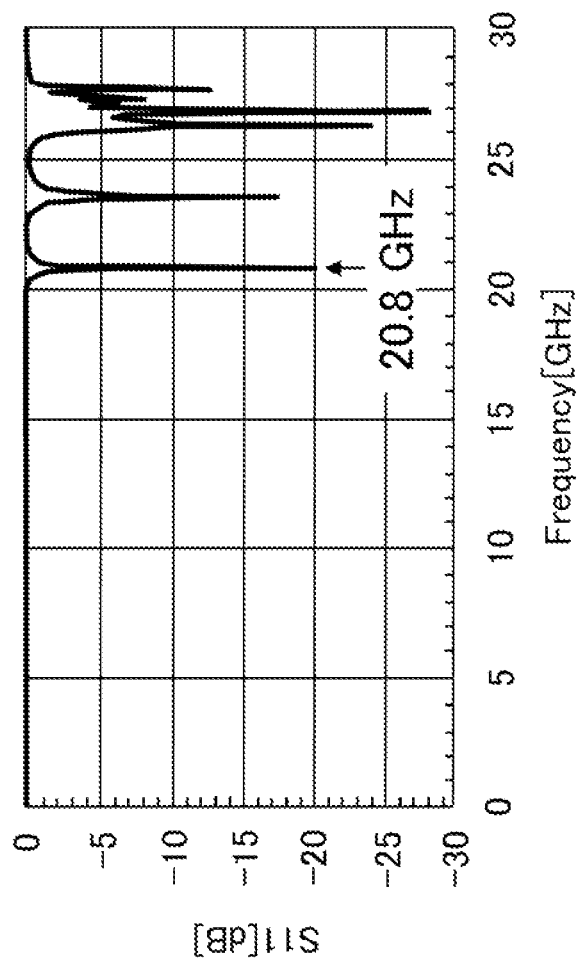
FIG. 18 is an explanatory diagram showing a simulation result of S11 in a case where the chip is mounted with the bonding wire on the sample holder according to the second example embodiment.

FIG. 18 is an explanatory diagram showing a simulation result of S11 in a case where the chip 7 is mounted with the bonding wire 13 on the sample holder 1 according to the second example embodiment. In the simulation in FIG. 18, a1=4 [mm], b1=4 [mm], d1=2.5 [mm], a2=5 [mm], b2=5 [mm], and d2=0.5 [mm]. In this case, θ is 45 degrees. As shown in FIG. 18, the lowest resonance frequency of the chip mode can be increased to 20.8 [GHz].

Thus, the sample holder 1 of the second example embodiment has the effect that the simulation result can be made higher than the simulation result shown in FIG. 8 where simulation is performed using the sample holder 101 shown in FIGS. 7A to 7C. The reason why in the second example embodiment, the resonance frequency of the chip mode can be made higher than that in the simulation result shown in FIG. 8 where the simulation is performed using the sample holder 101 shown in FIGS. 7A to 7C will be described. In the case of the sample holder 101 shown in FIGS. 7A to 7C, the electric field of the standing wave generated when resonance of the chip mode occurs spreads mainly in the silicon substrate and in the cavity 105 (vacuum) provided in the base 102, but in the section immediately above the columns 106 at the four corners, in other words, the section of the four corners of the chip 107, the space sandwiched between the GND plane 73 on the front surface of the chip 107 and the columns 106 is only silicon, and the electric field cannot spread in vacuum. Therefore, the effective permittivity is high at the four corners of the chip 107. On the other hand, in the case of the present example embodiment, since the prismoid section 52 is provided in the cavity 5, also in the section of the four corners of the chip 7, the space sandwiched between the GND plane 73 on the front surface of the chip 7 and the base 2 becomes silicon and vacuum. Therefore, it is considered that since the electric field can also spread in vacuum in this section, the effective permittivity in the section at the four corners of the chip 7 becomes lower than that of the sample holder 101 shown in FIGS. 7A to 7C.

Modification of Second Example Embodiment

Figure 19A:
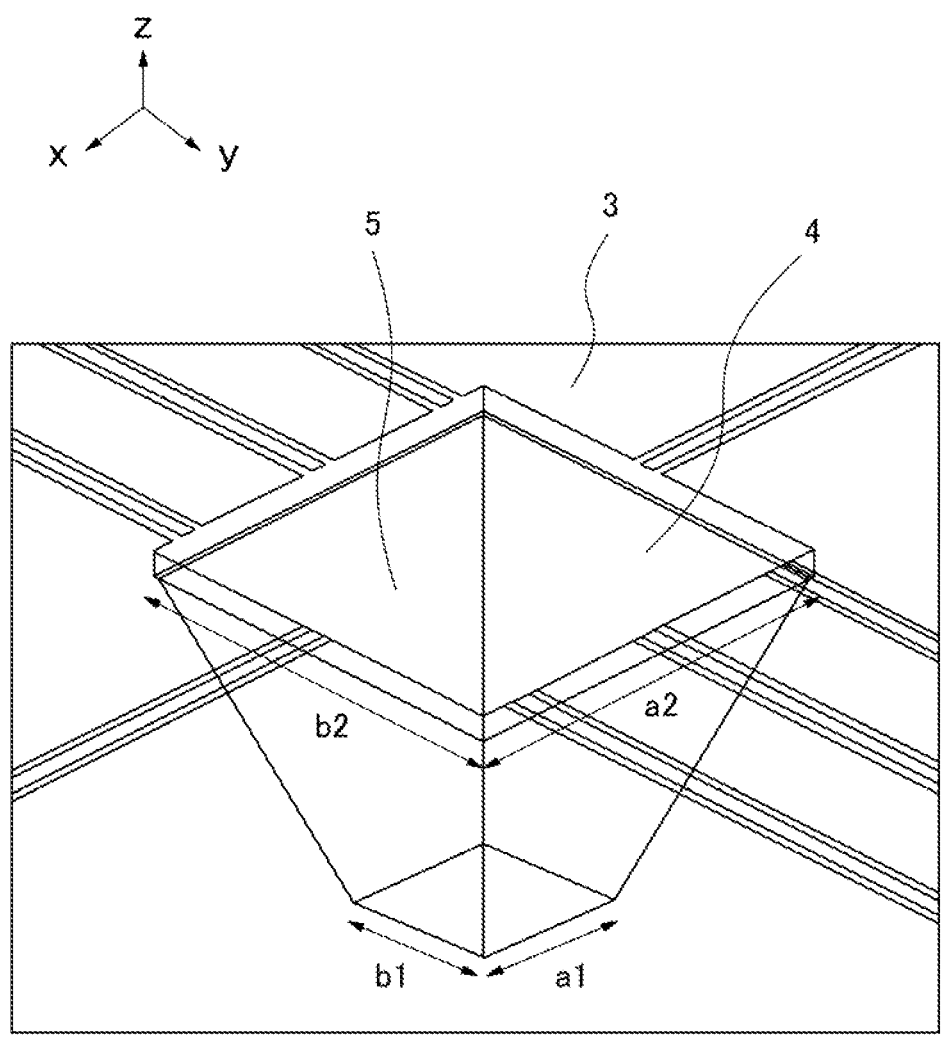
FIG. 19A is a perspective view of the sample holder according to a modification of the second example embodiment.
Figure 19B:
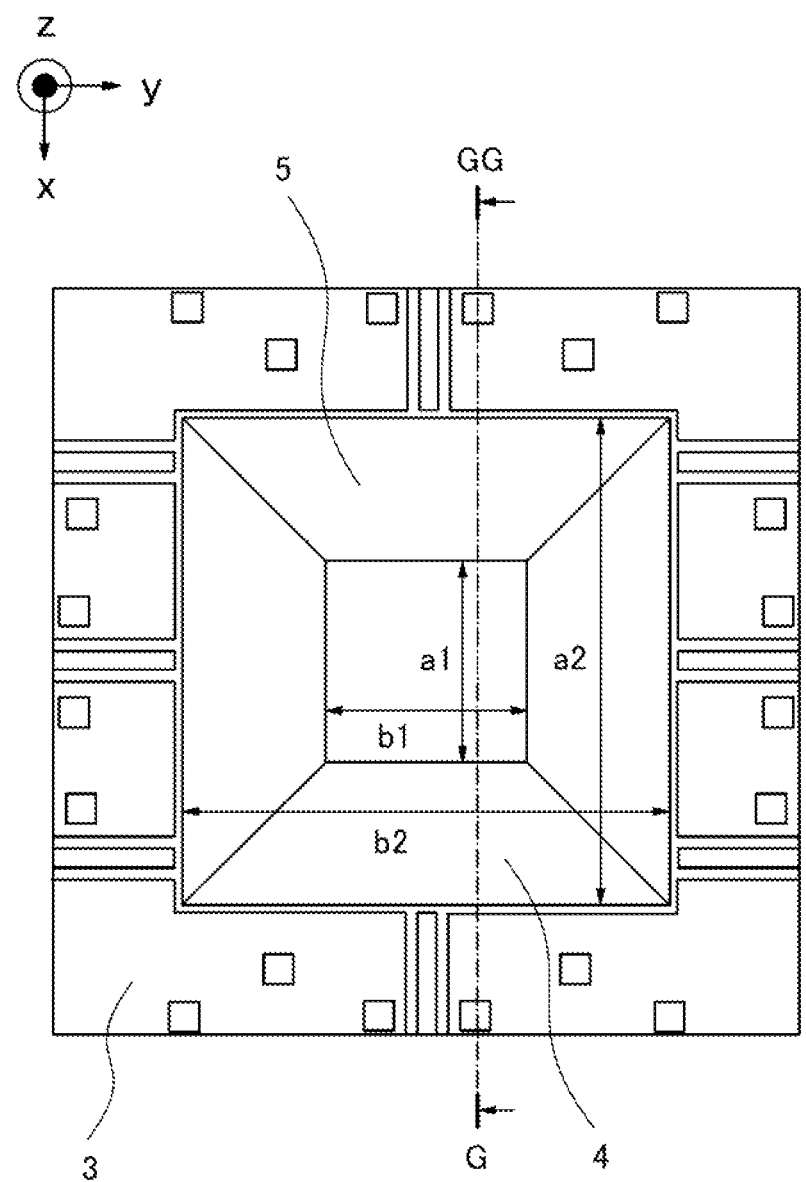
FIG. 19B is a top view of the sample holder according to a modification of the second example embodiment.
Figure 19C:
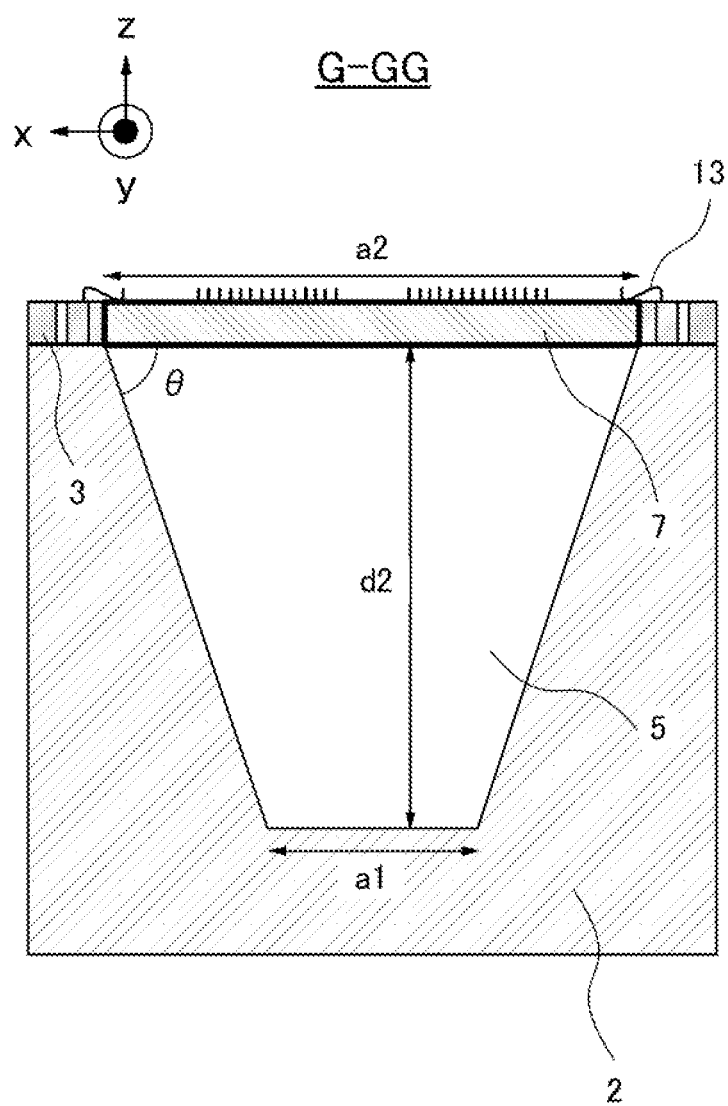
FIG. 19C is an end view in which the sample holder according to the modification of the second example embodiment is cut with a plane parallel to the xz plane including a cutting line G-GG shown in FIG. 19B.

As a modification of the second example embodiment, FIGS. 19A to 19C show the sample holder 1 in a case where the prismatic section 51 of the cavity 5 is eliminated and only the prismoid section 52 is provided. FIG. 19A is a perspective view of the sample holder 1 according to the modification of the second example embodiment. FIG. 19B is a top view of the sample holder 1 according to the modification of the second example embodiment. FIG. 19C is an end view in which the sample holder 1 according to the modification of the second example embodiment is cut with a plane parallel to the xz plane including the cutting line G-GG shown in FIG. 19B. In FIG. 19C, the chip 7 according to the modification of the second example embodiment is mounted with the bonding wire 13. As shown in FIGS. 19A to 19C, the cavity 5 does not have the prismatic section 51 but has the prismoid section 52. In FIGS. 19A to 19C, the prismoid section 52 is a quadrangular prismoid. For example, θ is a range in which the side surface of the prismoid section 52 becomes not parallel to the back surface of the chip 7. For example, in the case of a quadrangular prismoid, θ is less than 90 degrees.

Figure 20:
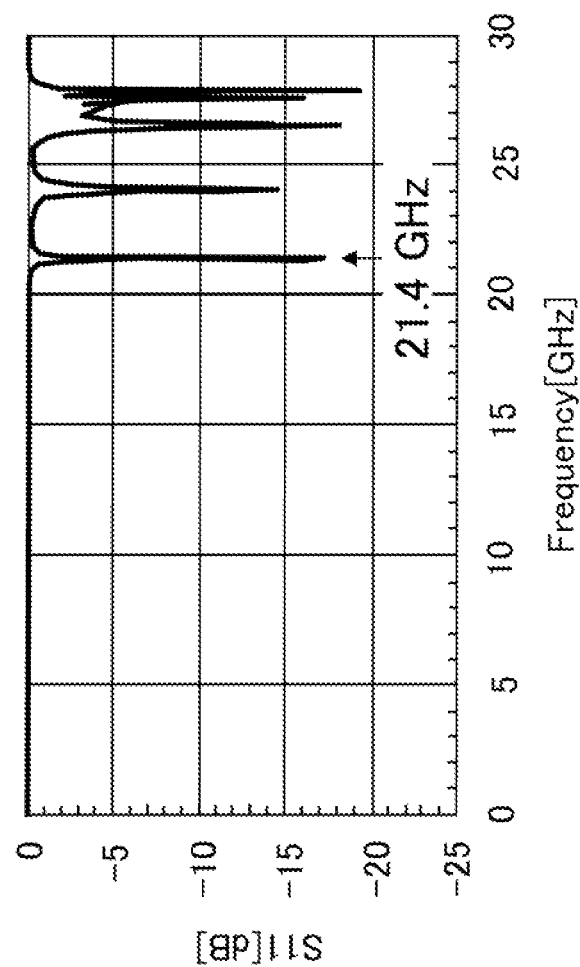
FIG. 20 is an explanatory diagram showing a simulation result of S11 in a case where the chip is mounted with the bonding wire on the sample holder using a base in which a cavity is formed, shown in FIGS. 19A to 19C.

FIG. 20 is an explanatory diagram showing a simulation result of S11 in a case where the chip 7 is mounted with the bonding wire 13 on the sample holder 1 using the base 2 in which the cavity 5 is formed, shown in FIGS. 19A to 19C. In FIG. 20, in the simulation, a1=2 [mm], b1=2 [mm], a2=5 [mm], b2=5 [mm], d1=0 [mm], and d2=5 [mm]. In this case, θ is about 73.3 degrees. As shown in FIG. 20, the lowest resonance frequency of the chip mode is 21.4 [GHz]. As FIG. 20, the lowest resonance frequency of the chip mode can be made higher than the simulation result of FIG. 8 by the sample holder 101 shown in FIGS. 7A to 7C.

In the second example embodiment and the modification of the second example embodiment, in a case where the thickness of the chip 7 mounted on the sample holder 1 is t, the height d1+d2 of the cavity 5 in FIGS. 17A to 17C and FIGS. 19A to 19C is preferably 2 t or more, more preferably 3 t or more, and still more preferably 5 t or more.

In the second example embodiment and the modification of the second example embodiment, there is an effect of increasing the resonance frequency of the chip mode when d2 is larger than 0. Therefore, d2 is preferably greater than 0. On the other hand, d1 may be 0, and thus d2 is preferably 0 or more. When d1=0, the cavity 5 includes only the prismoid section 52.

In the second example embodiment and the modification of the second example embodiment, the cavity 5 has a structure in which the prismatic section 51 and the prismoid section 52 are connected or a structure including only the prismoid section 52, but the prismoid section 52 need not have a prismoid shape. For example, the side surface of the prismoid section 52 may be a curved surface instead of a plane. That is, unless at least a part of the front surface of the base 2 forming the cavity 5 opposing the back surface of the chip 7 is parallel to the back surface of the chip 7 or the upper surface of the base 2, the effects described in the second example embodiment and the modification of the second example embodiment are obtained. Instead of the prismoid shape of the prismoid section 52, a pyramid shape may be used. Therefore, the cavity 5 may have a structure in which the prismatic section 51 and a pyramid section are connected or a structure including only the pyramid section.

Third Example Embodiment

The third example embodiment will be described in detail with reference to the drawings. Hereinafter, description of the content overlapping with the above description will be omitted to the extent that the description of the third example embodiment does not become unclear.

The sample holder 1 of the third example embodiment has a configuration in which the PCB 3 is placed on the metal base 2 as shown in FIG. 9. The third example embodiment uses the PCB 3 having the structure shown in FIGS. 11A to 11E similarly to that of the first example embodiment. In the third example embodiment, the sample holder 1 has the cavity 5 in a section of the base 2 immediately below the through hole 4 of the PCB 3, in other words, in a section immediately below the chip 7 when the chip 7 is mounted on the sample holder 1. Similarly to the second example embodiment, the cavity 5 has a shape in which the prism and the prismoid are combined, and has a shape in which the bottom surface having the narrower area of the prismoid and the upper bottom surface of the prism are connected. In the third example embodiment, unlike the second example embodiment, a prismoid may be deformed. Due to this, in the third example embodiment, when the chip 7 is mounted on the sample holder 1, at least a part of the front surface opposing the back surface of the chip 7 of the surface of the base 2 forming the cavity 5 is not parallel to the back surface of the chip 7.

Figure 21A:
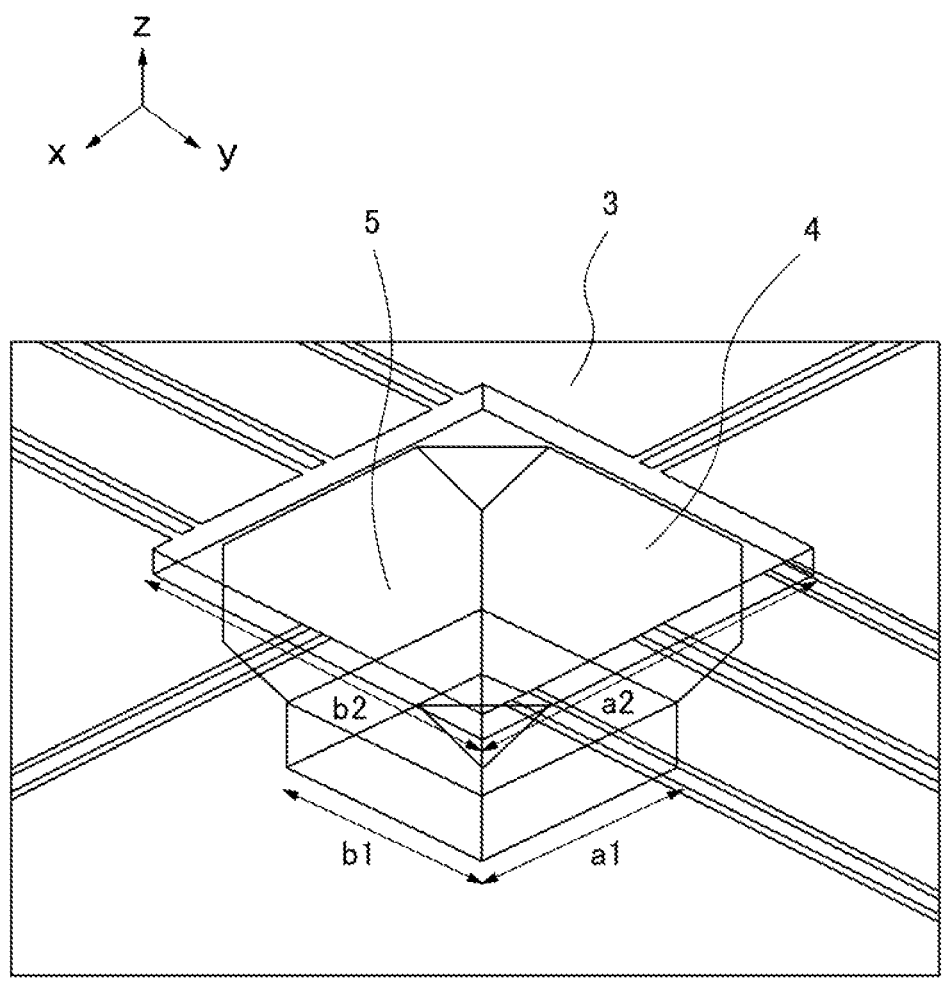
FIG. 21A is a perspective view of the sample holder of the third example embodiment.
Figure 21B:
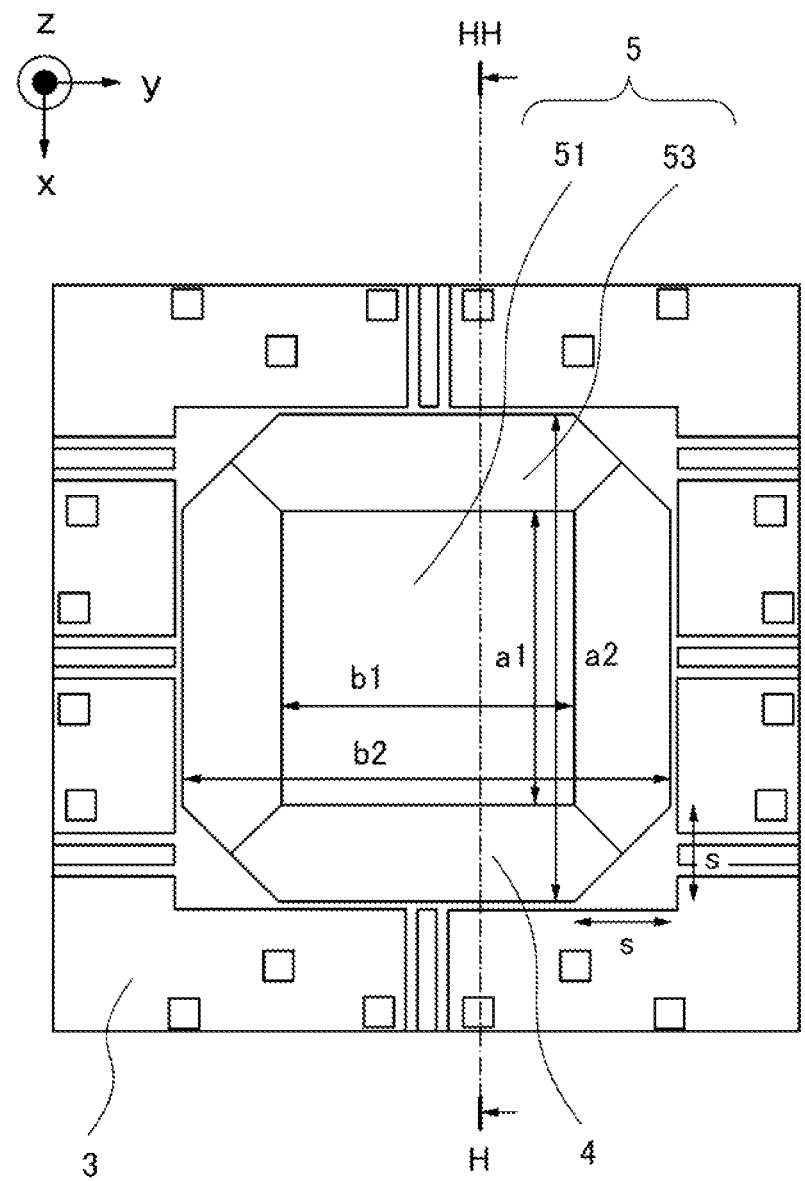
FIG. 21B is a top view of the sample holder of the third example embodiment.
Figure 21C:
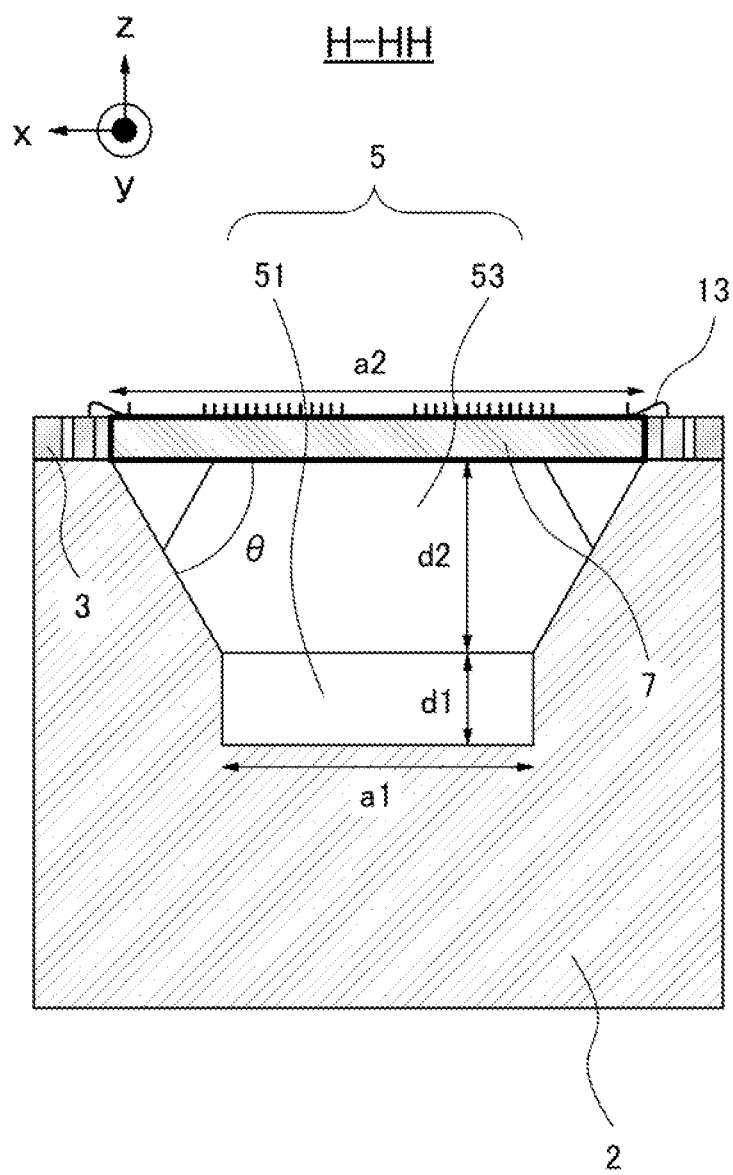
FIG. 21C is a cross-sectional view in which the sample holder of the third example embodiment is cut with a plane parallel to the xz plane including a cutting line H-HH shown in FIG. 21B.

FIG. 21A is a perspective view of the sample holder of the third example embodiment. FIG. 21B is a top view of the sample holder of the third example embodiment. FIG. 21C is a cross-sectional view in which the sample holder 1 of the third example embodiment is cut with a plane parallel to the xz plane including the cutting line H-HH shown in FIG. 21B. In FIG. 21C, the chip 7 is mounted with the bonding wire 13 on the sample holder 1 according to the third example embodiment. As shown in FIGS. 21A to 21C, the cavity 5 formed in the base 2 in the third example embodiment has a structure in which the prismatic section 51 and the prismoid deformation section 53 are connected.

The prismatic section 51 has a quadrangular bottom surface whose sides have the lengths a1 and b1 and a quadrangular prism shape having the height d1.

Here, assume that the chip 7 mounted on the sample holder 1, for example, has a rectangular shape, and the length of the short side of the chip 7 is v and the length of the long side of the chip 7 is w. In such a case, it is preferable that a1<b1 in the prismatic section 51, and a1 is smaller than v and b1 is smaller than w.

On the other hand, when the chip 7 mounted on the sample holder 1 has a square shape and the length of one side of the chip 7 is v, a1=b1 is preferable in the prismatic section 51, and a1 is preferably smaller than v.

In the prismoid deformation section 53, the bottom surface of the two bottom surfaces that has the smaller area has a quadrangular shape in which the lengths of the sides are a1 and b1, and the bottom surface having the larger area has an octagonal shape in which the four corners of the quadrangle in which the lengths of the sides are a2 and b2 are obliquely cut.

Here, assume that the chip 7 mounted on the sample holder 1, for example, has a rectangular shape, and the length of the short side of the chip 7 is v and the length of the long side of the chip 7 is w. In such a case, it is preferable that a2<b2 in the prismoid deformation section 53, a2 is v or more and 1.5 v or less, and b2 is w or more and 1.5 w or less.

On the other hand, when the chip 7 mounted on the sample holder 1 has a square shape and the length of one side of the chip 7 is v, a2=b2 is preferable in the prismoid deformation section 53, and a2 is preferably v or more and 1.5 v or less.

The height of the prismoid deformation section 53 is d2. The cavity 5 formed in the base 2 of the sample holder 1 of the present example embodiment has a structure in which the prismoid deformation section 53 is connected above the prismatic section 51, and the upper bottom surface of the prismatic section 51 and the lower bottom surface of the prismoid deformation section 53 are the same plane. Here, the lower bottom surface of the prismoid deformation section 53 is a bottom surface having the smaller area of the two bottom surfaces of the prismoid deformation section 53. The shape of the cavity 5 in FIGS. 21A to 21C of the present example embodiment will be described with reference to FIGS. 22A to 22C and FIGS. 23A to 23C for more accurate description.

Figure 22A:
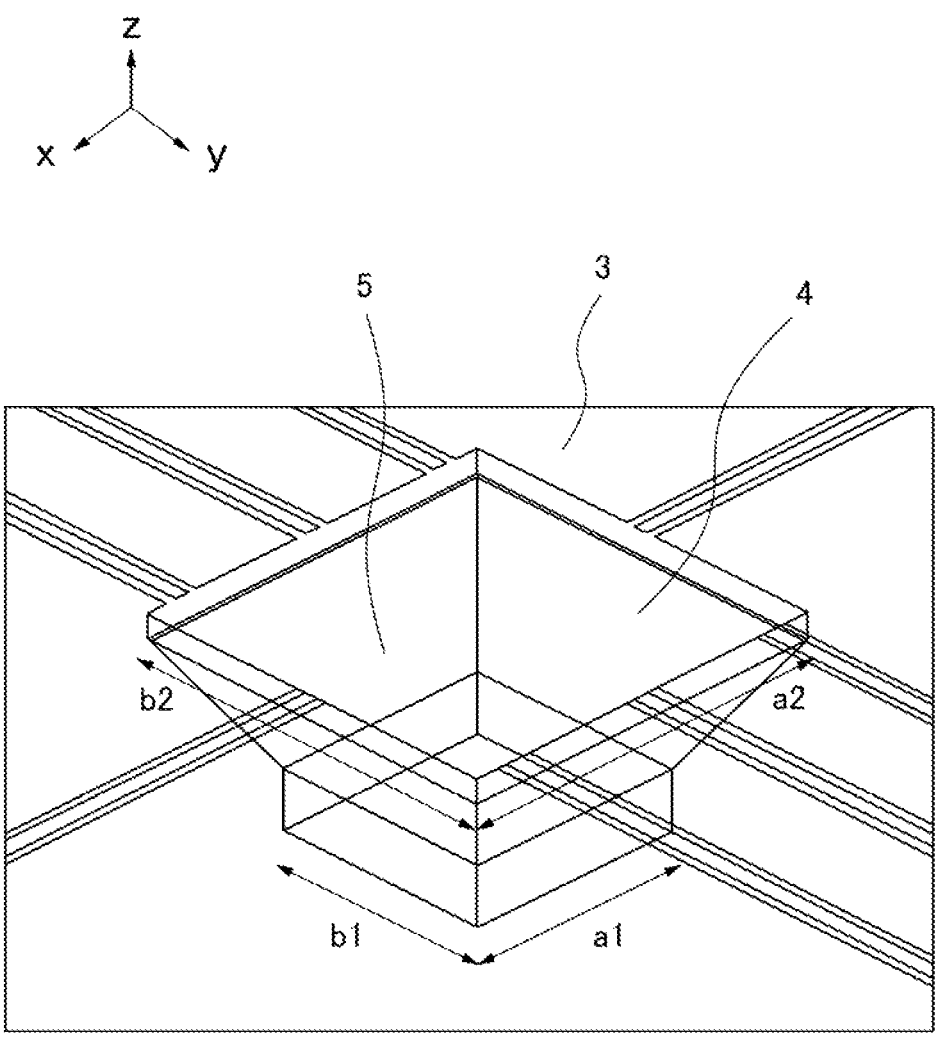
FIG. 22A is a perspective view showing a shape example 1 of the cavity of the sample holder of the third example embodiment.
Figure 22B:
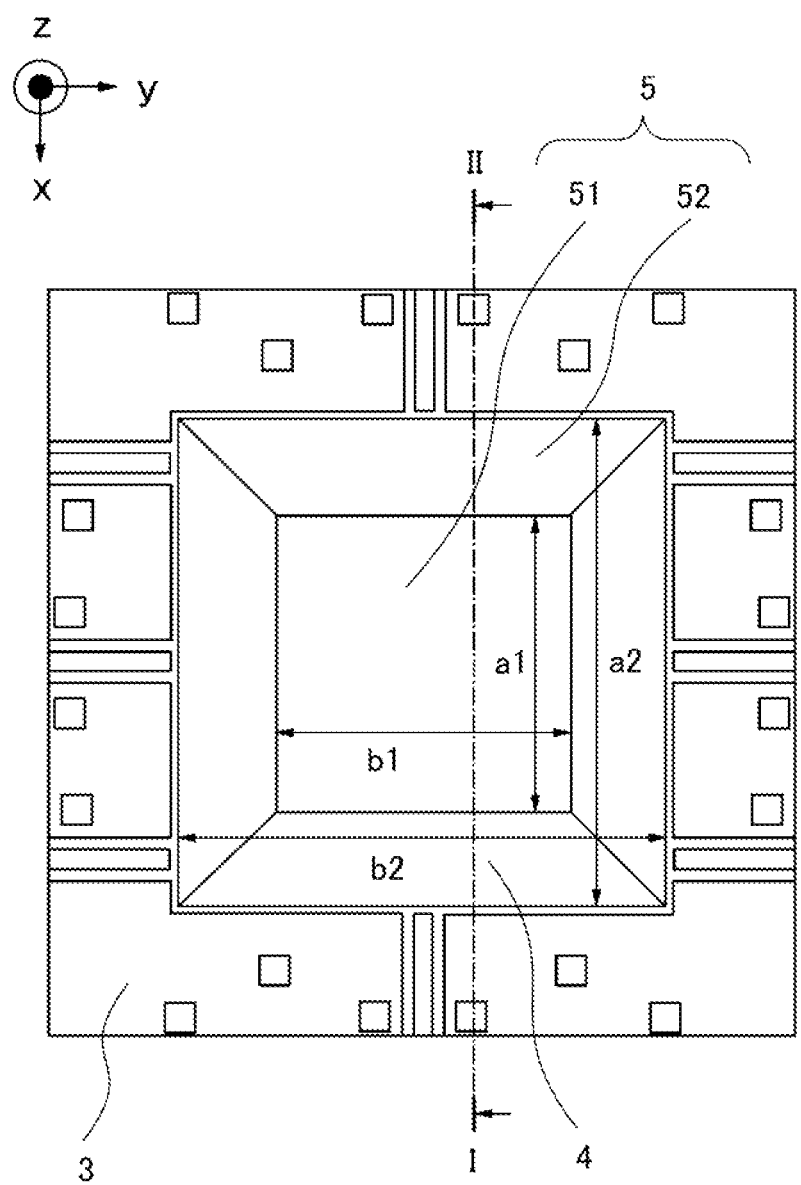
FIG. 22B is a top view showing the shape example 1 of the cavity of the sample holder of the third example embodiment.
Figure 22C:
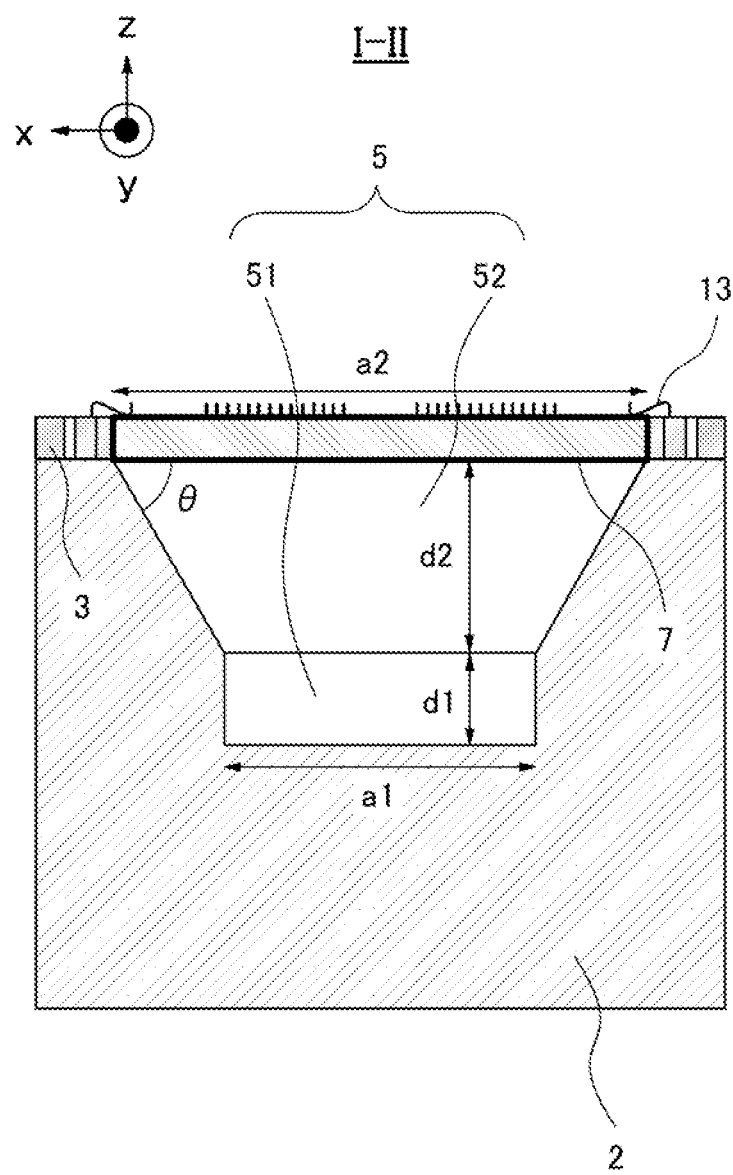
FIG. 22C is an end view in which in an example shape 1 of the cavity of the sample holder of the third example embodiment, the sample holder is cut along near the cavity with a plane parallel to the xz plane including a cutting line I-II shown in FIG. 22B.

FIG. 22A is a perspective view showing the shape example 1 of the cavity 5 of the sample holder 1 of the third example embodiment. FIG. 22B is a top view showing the shape example 1 of the cavity 5 of the sample holder 1 of the third example embodiment. FIG. 22C is an end view in which in the example shape 1 of the cavity 5 of the sample holder 1 of the third example embodiment, the sample holder 1 is cut near the cavity 5 with a plane parallel to the xz plane including the cutting line I-II shown in FIG. 22B. In FIG. 22C, the chip 7 is mounted with the bonding wire 13 on the sample holder 1 according to the second example embodiment.

Figure 23A:
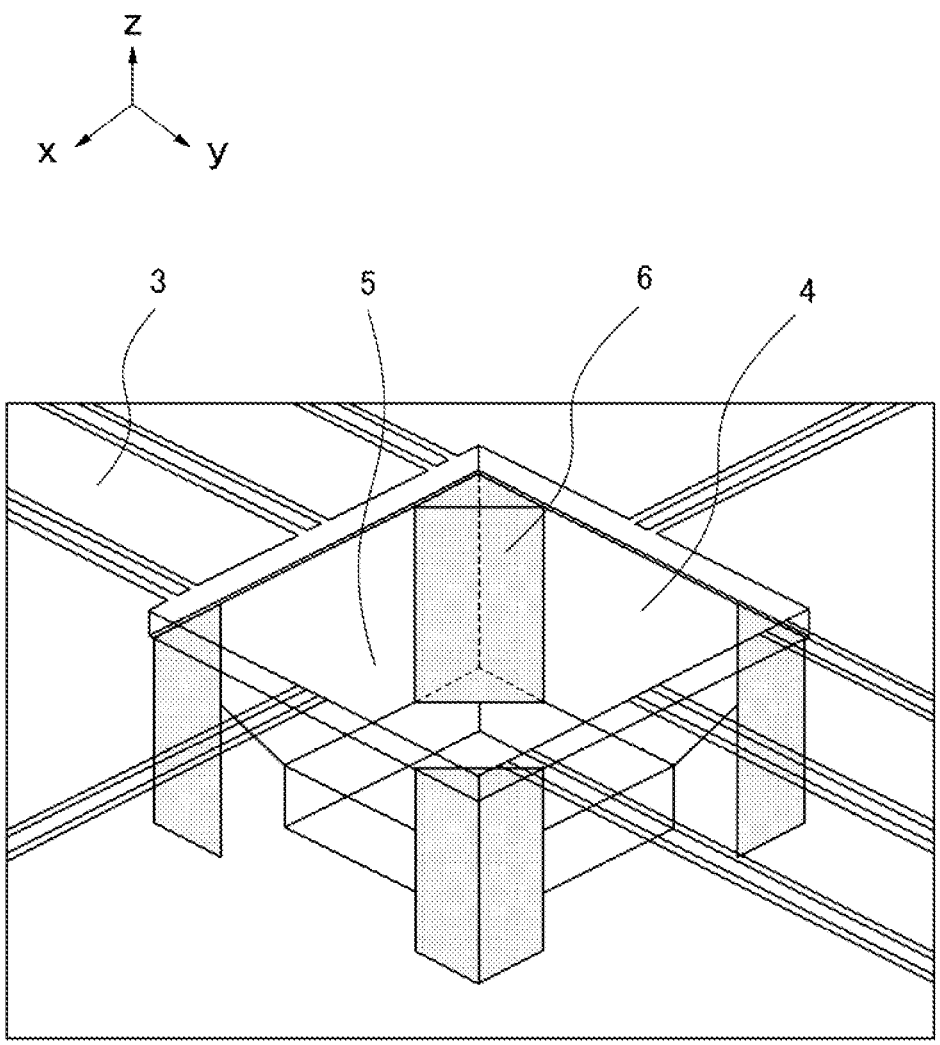
FIG. 23A is a perspective view showing a shape example 2 of the cavity of the sample holder of the third example embodiment.
Figure 23B:
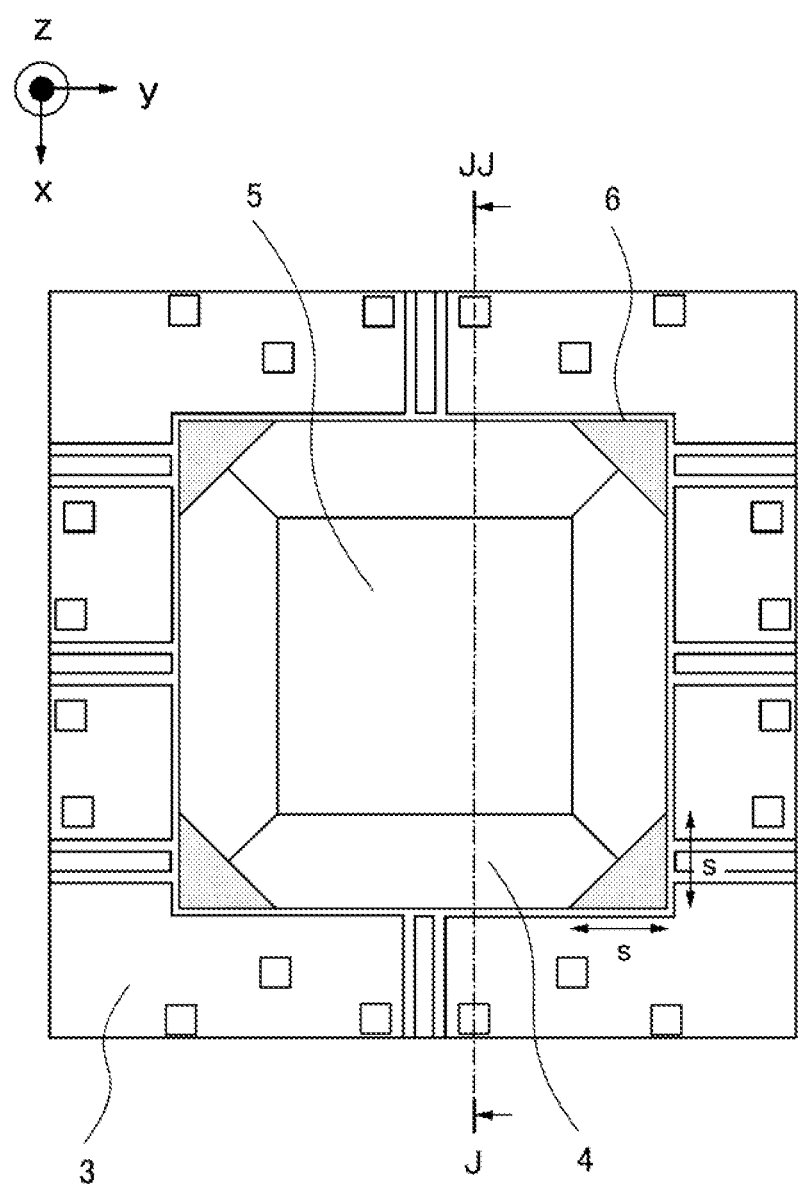
FIG. 23B is a top view showing the shape example 2 of the cavity of the sample holder of the third example embodiment.
Figure 23C:
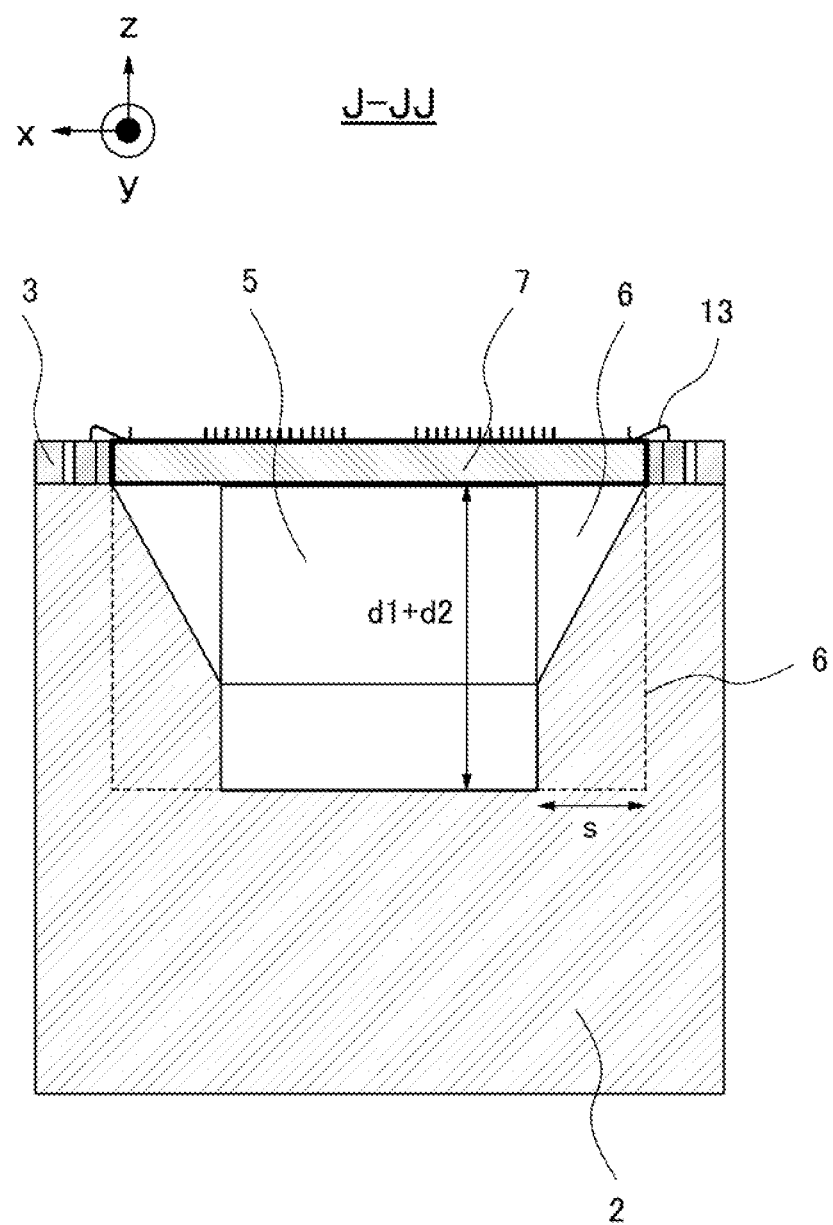
FIG. 23C is a cross-sectional view in which the sample holder is cut with a plane parallel to the xz plane including a cutting line J-JJ shown in FIG. 23B in the example shape 2 of the cavity of the sample holder of the third example embodiment.

FIG. 23A is a perspective view showing the shape example 2 of the cavity 5 of the sample holder 1 of the third example embodiment. FIG. 23B is a top view showing the shape example 2 of the cavity 5 of the sample holder 1 of the third example embodiment. FIG. 23C is a cross-sectional view in which the sample holder 1 is cut with a plane parallel to the xz plane including the cutting line J-JJ shown in FIG. 23B in the example shape 2 of the cavity 5 of the sample holder 1 of the third example embodiment. In FIG. 23C, the chip 7 is mounted with the bonding wire 13 on the sample holder 1 according to the third example embodiment.

The cavity 5 shown in FIGS. 22A to 22C has the same structure as that of the cavity 5 shown in FIGS. 17A to 17C of the second example embodiment. That is, the cavity 5 shown in FIGS. 22A to 22C has a configuration in which the prismatic section 51 and the prismoid section 52 are connected. In the third example embodiment, four conductor columns 6 shown in FIGS. 23A to 23C are further added to the four corners of the cavity 5 shown in FIGS. 22A to 22C similar to the second example embodiment. Due to this, the cavity 5 having the structure shown in FIGS. 21A to 21C can be formed in the base 2. As shown in FIGS. 23A to 23C, in the present example embodiment, the conductor columns 6 at the four corners are triangular prisms, the bottom surface of the triangular prism has a shape of an isosceles right triangle, the length of the equal two sides of this bottom surface is s, and the height of the triangular prism is d1+d2. The columns 6 of the conductors at the four corners are in electrical contact with the base 2. The four conductor columns 6 shown in FIGS. 23A to 23C may be separate from the base 2, but may be made of the same material as that of the base 2, that is, the base 2 and the four columns 6 may be integrated.

A feature of the sample holder 1 of the third example embodiment is that the prismoid deformation section 53 is provided on the upper side of the cavity 5, so that at least a part of the front surface opposing the back surface of the chip 7 when the chip 7 is mounted with the bonding wire 13 on the sample holder 1 is not parallel to the back surface of the chip 7. As shown in FIG. 21C, the angle formed by a part not parallel to the back surface of the chip 7 in the side surface of the prismoid deformation section 53, that is, the surface opposing the back surface of the chip 7 when the chip 7 is mounted on the sample holder 1 and the back surface of the chip 7 is θ. In other words, the angle formed by the side surface of the prismoid deformation section 53 and the upper surface of the base 2 is defined as θ. For example, θ is a range in which the side surface of the prismoid deformation section 53 becomes not parallel to the back surface of the chip 7. For example, when the prismoid deformation section 53 is created based on the prismoid section 52, which is a quadrangular prismoid, θ is less than 90 degrees. In the structure of the sample holder 1 of the third example embodiment, when the chip 7 is mounted on the sample holder 1, at least a part of the base 2 comes into contact with the back surface of the chip 7.

Figure 24:
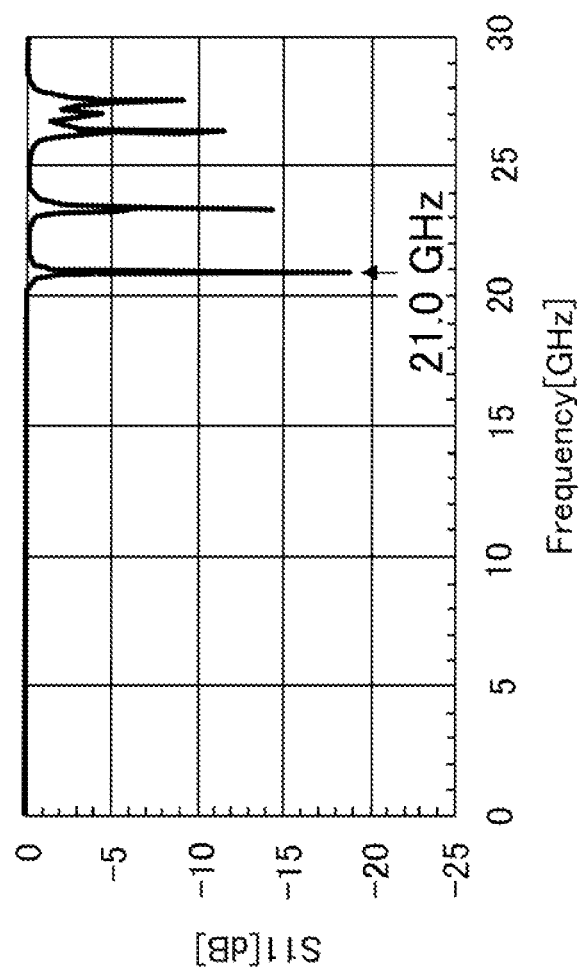
FIG. 24 is an explanatory diagram showing a simulation result of S11 of the system in which the chip is mounted with the bonding wire on the sample holder of the third example embodiment.

FIG. 24 shows a simulation result of S11 in a case where the chip 7 is mounted with the bonding wire 13 on the sample holder 1 using the base 2 in which the cavity 5 of FIGS. 21A to 21C is formed. FIG. 24 is an explanatory diagram showing a simulation result of S11 of the system in which the chip 7 is mounted with the bonding wire 13 on the sample holder 1 of the third example embodiment. In the simulation in FIG. 24, a1=3 [mm], b1=3 [mm], a2=5 [mm], b2=5 [mm], d1=1 [mm], d2=2 [mm], and s=0.5 [mm]. In this case, θ is about 63.4 degrees. As shown in FIG. 24, the lowest resonance frequency of the chip mode is 21.0 [GHz]. Therefore, as in FIG. 24, the lowest resonance frequency of the chip mode can be made higher than that in the simulation result shown in FIG. 8 where the simulation is performed using the sample holder 101 shown in FIGS. 7A to 7C.

Thus, the sample holder 1 of the third example embodiment has an effect that the resonance frequency of the chip mode can be made higher than that of the sample holder 101 shown in FIGS. 7A to 7C.

Modification of Third Example Embodiment

Figure 25A:
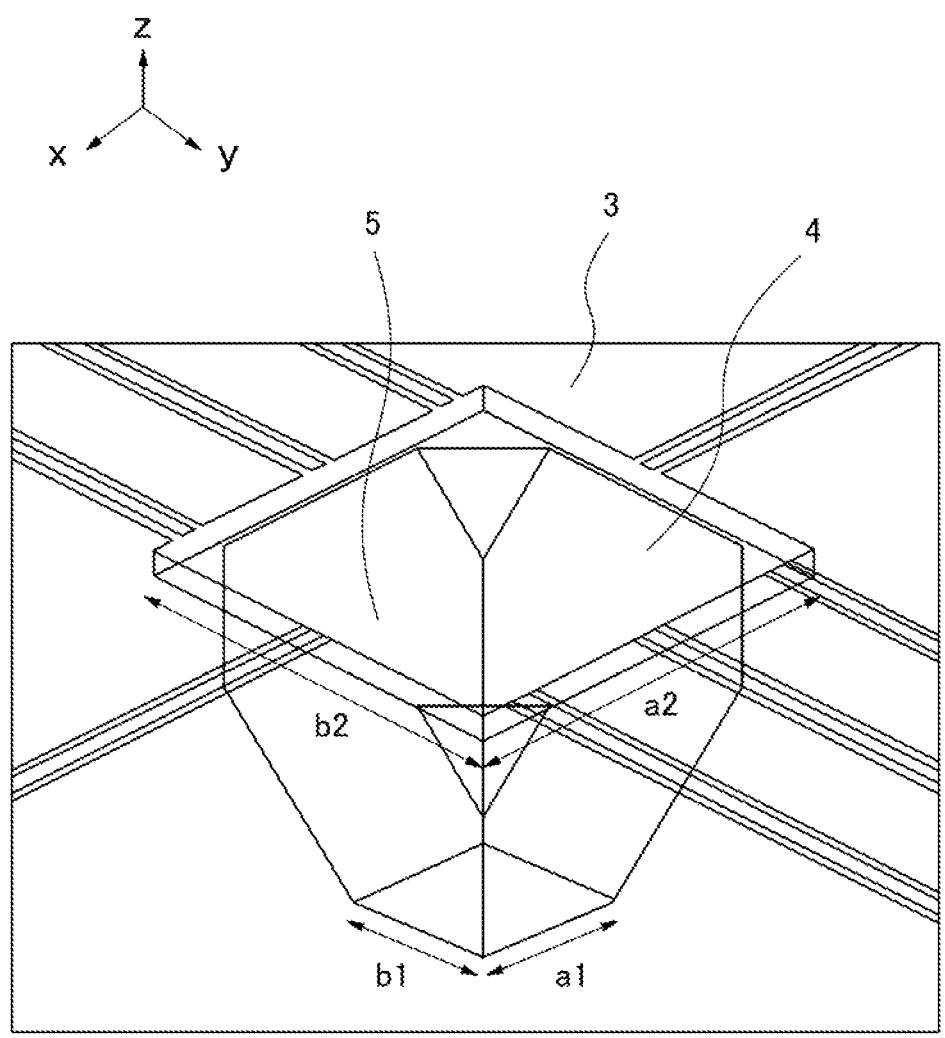
FIG. 25A is a perspective view of the sample holder of the modification of the third example embodiment.
Figure 25B:
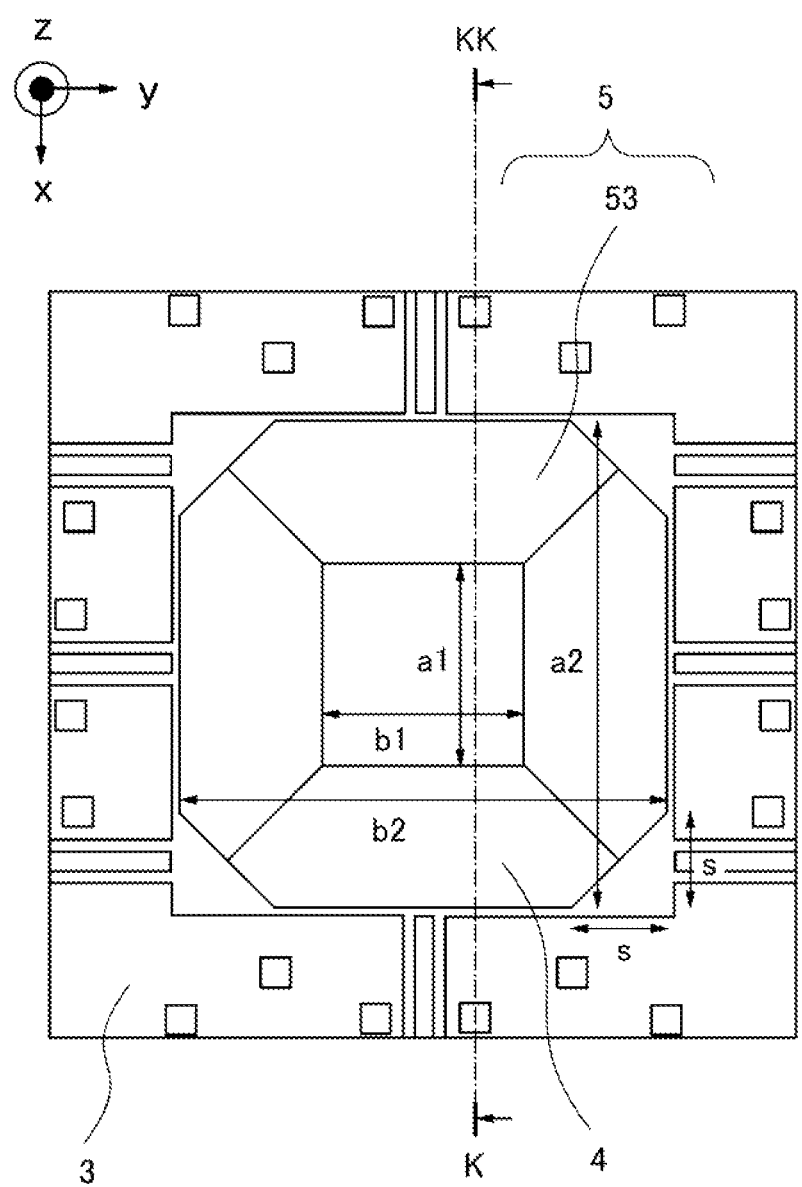
FIG. 25B is a top view of the sample holder of a modification of the third example embodiment.
Figure 25C:
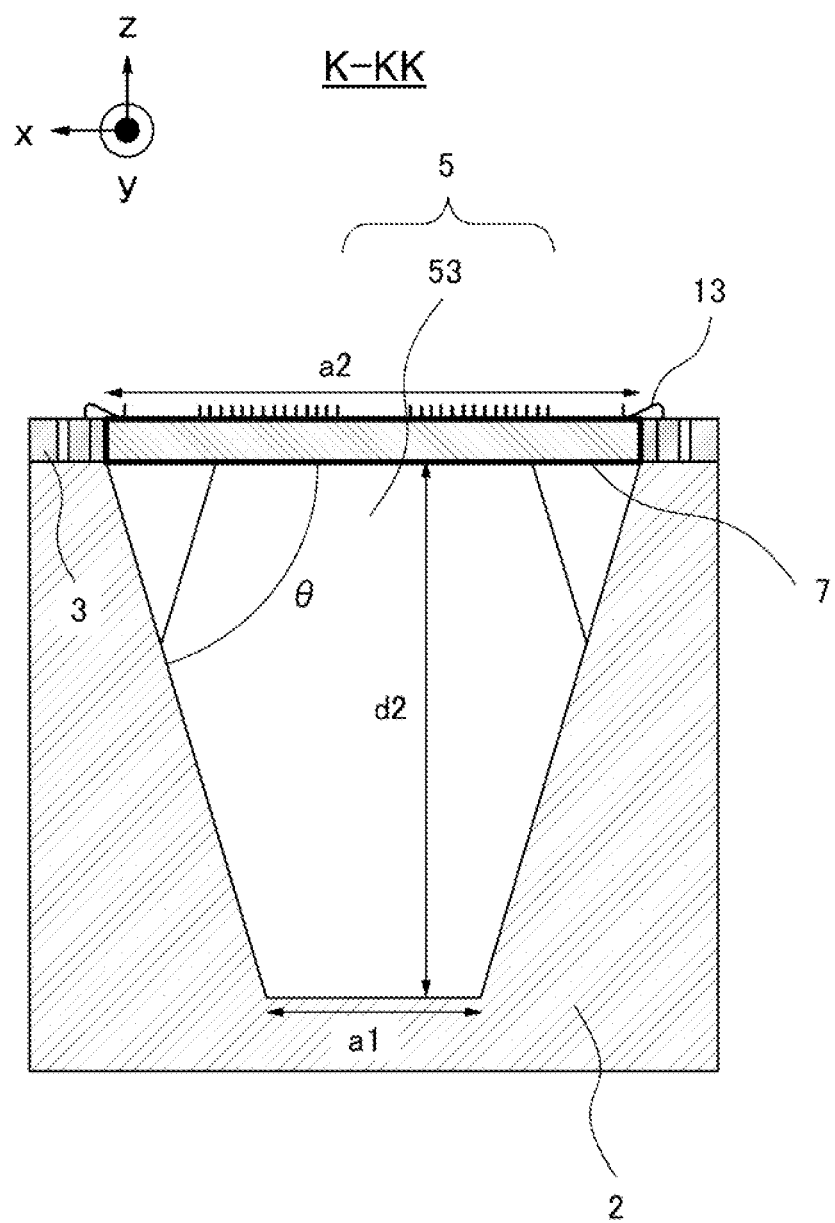
FIG. 25C is a cross-sectional view in which the sample holder of the modification of the third example embodiment is cut with a plane parallel to an xz plane including a cutting line K-KK shown in FIG. 25B.

As a modification of the third example embodiment, FIGS. 25A to 25C show a sample holder in a case where the prismatic section 51 of the cavity 5 is eliminated and only the prismoid deformation section 53 is provided. FIG. 25A is a perspective view of the sample holder 1 of the modification of the third example embodiment. FIG. 25B is a top view of the sample holder 1 of the modification of the third example embodiment. FIG. 25C is a cross-sectional view in which the sample holder 1 of the modification of the third example embodiment is cut with a plane parallel to an xz plane including the cutting line K-KK shown in FIG. 25B. In FIG. 25C, the chip 7 is mounted with the bonding wire 13 on the sample holder 1 according to the third example embodiment. In order to describe the shape of the cavity 5 shown in FIGS. 25A, 25B, and 25C of the modification of the third example embodiment in more detail, a description will be given with reference to FIGS. 26A to 26C and FIGS. 27A to 27C.

Figure 26A:
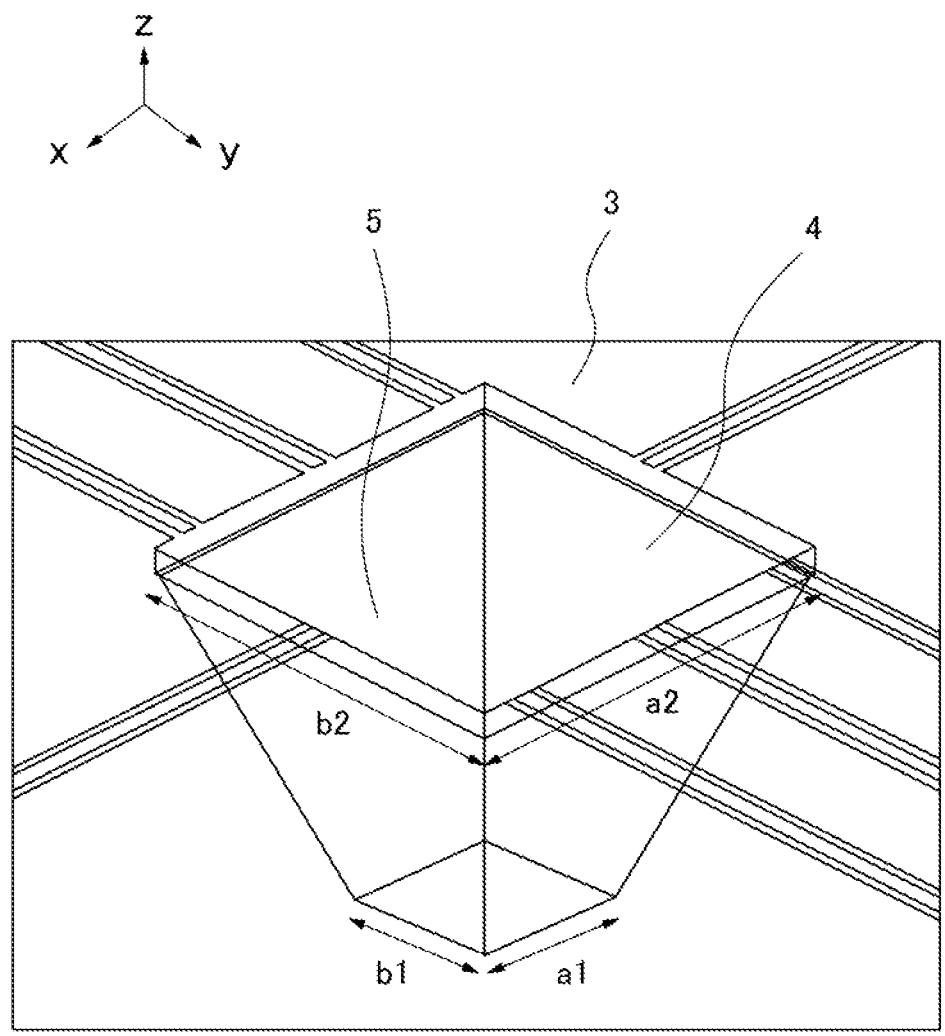
FIG. 26A is a perspective view showing the shape example 1 of the cavity of the sample holder of the modification of the third example embodiment.
Figure 26B:
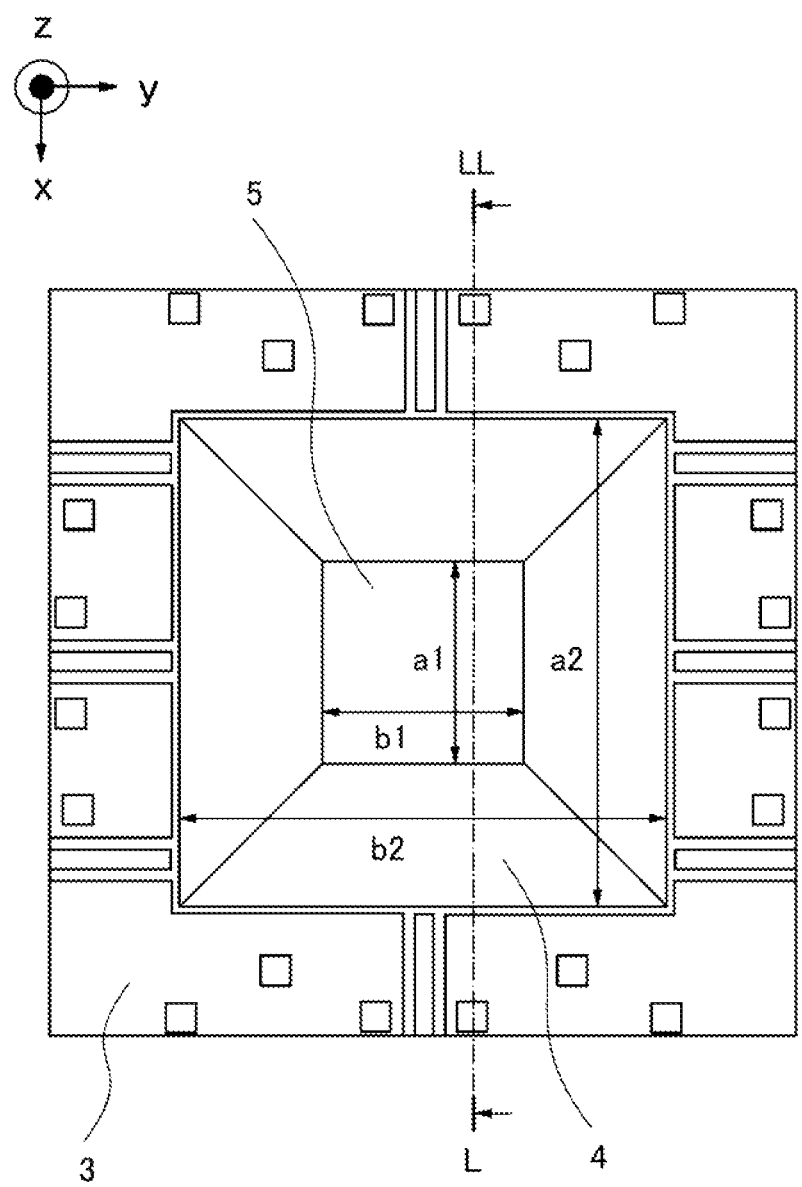
FIG. 26B is a top view showing the shape example 1 of the cavity of the sample holder of the modification of the third example embodiment.
Figure 26C:
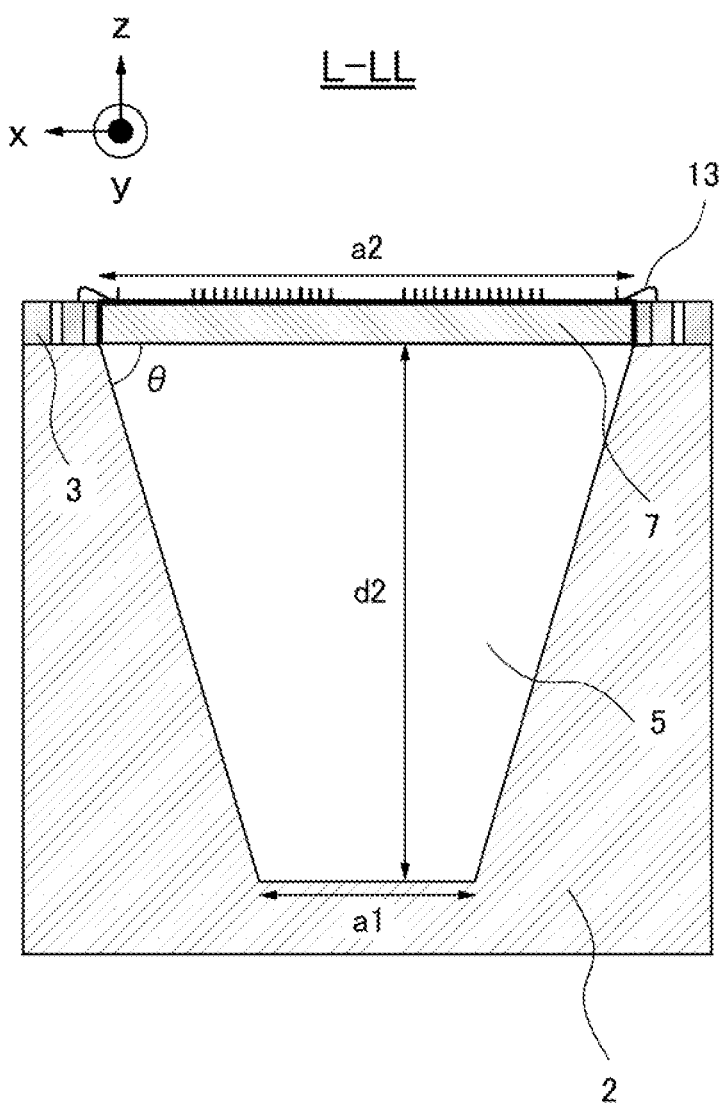
FIG. 26C is an end view in which in the example shape 1 of the cavity of the sample holder of the modification of the third example embodiment, the sample holder is cut near the cavity with a plane parallel to the xz plane including a cutting line L-LL shown in FIG. 26B.

FIG. 26A is a perspective view showing the shape example 1 of the cavity 5 of the sample holder 1 of the modification of the third example embodiment. FIG. 26B is a top view showing the shape example 1 of the cavity 5 of the sample holder 1 of the modification of the third example embodiment. FIG. 26C is an end view in which in the example shape 1 of the cavity 5 of the sample holder 1 of the modification of the third example embodiment, the sample holder 1 is cut near the cavity 5 with a plane parallel to the xz plane including the cutting line L-LL shown in FIG. 26B. In FIG. 26C, the chip 7 is mounted with the bonding wire 13 on the sample holder 1 according to the modification of the third example embodiment.

Figure 27A:
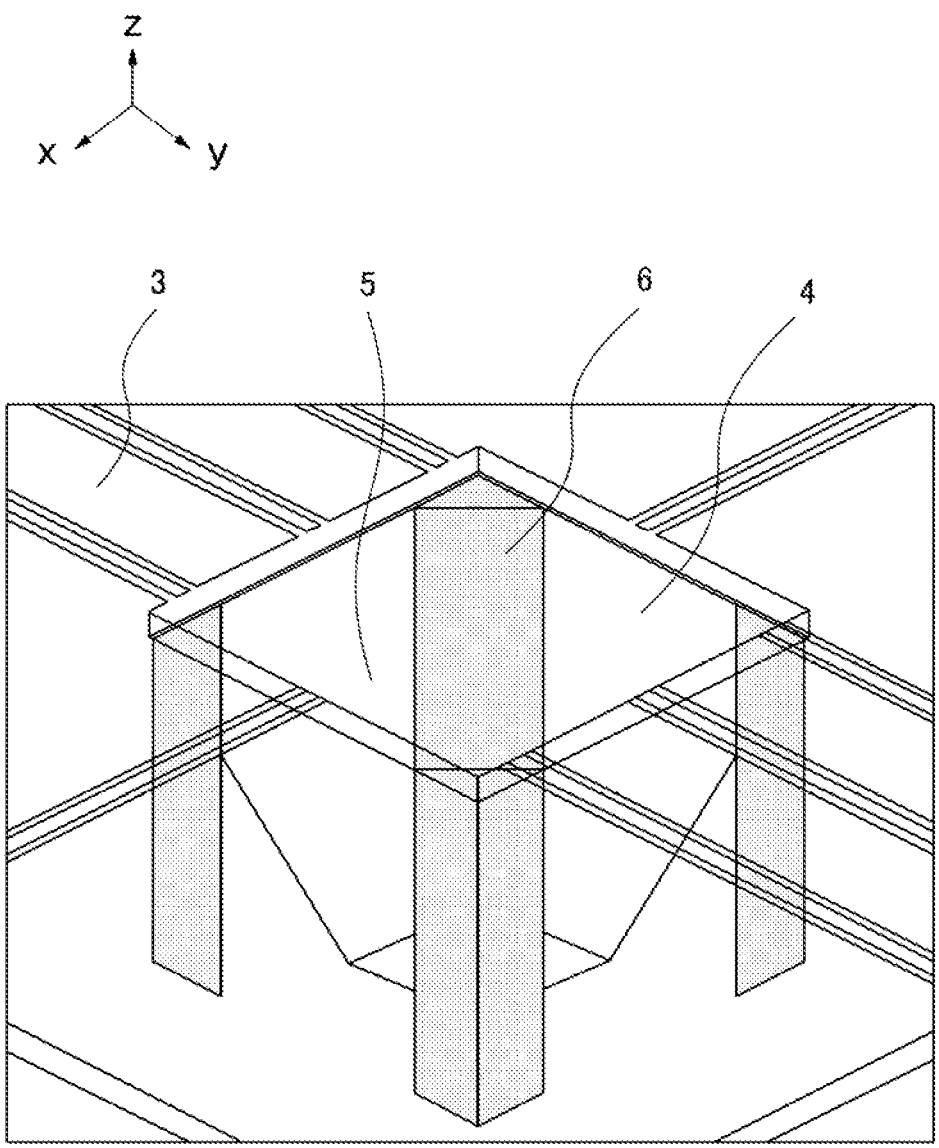
FIG. 27A is a perspective view showing a shape example 2 of a cavity of the sample holder of the modification of the third example embodiment.
Figure 27B:
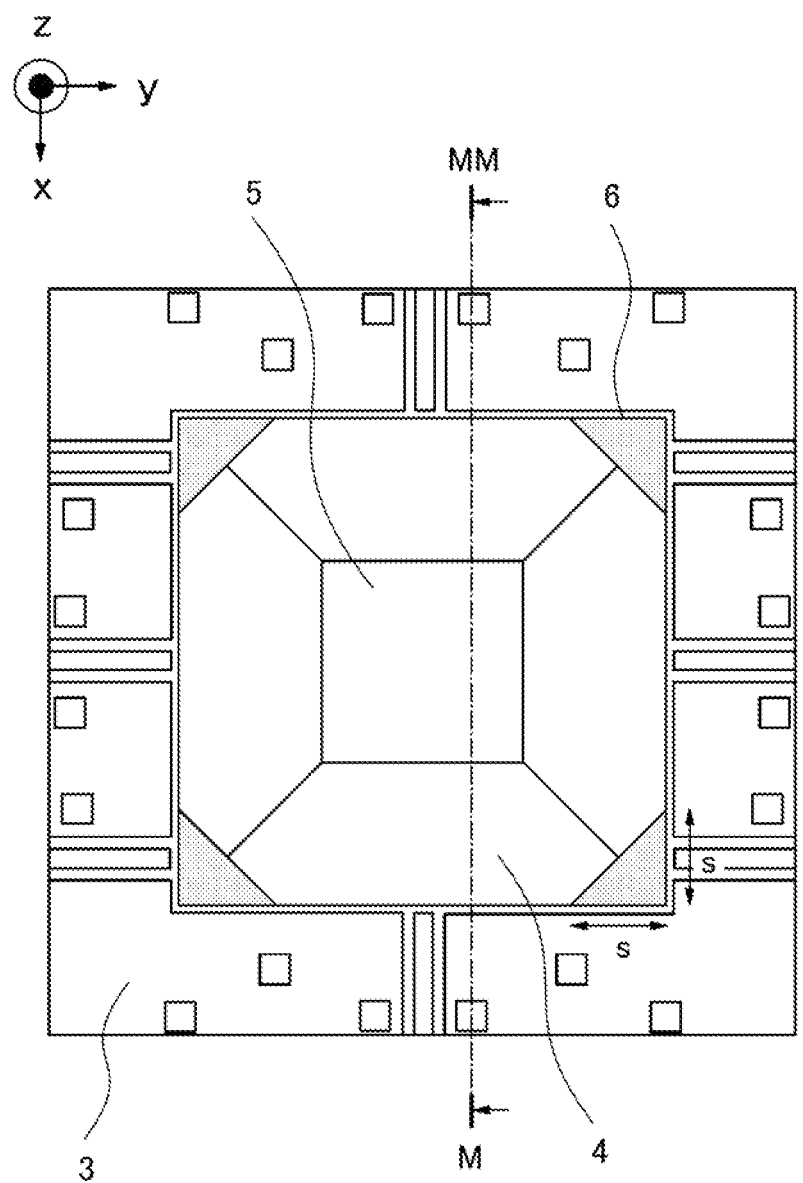
FIG. 27B is a top view showing the shape example 2 of the cavity of the sample holder of the modification of the third example embodiment.
Figure 27C:
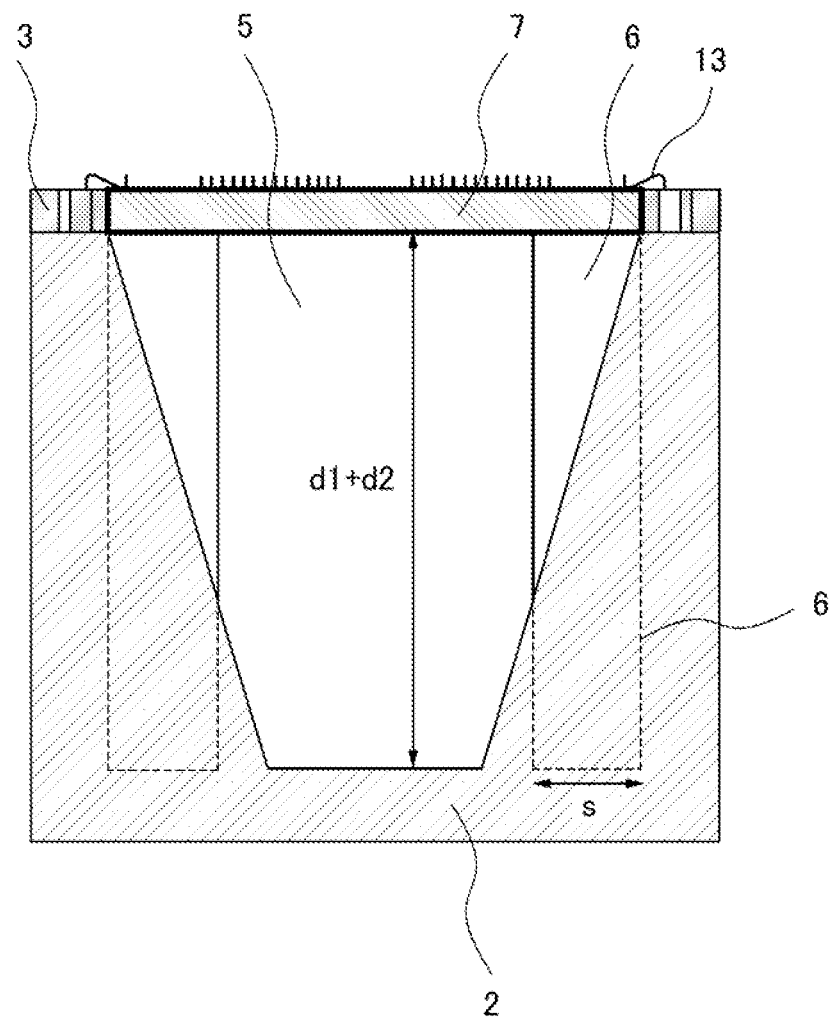
FIG. 27C is a cross-sectional view in which in the example shape 2 of the cavity of the sample holder of the modification of the third example embodiment, the sample holder is cut with a plane parallel to the xz plane including a cutting line M-MM shown in FIG. 27B.

FIG. 27A is a perspective view showing the shape example 2 of the cavity 5 of the sample holder 1 of the modification of the third example embodiment. FIG. 27B is a top view showing the shape example 2 of the cavity 5 of the sample holder 1 of the modification of the third example embodiment. FIG. 27C is a cross-sectional view in which the sample holder 1 is cut with a plane parallel to the xz plane including the cutting line M-MM shown in FIG. 27B in the shape example 2 of the cavity 5 of the sample holder 1 of the modification of the third example embodiment. In FIG. 27C, the chip 7 is mounted with the bonding wire 13 on the sample holder 1 according to the modification of the third example embodiment.

The cavity 5 shown in FIGS. 26A to 26C has the same structure as that of the cavity 5 in FIGS. 19A to 19C of the modification of the second example embodiment. That is, the cavity 5 shown in FIGS. 26A to 26B includes only the prismoid section 52. In the modification of the third example embodiment, four conductor columns 6 shown in FIG. 27 are further added to the four corners of the cavity 5 shown in FIG. 26 similarly to the modification of the second example embodiment. Due to this, the cavity 5 shown in FIGS. 25A to 25C can be formed in the base 2. For example, θ is a range in which a part not parallel to the back surface of the chip 7 is formed on the side surface of the cavity 5 (prismoid section 52) shown in FIGS. 26A to 26C. For example, when the cavity 5 shown in FIGS. 26A to 26C is a quadrangular prismoid, θ is less than 90 degrees.

Figure 28:
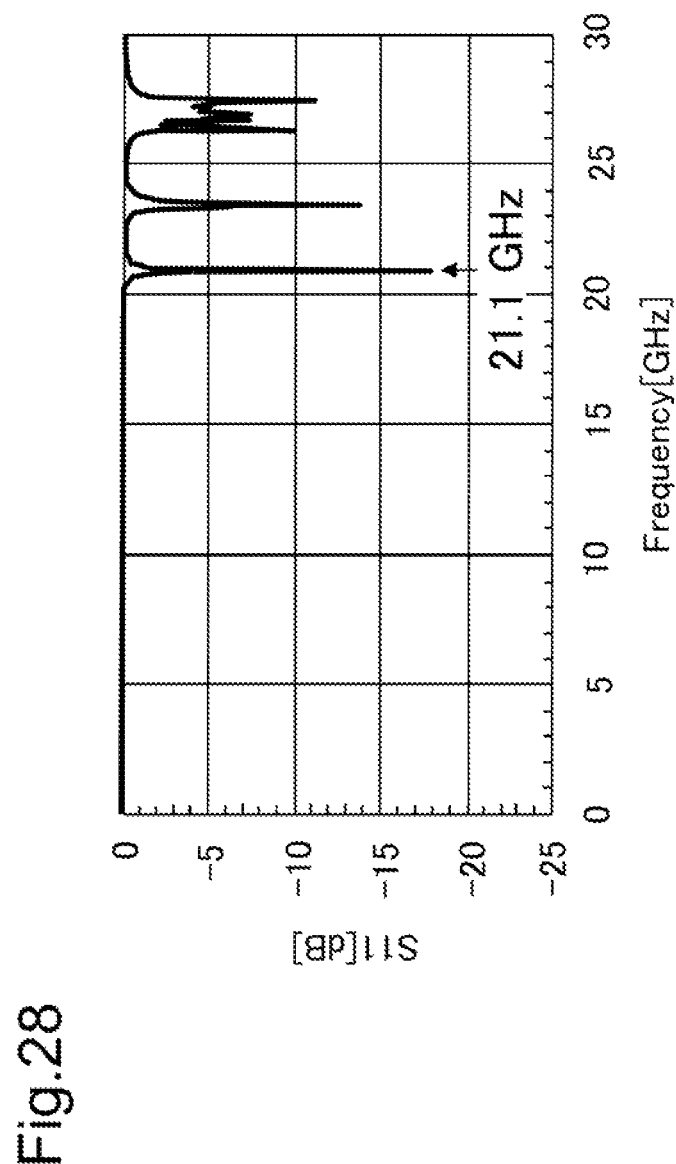
FIG. 28 is an explanatory diagram showing a simulation result of S11 of the system in which the chip is mounted with the bonding wire on the sample holder of the modification of the third example embodiment.

FIG. 28 shows a simulation result of S11 in a case where the chip 7 is mounted with the bonding wire 13 on the sample holder 1 using the base 2 in which the cavity 5 shown in FIGS. 25A to 25C is formed. FIG. 28 is an explanatory diagram showing a simulation result of S11 of the system in which the chip 7 is mounted with the bonding wire 13 on the sample holder 1 of the modification of the third example embodiment. In FIG. 28, in the simulation, a1=2 [mm], b1=2 [mm], a2=5 [mm], b2=5 [mm], d2=5 [mm], and s=0.5 [mm]. In this case, θ is about 73.3 degrees. As shown in FIG. 28, the lowest resonance frequency of the chip mode is 21.1 [GHz]. Therefore, as in FIG. 28, the lowest resonance frequency of the chip mode can be made higher than that in the simulation result shown in FIG. 8 where the simulation is performed using the sample holder 101 shown in FIGS. 7A to 7C.

In the third example embodiment and the modification of the third example embodiment, in a case where the thickness of the chip 7 mounted on the sample holder 1 is t, the sum d1+d2 of the height d1 of the prismatic section 51 of the cavity 5 and the height d2 of the prismoid deformation section 53 in FIGS. 21A to 21C and FIGS. 25A to 25C is preferably 2 t or more, more preferably 3 t or more, and still more preferably 5 t or more.

In the third example embodiment and the modification of the third example embodiment, there is an effect of increasing the resonance frequency of the chip mode when d2 is larger than 0. Therefore, d2 is preferably greater than 0. On the other hand, d1 may be 0, and thus d2 is preferably 0 or more. When d1=0, the cavity 5 includes only the prismoid deformation section 53.

In the third example embodiment and the modification of the third example embodiment, the smaller the bottom area of the columns 6 at the four corners in FIGS. 23A to 23C and FIGS. 27A to 27C is, the more the contact area between the back surface of the chip 7 and the base 2 can be reduced, and therefore the resonance frequency of the chip mode can be increased. Therefore, in a case where the chip 7 mounted on the sample holder 1 is a rectangle and the length of the short side of the chip 7 is v, s needs to be 0.5 v or less, preferably 0.3 v or less, and more preferably 0.2 v or less. On the other hand, when the chip 7 mounted on the sample holder 1 is a square and the length of one side of the chip 7 is v, s needs to be 0.5 v or less, preferably 0.3 v or less, and more preferably 0.2 v or less.

In the third example embodiment and the modification of the third example embodiment, the cavity 5 has a structure in which the prismatic section and the prismoid deformation section are connected or a structure including only the prismoid deformation section, but the cavity 5 may have another shape. For example, the side surface of the prismoid deformation section may be a curved surface instead of a plane. That is, unless at least a part of the front surface of the base 2 forming the cavity 5 opposing the back surface of the chip 7 is parallel to the back surface of the chip 7 or the upper surface of the base 2, the effects described in the third example embodiment and the modification of the third example embodiment are obtained.

Other Example Embodiments

In the first to third example embodiments and the modifications of the first to third example embodiments, the PCB 3 in FIGS. 11A to 11D is used as the PCB 3. The PCB 3 of FIGS. 11A to 11D has two metal layers. Specifically, it has a total of two metal layers of a metal layer in which the front-surface GND 9 and the core wire 10 are formed and a metal layer in which the back-surface GND 11 is formed. However, in the first to third example embodiments and the modifications of the first to third example embodiments, the effects described in the first to third example embodiments and the modifications of the first to third example embodiments can be obtained even if the PCB 3 having three or more metal layers is used instead of the PCB 3 having two metal layers as in FIGS. 11A to 11D. As an example of the PCB 3 having three or more metal layers, a configuration example of the PCB 3 having three metal layers is shown in FIGS. 29A to 29F.

Figure 29A:
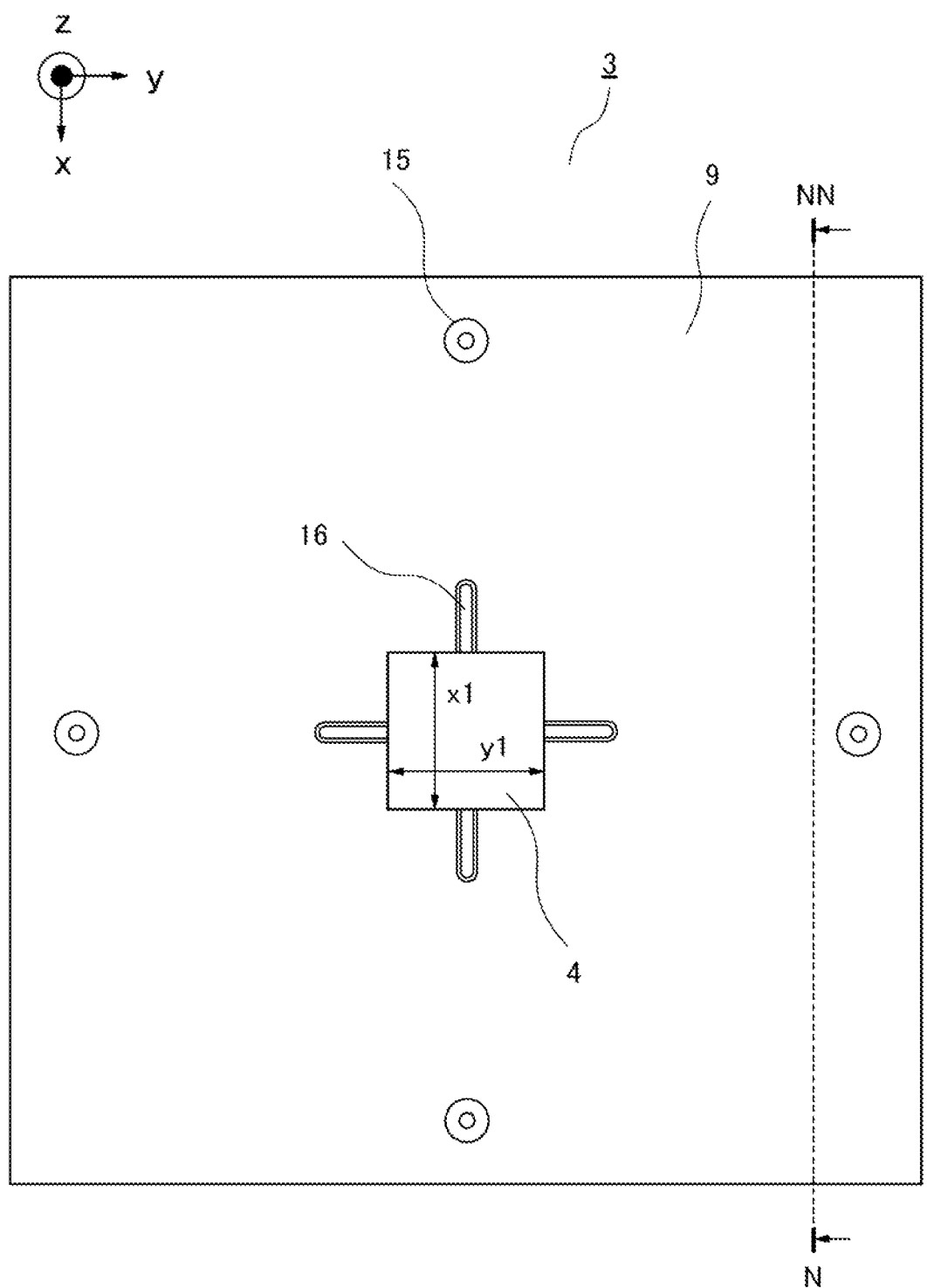
FIG. 29A is a top view showing a structure of a PCB according to another example embodiment.
Figure 29B:
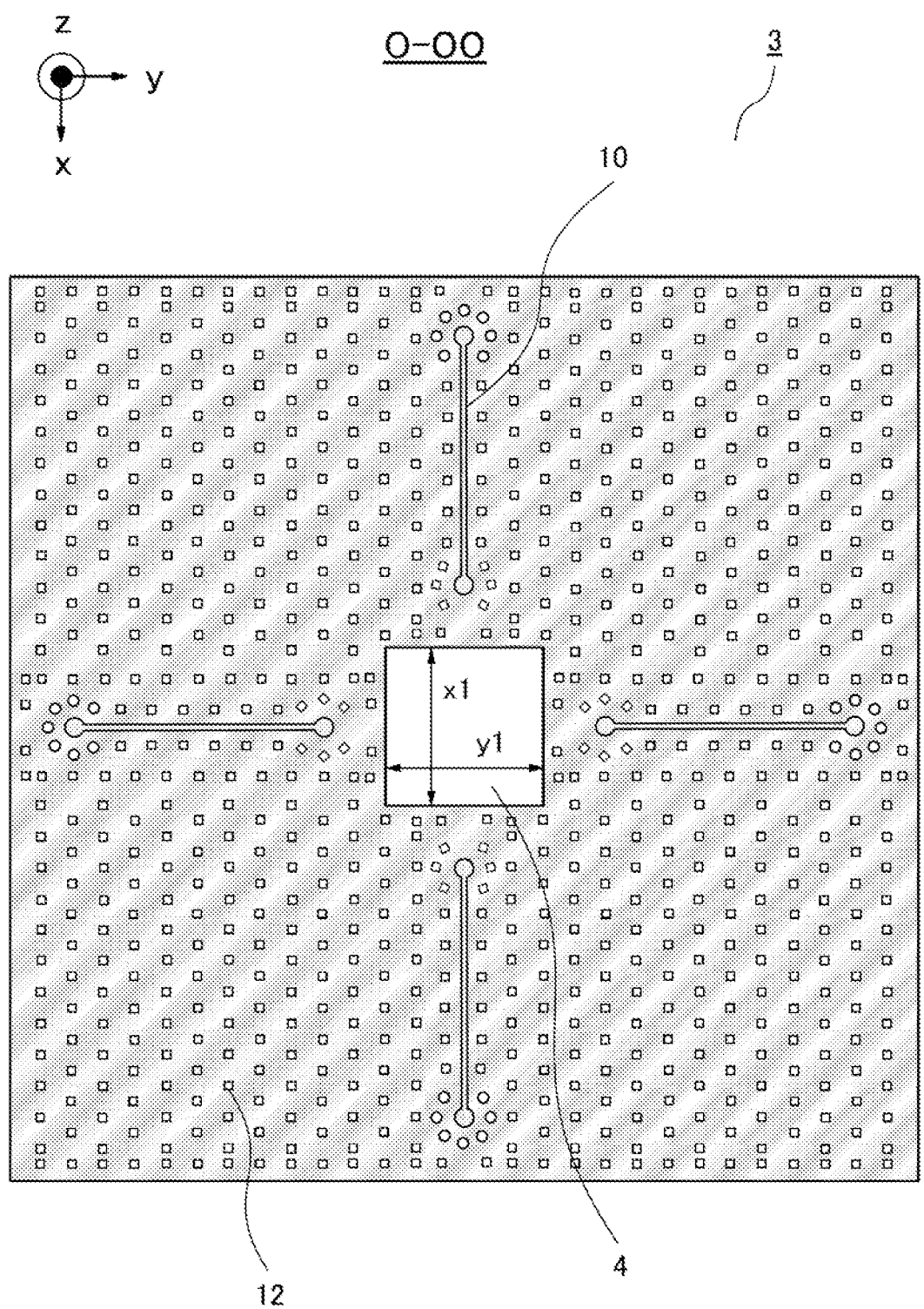
FIG. 29B is a cross-sectional view in which the PCB according to the another example embodiment is cut with a plane parallel to an xy plane so that a core wire formed in a region sandwiched between a front-surface GND and a back-surface GND is visible.
Figure 29D:
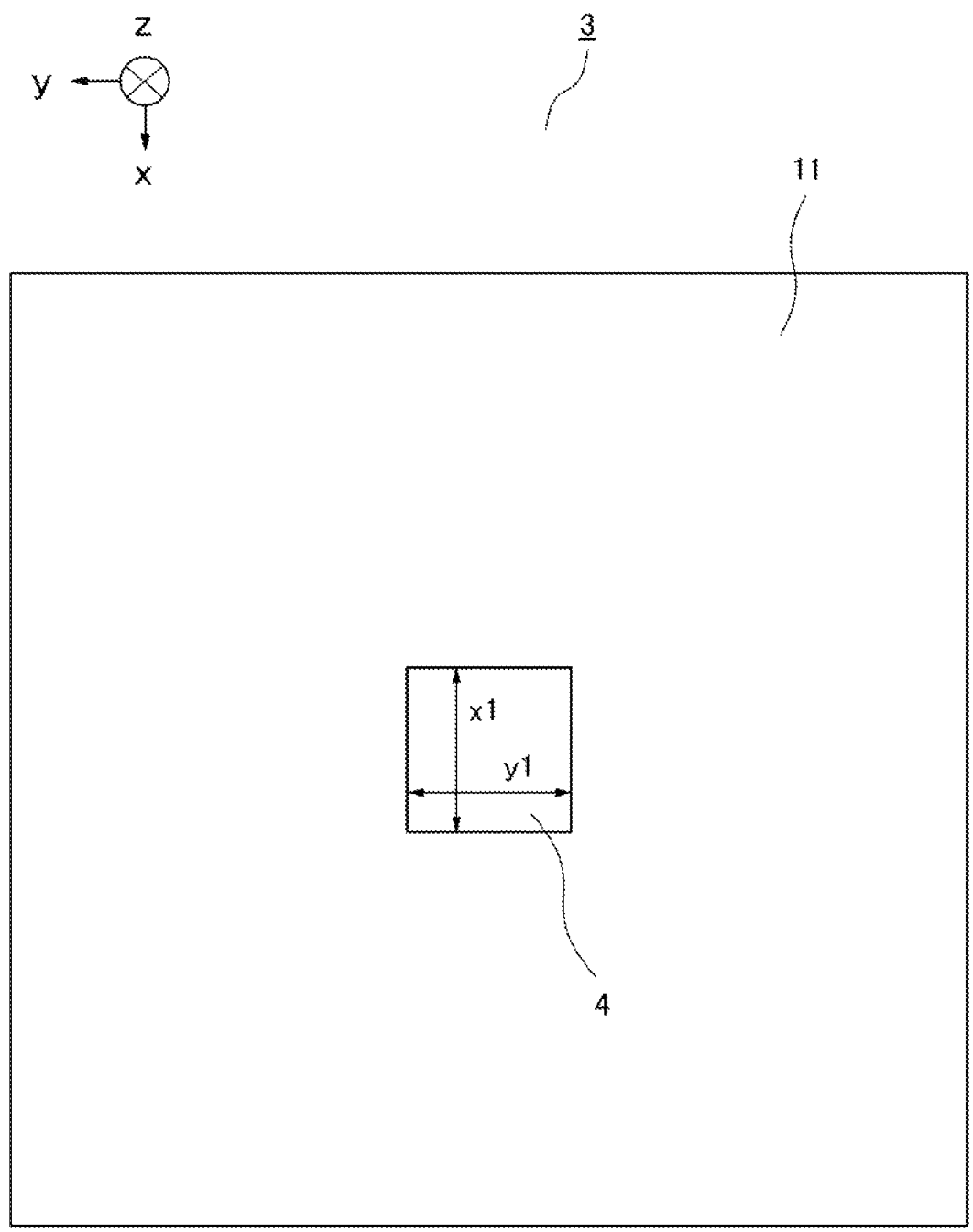
FIG. 29D is a bottom view showing a structure of the PCB according to the another example embodiment.
Figure 29E:
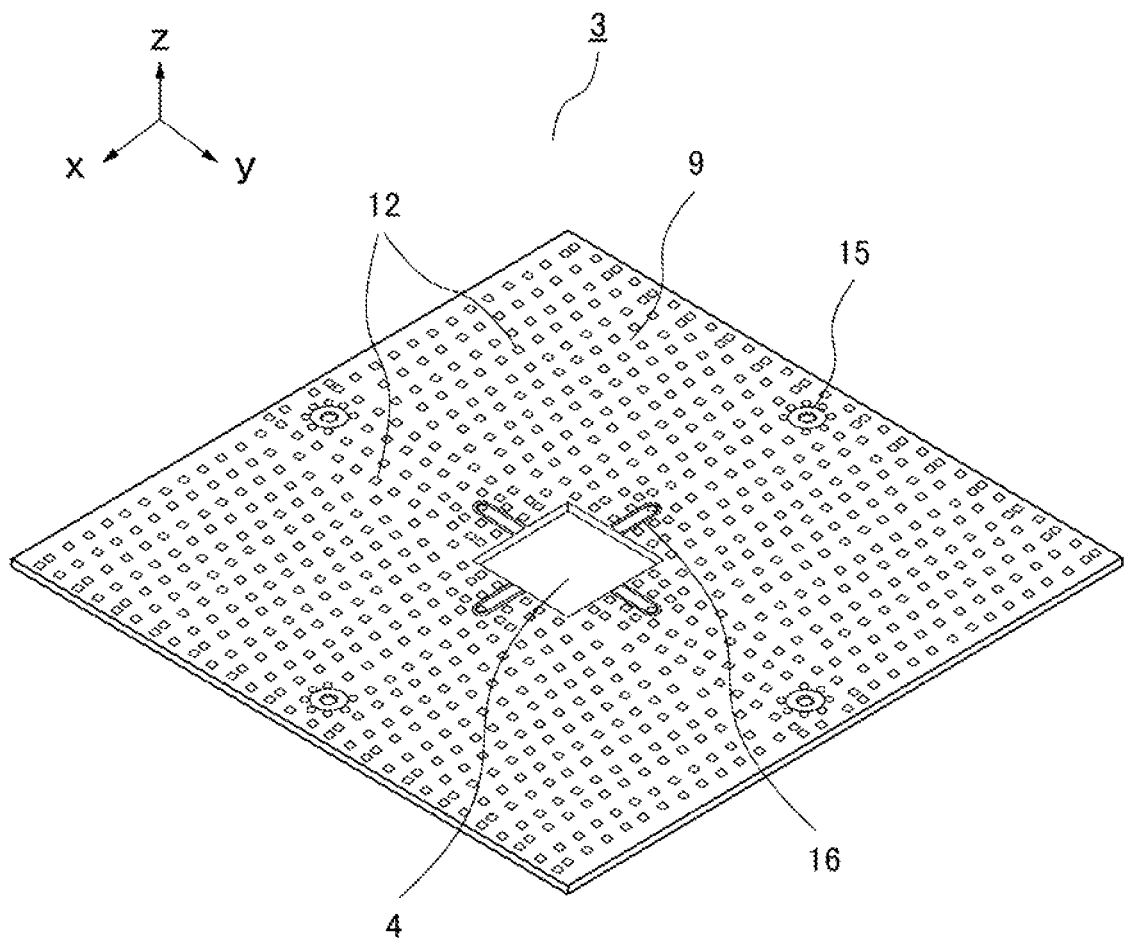
FIG. 29E is a perspective view of the PCB according to the another example embodiment.
Figure 29F:
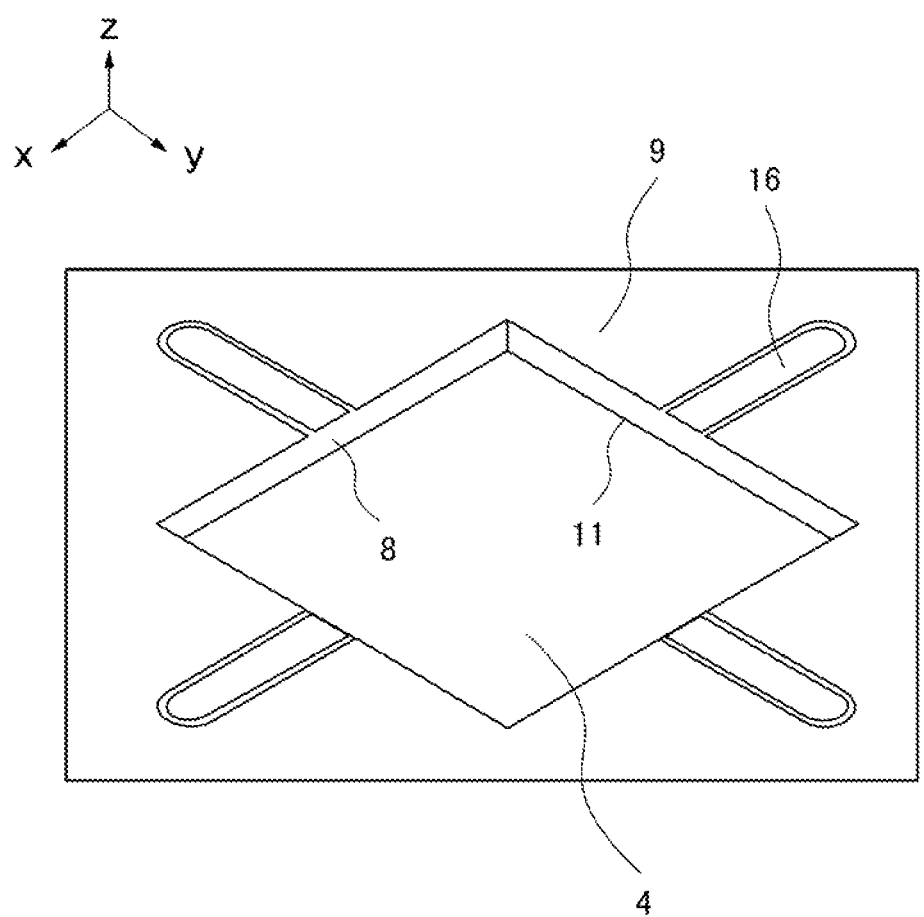
FIG. 29F is an enlarged view of the PCB according to a modification of the another example embodiment near the through hole.

FIG. 29A is a top view showing the structure of the PCB 3 according to another example embodiment. FIG. 29B is a cross-sectional view in which the PCB 3 according to the another example embodiment is cut with a plane parallel to an xy plane so that a core wire formed in a region sandwiched between the front-surface GND 9 and the back-surface GND 11 is visible. FIG. 29C is an enlarged view of a cross section, near the core wire 10, of the PCB 3 according to the another example embodiment that is cut with a plane parallel to the xz plane including the cutting line N-NN shown in FIG. 29A. The cross-sectional view shown in FIG. 29B is a view in which the PCB 3 is cut along a plane parallel to the xy plane including a cutting line O-OO shown in FIG. 29C. FIG. 29D is a bottom view showing the structure of the PCB 3 according to the another example embodiment. FIG. 29E is a perspective view of the PCB 3 according to the another example embodiment. FIG. 29F is an enlarged view of the PCB 3 according to a modification of the another example embodiment near the through hole 4.

As shown in FIG. 29C, the PCB 3 has a structure in which the front-surface GND 9 is formed on one surface of the plate-shaped dielectric 8 extending parallel to the xy plane, for example. The PCB 3 has a structure in which the back-surface GND 11 is formed on the other surface of the dielectric 8. The PCB 3 has a structure in which the core wire 10 is formed inside the dielectric 8, that is, in a region sandwiched between the front-surface GND 9 and the back-surface GND 11. A line having such a structure is generally called a stripline. As shown in FIG. 29A, the upper surface of the PCB 3 is provided with the front-surface GND 9, an input/output pad 15, and a bonding pad 16. The input/output pad 15 is a pad that connects the core wire 10 of the PCB 3 to an external measuring instrument or the like and is used for signal input/output. The bonding pad 16 is a pad for connecting the core wire 10 of the PCB 3 and the pad of the chip 7 with the bonding wire 13 or the like. The input/output pad 15 and the bonding pad 16 formed on the upper surface of the PCB 3 are electrically connected to the core wire 10 formed in the region sandwiched between the front-surface GND 9 and the back-surface GND 11. In the top view of FIG. 29A, the core wire 10 is invisible because it is hidden by the front-surface GND 9. FIG. 29B shows a cross-sectional view cut with a plane parallel to the xy plane near the core wire 10. In FIGS. 29A to 29F, four striplines are formed on the PCB 3. However, the number of striplines formed on the PCB 3 is not particularly limited, and may be any number. As shown in FIGS. 29B, 29C, and 29E, the PCB 3 is provided with a plurality of the through holes 12. These through holes 12 penetrate the dielectric 8 and electrically connect the front-surface GND 9 and the back-surface GND 11. The through hole 4 is provided near the center of the PCB 3.

In the first to third example embodiments and the modifications of the first to third example embodiments, the same effects as those of the first to third example embodiments and the modifications of the first to third example embodiments can be achieved even if the PCB 3 having three or more metal layers as shown in FIGS. 29A to 29F is used.

In the first to third example embodiments and the modifications of the first to third example embodiments, as a mounting method of the chip 7 of the superconducting quantum circuit, the configuration in which the chip 7 is directly placed on the metal base 2 has been described, but the mounting method is not limited to this. For example, also in a case of a mounting form in which a resin material such as varnish is applied onto the metal base 2 and then the chip 7 is placed on the resin material such as varnish, it is possible to achieve the effect of the example embodiments, that is, the effect that the resonance frequency of the chip mode can be increased.

In the first to third example embodiments and the modifications of the first to fifth example embodiments, the configuration in which the PCB 3 is directly placed on the metal base 2 has been described as the configuration of the sample holder 1. The effect of the example embodiments can also be achieved by the sample holder 1 having a configuration in which a sheet of metal such as indium (In) is placed on the metal base 2 and the PCB 3 is placed on the sheet of metal such as In. By sandwiching a sheet of soft metal such as In between the base 2 and the PCB 3, it is possible to make a gap less likely to occur between the back-surface GND 11 of the PCB 3 and the base 2. This sometimes improves high-frequency characteristics of the sample holder 1. Specifically, if there is a gap between the PCB 3 and the base 2, the gap can form a new cavity resonator and cause resonance when a signal of a specific frequency is input to the chip 7. Therefore, it is preferable that no gap is generated between the back-surface GND 11 of the PCB 3 and the base 2.

In the first to third example embodiments and the modifications of the first to third example embodiments, the configuration in which the PCB 3 is placed on the metal base 2 has been described as the configuration of the sample holder 1. A metal lid may be placed on the PCB 3. The effect of the example embodiments can also be achieved even if the lid is placed. In such the sample holder 1, the metal lid is in electrical contact with the front-surface GND 9 of the PCB 3. However, the lid does not come into contact with the core wire 10 of the PCB 3 and the chip 7. This is to prevent the core wire 10 of the PCB 3 and the circuit and wiring of the chip 7 from coming into contact with the GND. For the same reason as described above, it is preferable that no gap is generated between the lid and the front-surface GND 9 of the PCB 3, and therefore a sheet such as In may be sandwiched between the lid and the front-surface GND 9 of the PCB 3.

In the first to third example embodiments and the modifications of the first to third example embodiments, the case where the base 2 is a rectangular parallelepiped or a cube has been described as the shape of the sample holder 1, but the effect of the present disclosure can also be achieved if the base 2 has another shape such as a cylinder. Similarly, the effect of the example embodiments can also be achieved even if the shape of the PCB 3 is also a rectangular shape and a square shape but other shapes such as a circular shape.

Fourth Example Embodiment

In the fourth example embodiment, the basic configuration of the content described in the first to third example embodiments will be described. Here, the fourth example embodiment will be described with reference to FIG. 10A used in the first example embodiment.

As shown in FIG. 10A, the sample holder 1 includes the base 2 and the PCB 3 in contact with the base 2. The PCB 3 has the through hole 4. In the PCB 3, the base 2 has the cavity 5 in at least a part below the through hole 4. The shape of the cavity 5 is not particularly limited. For example, the bottom surface of the cavity 5 may be a flat surface or may be a surface other than a flat surface. The side surface of the cavity 5 may be a flat surface or may be a surface other than a flat surface.

The cavity 5 has a support structure that supports the surface of the chip 7 and is conducted to the base 2. At least a part of the section supporting the chip 7 in the support structure is not parallel to the surface of the chip. The surface of the chip here is the back surface of the chip opposite to the circuit surface of the chip. The support structure is not particularly limited. In FIG. 10A, the support structure is the conductor columns 6 arranged at the four corners of the cavity 5. At least a part of the upper surface of the column 6 is not parallel to the upper surface of the base 2. When the support structure is the column 6, the shape is not limited to the shape in FIG. 10A. As in FIGS. 13A and 13C used in the description of another example of the first example embodiment, since the upper section 61 of the column 6 has a triangular pyramid shape, the upper section 61 need not be parallel to the back surface of the chip 7. For example, as in FIG. 15A used in the description of the modification of the first example embodiment, at least a part of the upper surface of the column 6 need not be parallel to the back surface of the chip 7, and at least a part of the upper surface of the column 6 may be parallel to the back surface of the chip 7.

The support structure may be achieved by the shape of the cavity 5. Specifically, as described in the second example embodiment and the third example embodiment, the shape of the cavity 5 may be a shape partially including a frustum. Due to this, when the chip 7 is mounted on the sample holder 1, at least a part of the front surface opposing the back surface of the chip 7 of the surface of the base 2 forming the cavity 5 is not parallel to the back surface of the chip 7.

In the fourth example embodiment, the sample holder 1 has the cavity 5 in the base 2, has the support structure that supports the back surface of the chip in the cavity 5, and at least a part of the section that supports the chip 7 in the support structure is not parallel to the surface of the chip. This makes it possible to further increase the resonance frequency of the chip mode.

It has been required to cause the resonance frequency of resonance that occurs by supplying a signal of a specific frequency to a chip in a case where the chip is mounted on the sample holder, higher than a technique described in B. Lienhard, et al., "Microwave Packaging for Superconducting Qubits," arXiv: 1906.05425v1 [quant-ph] 12 Jun. 2019.

As above, in a case where a chip is mounted on the sample holder 1 according to the example embodiments, the resonance frequency of resonance that occurs when a signal of a specific frequency is input to the chip is further increased.

The description of the sample holder 1 according to the example embodiments is finished. The superconducting quantum computer according to the example embodiments includes the sample holder 1 according to the example embodiments and the chip on which the superconducting quantum circuit is formed is disposed in the sample holder 1.

The previous description of embodiments is provided to enable a person skilled in the art to make and use the present disclosure. Moreover, various modifications to these example embodiments will be readily apparent to those skilled in the art, and the generic principles and specific examples defined herein may be applied to other embodiments without the use of inventive faculty. Therefore, the present disclosure is not intended to be limited to the example embodiments described herein but is to be accorded the widest scope as defined by the limitations of the claims and equivalents.

Further, it is noted that the inventor's intent is to retain all equivalents of the claimed disclosure even if the claims are amended during prosecution.

Supplementary Note

Some or all of the above example embodiments can also be described as the following supplementary notes. However, some or all of the above example embodiments are not limited to the following.

(Supplementary Note 1)

A sample holder including:

a base including a support structure; and

PCB in contact with the base; the PCB including a through hole; wherein at least a part of the base below the through hole has a cavity, a support structure that supports a surface of a chip and is electrically connected to the base, the support structure is disposed in the cavity, and at least a part of a section of the support structure that supports the chip is not parallel to the surface of the chip.

(Supplementary Note 2)

The sample holder according to Supplementary Note 1, in which the support structure is a conductor column.

(Supplementary Note 3)

The sample holder according to Supplementary Note 2, in which the column has a shape in which a frustum and a prism are combined, a bottom surface of the frustum having a smaller area is a side of the through hole, and a bottom surface of the frustum having a larger area and an upper bottom surface of the prism have a same shape and are connected.

(Supplementary Note 4)

The sample holder according to Supplementary Note 2 or 3, in which the support structure is a plurality of columns provided in the cavity.

(Supplementary Note 5)

The sample holder according to Supplementary Note 4, in which the plurality of columns are provided at four corners of the cavity.

(Supplementary Note 6)

The sample holder according to Supplementary Note 1, in which the cavity has a frustum shape, and a bottom surface of the frustum having a larger area is the through hole side.

(Supplementary Note 7)

The sample holder according to Supplementary Note 6, in which the cavity has a shape in which the frustum and a column are combined, and a bottom surface of the frustum having a smaller area and an upper bottom surface of the column have a same shape and are connected.

(Supplementary Note 8)

The sample holder according to Note 7, wherein the prism is a quadrangular prism, and the frustum is a quadrangular prismoid.

(Supplementary Note 9)

The sample holder according to any of Supplementary Notes 6 to 8, in which the cavity is further provided with a conductor prism, and an upper bottom surface of the conductor prism is parallel to an upper surface of the base.

(Supplementary Note 10)

The sample holder according to Supplementary Note 8, in which the prism is provided at four corners of the cavity.

(Supplementary Note 11)

The sample holder according to Supplementary Note 1, in which the cavity has a pyramid shape, and a bottom surface of the pyramid is on the through hole side.

(Supplementary Note 12)

The sample holder according to any of Supplementary Notes 1 to 11, in which the support structure is made of metal or a mixture containing metal.

(Supplementary Note 13)

The sample holder according to Supplementary Notes 1 to 12, in which the base is made of metal.

(Supplementary Note 14)

The sample holder according to any of Supplementary Notes 1 to 13, in which the chip is disposed in the through hole.

(Supplementary Note 15)

The sample holder according to any of Supplementary Notes 1 to 14, in which the PCB includes a dielectric, a front-surface ground formed on a front surface of the dielectric, and a back-surface ground formed on a back surface of the dielectric.

(Supplementary Note 16)

The sample holder according to any of Supplementary Notes 1 to 15, in which the PCB has a core wire of a coplanar waveguide on the front surface of the dielectric.

(Supplementary Note 17)

The sample holder according to any of Supplementary Notes 1 to 15, in which the PCB further includes a core wire in the dielectric in a region sandwiched between the front-surface ground and the back-surface ground.

(Supplementary Note 18)

A superconducting quantum computer including:

a sample holder; and a chip on which a superconducting quantum circuit is formed, the chip being disposed in the sample holder, wherein the sample holder including:

a base including a support structure; and a PCB in contact with the base, the PCB including a through hole; wherein at least a part of the base below the through hole has a cavity, the support structure that supports a surface of a chip and is electrically connected to the base, the support structure is disposed in the cavity and at least a part of a section of the support structure that supports the chip is not parallel to the surface of the chip.

The invention claimed is:

1. A sample holder comprising:

a base comprising a support structure; and a printed circuit board (PCB) in contact with the base, the PCB comprising a through hole; wherein at least a part of the base below the through hole has a cavity, the support structure supports a surface of a chip and is electrically connected to the base, the support structure is disposed in the cavity, and at least a part of a section of the support structure that supports the chip is not parallel to the surface of the chip, wherein a superconducting quantum circuit is formed on the chip.

2. The sample holder according to claim 1, wherein the support structure is a conductor column.

3. The sample holder according to claim 2, wherein
the column has a shape in which a frustum and a prism are combined,
a bottom surface of the frustum having a smaller area is a side of the through hole, and
a bottom surface of the frustum having a larger area and an upper bottom surface of the prism have a same shape and are connected.

4. The sample holder according to claim 3,
wherein
the prism is a quadrangular prism, and
the frustum is a quadrangular prismoid.

5. The sample holder according to claim 4, wherein the prism is provided at four corners of the cavity.

6. The sample holder according to claim 2, wherein
the support structure is a plurality of columns provided in the cavity.

7. The sample holder according to claim 6, wherein
the plurality of columns are provided at four corners of the cavity.

8. The sample holder according to claim 1, wherein
the cavity has a frustum shape, and
a bottom surface of the frustum having a larger area is the through hole side.

9. The sample holder according to claim 8, wherein
the cavity has a shape in which the frustum and a column are combined, and
a bottom surface of the frustum having a smaller area and an upper bottom surface of the column have a same shape and are connected.

10. The sample holder according to claim 8, wherein
the cavity is further provided with a conductor prism, and
an upper bottom surface of the conductor prism is parallel to an upper surface of the base.

11. The sample holder according to claim 1, wherein
the cavity has a pyramid shape, and a bottom surface of the pyramid is on the through hole side.

12. The sample holder according to claim 1, wherein the support structure is made of metal or a mixture containing metal.

13. The sample holder according to claim 1, wherein the base is made of metal.

14. The sample holder according to claim 1, wherein the chip is disposed in the through hole.

15. The sample holder according to claim 1, wherein the PCB includes a dielectric, a front-surface ground formed on a front surface of the dielectric, and a back-surface ground formed on a back surface of the dielectric.

16. The sample holder according to claim 1, wherein the PCB has a core wire of a coplanar waveguide on the front surface of the dielectric.

17. The sample holder according to claim 1, wherein the PCB further includes a core wire in the dielectric in a region sandwiched between the front-surface ground and the back-surface ground.

18. A superconducting quantum computer comprising:
a sample holder; and
a chip on which a superconducting quantum circuit is formed, the chip that is disposed in the sample holder, wherein the sample holder comprising:
a base comprising a support structure; and
a PCB in contact with the base, the PCB comprising a through hole;
wherein
at least a part of the base below the through hole has a cavity,
the support structure that supports a surface of the chip and is electrically connected to the base,
the support structure is disposed in the cavity and
at least a part of a section of the support structure that supports the chip is not parallel to the surface of the chip.

* * * * *